United States Patent
Miyata et al.

(10) Patent No.: US 6,975,148 B2
(45) Date of Patent: Dec. 13, 2005

(54) SPREAD SPECTRUM CLOCK GENERATION CIRCUIT, JITTER GENERATION CIRCUIT AND SEMICONDUCTOR DEVICE

(75) Inventors: Shinji Miyata, Kasugai (JP); Kouji Okada, Kasugai (JP); Masao Iijima, Kasugai (JP); Teruhiko Saitou, Kasugai (JP); Yukisato Miyazaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/743,188

(22) Filed: Dec. 23, 2003

(65) Prior Publication Data

US 2004/0136440 A1 Jul. 15, 2004

(30) Foreign Application Priority Data

| Dec. 24, 2002 | (JP) | 2002-371984 |
| Dec. 25, 2002 | (JP) | 2002-374801 |
| Dec. 26, 2002 | (JP) | 2002-377337 |
| Mar. 7, 2003 | (JP) | 2003-061126 |
| Apr. 23, 2003 | (JP) | 2003-118939 |

(51) Int. Cl.[7] .............................................. H03L 7/06
(52) U.S. Cl. ................................... 327/156; 375/130
(58) Field of Search .......................... 327/156, 157; 375/130, 376

(56) References Cited

U.S. PATENT DOCUMENTS

| 5,426,392 A | 6/1995 | Kornfeld ..................... 327/551 |
| 5,442,664 A | 8/1995 | Rust et al. .................... 375/371 |
| 5,488,627 A | 1/1996 | Hardin et al. ................ 375/139 |
| 5,631,920 A | 5/1997 | Hardin ......................... 375/130 |
| 5,699,005 A | 12/1997 | Menkhoff et al. ............ 327/292 |
| 5,812,590 A | 9/1998 | Black et al. .................. 375/130 |
| 6,046,646 A | 4/2000 | Lo et al. ........................ 331/10 |
| 6,160,861 A | 12/2000 | McCollough ................ 375/376 |
| 6,175,321 B1 | 1/2001 | Frannhagen et al. ......... 341/143 |
| 6,294,936 B1 | 9/2001 | Clementi ...................... 327/156 |
| 6,650,193 B2 * | 11/2003 | Endo et al. ..................... 331/78 |
| 6,731,667 B1 * | 5/2004 | Lee et al. ..................... 375/130 |
| 6,744,277 B1 * | 6/2004 | Chang et al. .................. 326/37 |
| 6,763,055 B1 * | 7/2004 | Fry .............................. 375/132 |
| 2002/0171457 A1 | 11/2002 | Fujiwara ...................... 327/113 |

FOREIGN PATENT DOCUMENTS

| EP | 1 248 376 A2 | 10/2002 |
| GB | 1 506 530 | 4/1978 |
| JP | 7-202652 | 4/1995 |
| JP | 8-292820 | 5/1996 |
| JP | 9-98152 | 8/1997 |
| JP | 11-110067 | 4/1999 |
| JP | 2000/101424 A | 4/2000 |

* cited by examiner

*Primary Examiner*—Quan Tra
(74) *Attorney, Agent, or Firm*—Arent Fox PLLC

(57) ABSTRACT

A spread spectrum clock generation circuit capable of further reducing the electromagnetic wave radiation with a simple configuration has been disclosed and, particularly in a spread spectrum clock generation circuit using a current control oscillator (ICO), a differential signal to which a spread spectrum modulation signal, the period or amplitude of which changes, is added is generated, and the differential signal is applied to the ICO and a clock is generated.

22 Claims, 62 Drawing Sheets

SPECTRUM WHEN A
SMALL AMPLITUDE
IS APPLIED

+

SPECTRUM WHEN A
LARGE AMPLITUDE
IS APPLIED

=

SYNTHESIZED
SPECTRUM $Iref = Vi/R1$

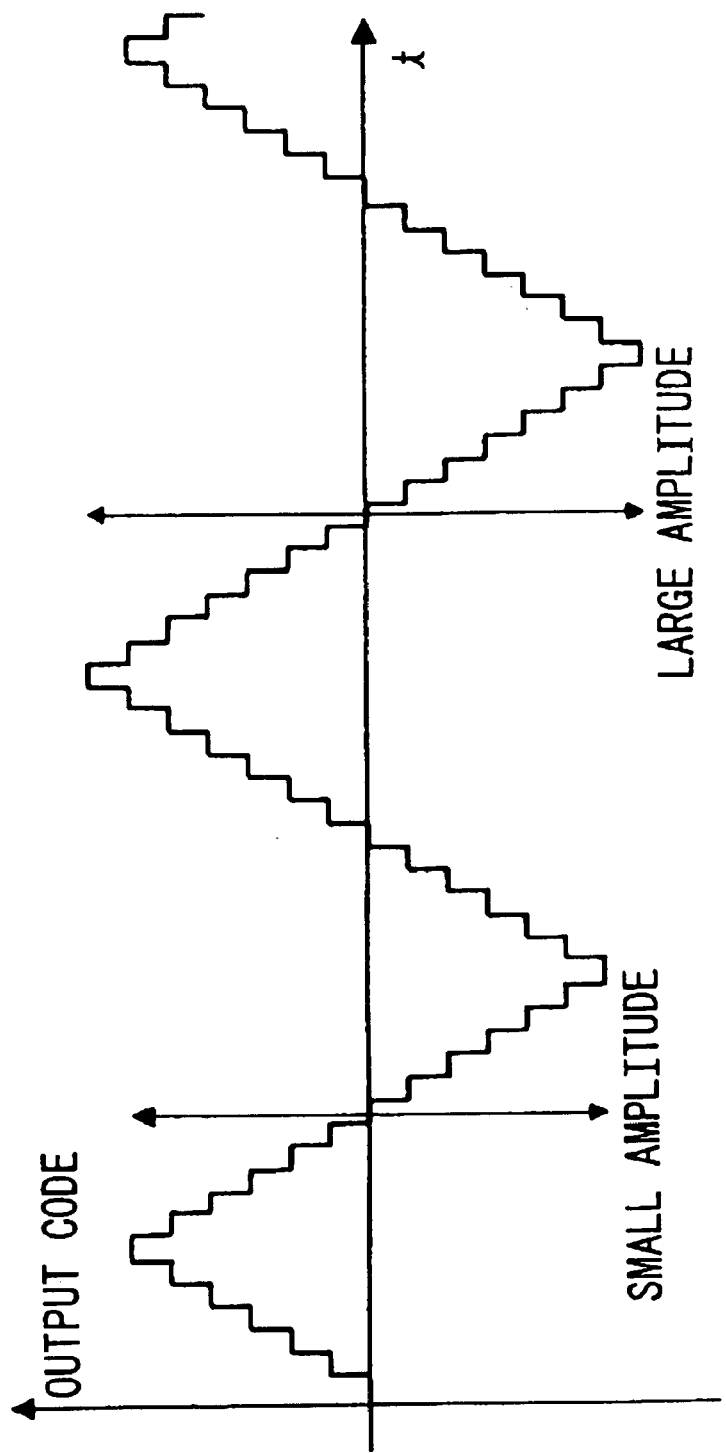

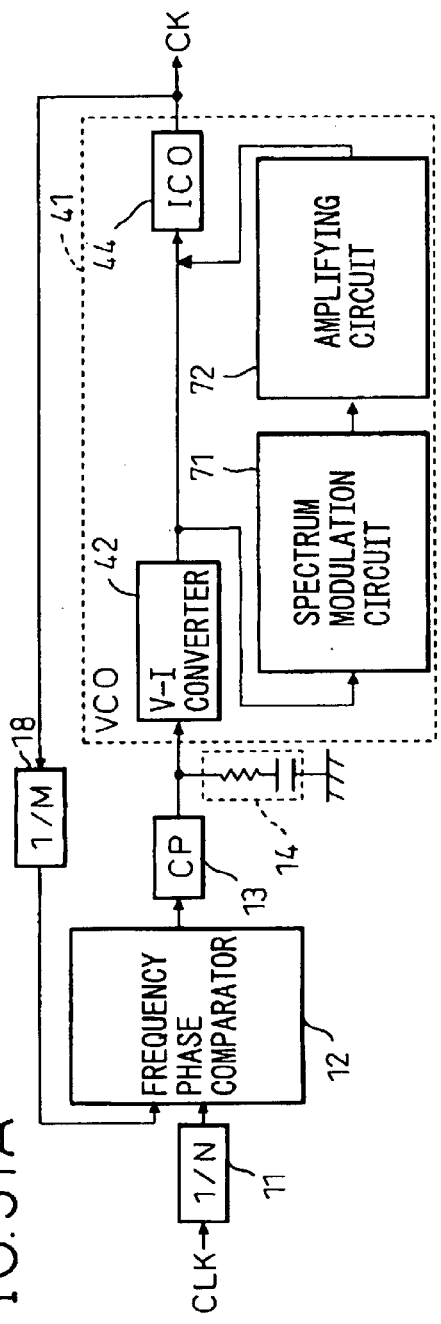
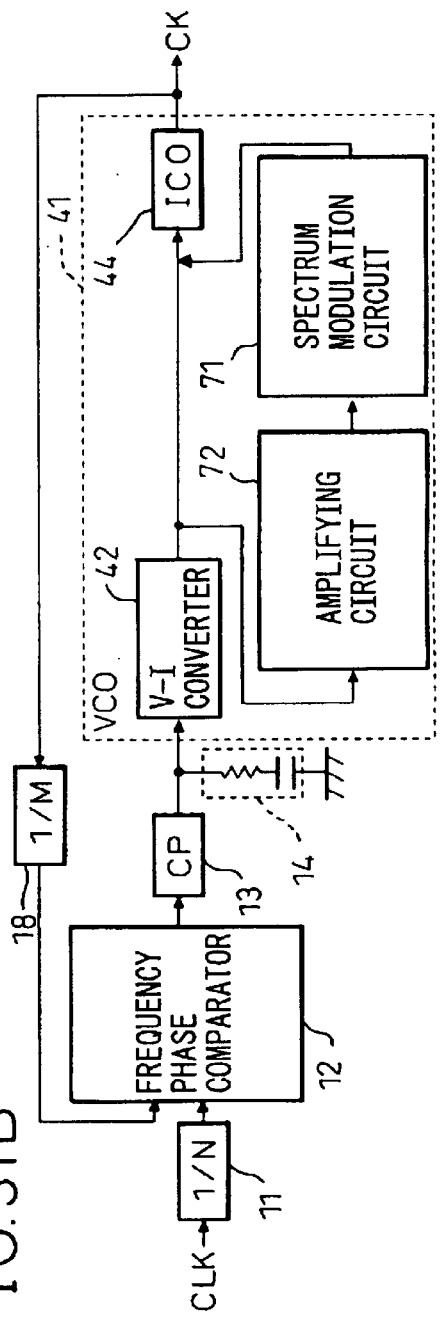
FIG.31A
FIG.31B

AMPLITUDE A

AMPLITUDE A k/m

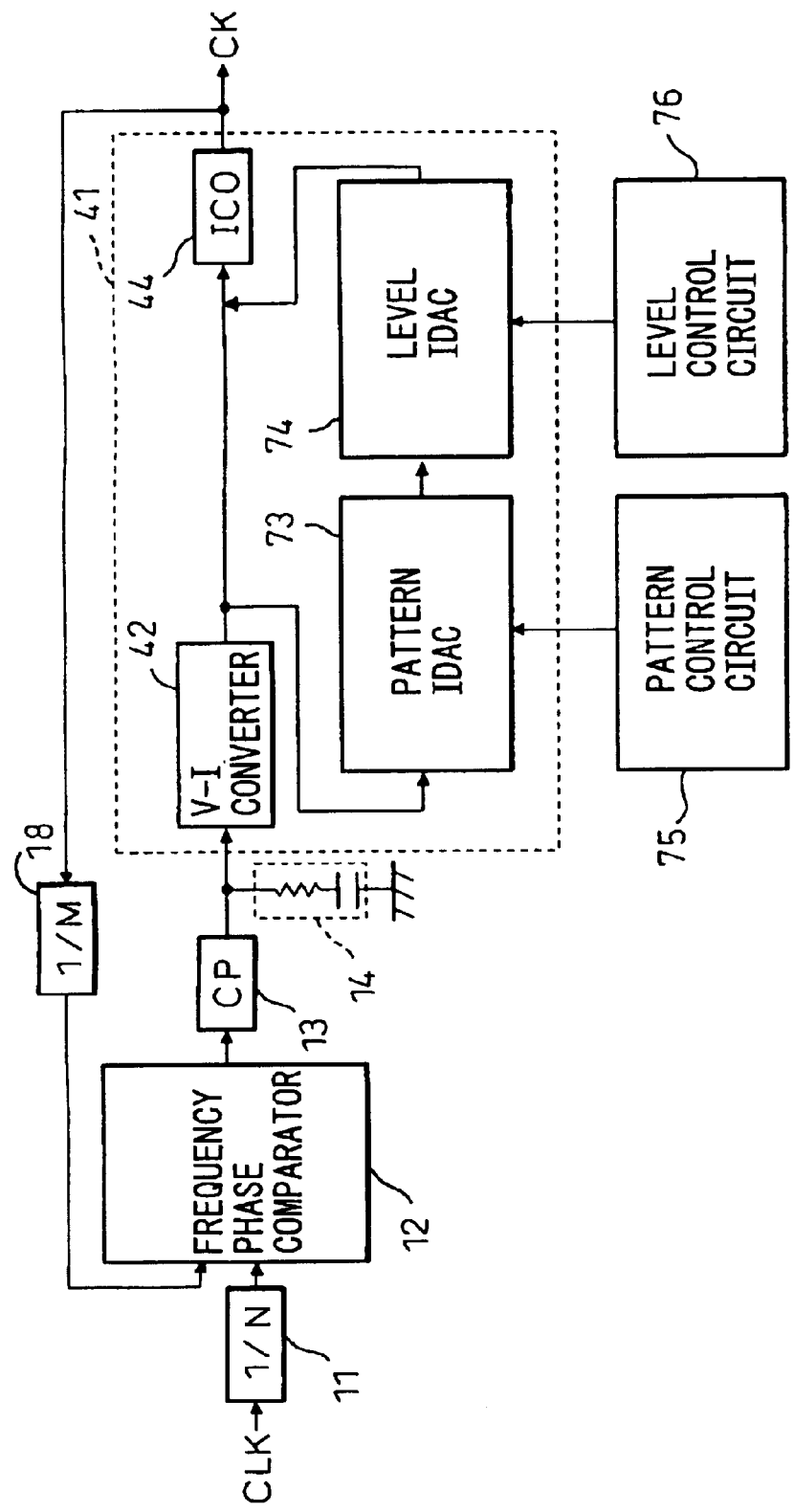

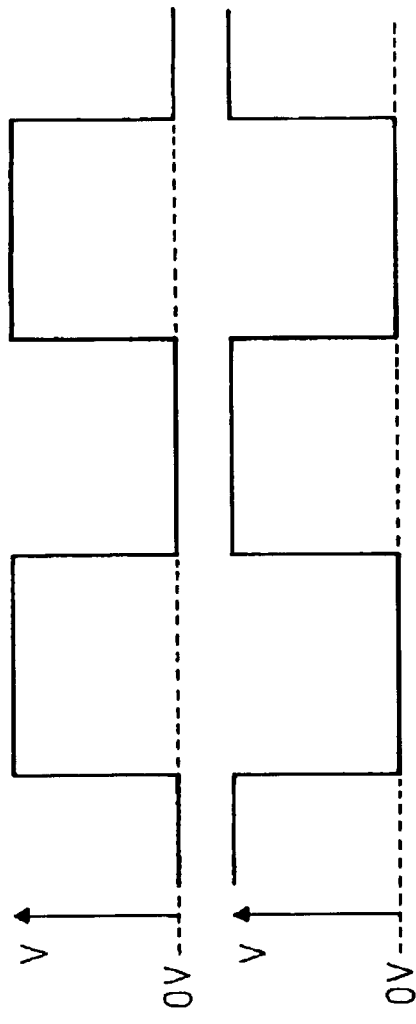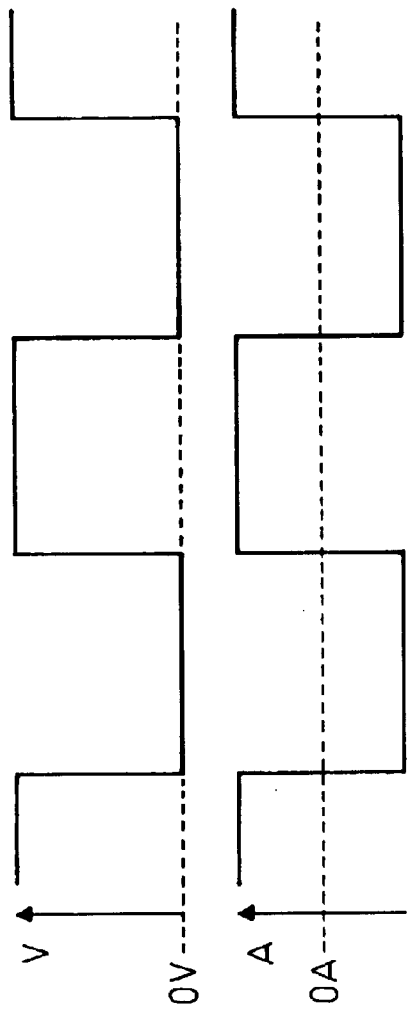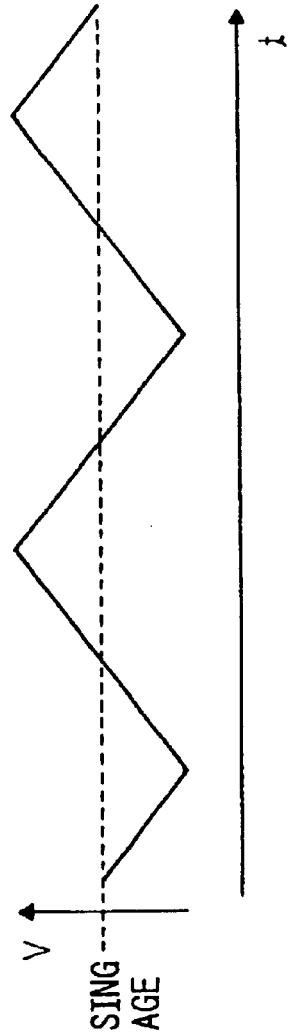
FIG.43A CHARGE SIGNAL
FIG.43B DISCHARGE SIGNAL
FIG.43C CURRENT OF THE CURRENT SOURCE
FIG.43D VOLTAGE OF A NODE BETWEEN A RESISTOR AND A CAPACITOR OF A LOOP-FILTER (VCO CONTROL VOLTAGE) PLL FOCUSING VOLTAGE

SPREAD SPECTRUM CLOCK GENERATION CIRCUIT, JITTER GENERATION CIRCUIT AND SEMICONDUCTOR DEVICE

BACKGROUND OF THE INVENTION

The present invention relates to a spread spectrum clock generation circuit which generates a clock signal the period of which changes slightly in order to reduce electromagnetic wave radiation, a jitter generation circuit which adds a jitter to a clock signal or the like, and a semiconductor device using the circuits.

Recently, as semiconductor devices have increased in speed and degree of integration, a problem of EMI (electromagnetic interference) due to electromagnetic wave radiation from a device has attracted more attention. As the operation frequency has increased, the wavelength has become shorter and shorter, and the wiring length of a connecting circuit, or inside the substrate, has become almost as short as the wavelength of a high frequency signal, therefore, the connecting sections of wires or the like may serve as antennas and electromagnetic wave radiation is increased. The electromagnetic wave radiation of electronic devices using semiconductor devices which operate at a high clock frequency causes adverse effects such as malfunctions due to mutual interference between electronic device and interference with communication devices.

In order to solve these problems, measures are currently taken against electronic devices, which cause the problem of the electromagnetic wave radiation, in which the electromagnetic wave radiation is reduced by improving the arrangement or the like of circuits, the leakage of electromagnetic waves is reduced by shielding the electromagnetic waves, and so on. However, as portable equipment or the like is required to be more compact and lighter, a problem occurs in that it is difficult to sufficiently carry out the shielding in order to reduce the electromagnetic wave radiation.

Therefore, often, the operating clock frequency of a semiconductor device is changed slightly and/or the peak of noise is scattered by the addition of a jitter to a clock signal.

In Japanese Unexamined Patent Publication (Kokai) No. 2000-101424, a spread spectrum clock generation (SSCG) circuit has been proposed, which carries out spread spectrum processing for slightly changing the operating clock frequency of a semiconductor device.

FIG. 1 is a diagram showing a configuration example of a conventional SSCG circuit. This example shows a circuit which generates a clock CK from a reference clock CLK, the frequency of the clock CK being M/N times that of the reference clock CLK, by utilizing a PLL (Phase Locked Loop) circuit. This circuit consists of a 1/N divider 11, a frequency phase comparator 12, a charge pump (CP) 13, a loop-filter 14, a voltage control oscillator (VCO) 17, a 1/M divider 18, a modulator 15, and a voltage addition circuit 16. The frequency phase comparator 12 detects a phase difference between the CLK divided by a factor of N and the CK divided by a factor of M and outputs a signal to control the CP 13 in accordance with the phase difference. The CP 13 outputs a signal to charge and discharge the loop-filter 14 in accordance with the phase difference and a differential voltage in accordance with the phase difference is generated at one end of the loop-filter 14. In a conventional clock generation circuit which does not carry out the spread spectrum modulation, the differential voltage is applied to the VCO 17 and a clock with a constant period is generated accordingly. In the SSCG circuit, however, the modulator 15 outputs a spectrum modulation signal which has a small amplitude and changes in a predetermined spread spectrum modulation period as shown in FIG. 2, and the spectrum modulation signal is added to the differential voltage in the voltage addition circuit 16 and applied to the VCO 17. An amplitude of the spectrum modulation signal is sufficiently smaller than that of the differential signal and the spread spectrum modulation period is sufficiently longer than a period of the generated clock CK. As a result, the period of the generated clock CK changes in the a predetermined cycle, with the period M/N times the period of the reference clock CLK being the center. The coefficient of change of period and the cycle are determined by the spectrum modulation signal generated by the modulator. The response time of the PLL circuit is set to a time sufficiently longer than the period of the spectrum modulation signal.

U.S. Pat. No. 5,488,627 and Japanese Unexamined Patent Publication (Kokai) No. 9-98152 have suggested the use of a waveform as shown in FIG. 3 as a spectrum modulation signal. The use of this waveform makes the peak lower and reduces the electromagnetic wave radiation.

Japanese Unexamined Patent Publication (Kokai) No. 8-292820 has disclosed a configuration in which the period of a spectrum modulation signal is changed randomly. The electromagnetic wave radiation is reduced by randomly changing the period.

Japanese Unexamined Patent Publication (Kokai) No. 7-202652 has disclosed a clock pulse generator which adds a jitter to a clock signal. The clock pulse generator disclosed in Japanese Unexamined Patent Publication (Kokai) No. 7-202652 comprises a plurality of delay circuits connected in series and a multiplexer connected via a tap to the output of each delay circuit. The clock signal to be input from each delay circuit via the tap to the multiplexer becomes a signal delayed in phase with respect to the reference phase respectively, and any one of signals delayed in phase is output selectively by controlling the multiplexer.

Moreover, Japanese Unexamined Patent Publication (Kokai) No. 11-110067 has disclosed a semiconductor device in which the period of a clock signal is constant and the peak value of the EMI intensity is reduced by scattering the EMI intensity to each frequency component by changing the duty ratio.

SUMMARY OF THE INVENTION

Generally, the spectrum modulation signal uses a triangular wave as shown in FIG. 2. In other words, the generated clock CK changes its frequency as shown in FIG. 2. When a triangular wave is used, however, as peaks occur at both ends of the width of the spectrum generated by the spread, a problem occurs that the electromagnetic wave radiation at this part is increased.

However, it is not easy to generate such a waveform as shown in FIG. 3, and the scale of a circuit which generates such a waveform becomes larger, resulting in a problem of higher cost.

Moreover, if the period of a spectrum modulation signal is changed randomly, there may be a case where the period of a generated clock changes considerably in a short time. This is undesirable from the standpoint of the operation of an SSCG circuit. When a generated clock is used in a logic circuit or the like, there is no operational problem if the rate of change with respect to time is small even though the range of change is large, but if the period suddenly changes considerably, a problem occurs that a normal operation is not secured.

In this clock pulse generator, a fixed delay time is set in accordance with the delay circuit. A general semiconductor device is designed in such a way that it can operate at different clock frequencies within a predetermined range. Therefore, when this clock pulse generator is used, a problem occurs that it is not possible to add a proper jitter in accordance with the frequency, if the clock frequency is changed. In addition to the delay circuit, a multiplexer and a circuit to control the multiplexer are required for the clock pulse generator, therefore a problem occurs that the circuit configuration becomes more complex.

The configuration in which the duty ratio is changed brings about a problem that the range in which the spectrum of the EMI can be scattered is narrow and that a sufficient effect of noise reduction cannot be obtained.

The first object of the present invention is to realize a spread spectrum clock generation circuit capable of further reducing the electromagnetic wave radiation with a simple configuration.

The second object of the present invention is to realize a jitter generation circuit and a semiconductor device capable of adding a proper jitter and efficiently reducing the radiation noise.

In order to realize the above-mentioned first object, a spread spectrum clock generation circuit according to a first aspect of the present invention is characterized in that a spread spectrum modulation circuit modulates a differential signal and generates a spread spectrum modulation signal the period of which changes so as to be multiple different periods. It is desirable for the spread spectrum modulation signal to change in period for each period in order.

FIG. 4 is a configuration diagram based on the principle of the spread spectrum clock generation circuit according to the first aspect of the present invention. As shown in FIG. 4, the spread spectrum clock generation circuit of the present invention comprises the frequency phase comparator 12 which detects the phase difference between the reference clock CLK and the generated clock CK, the charge pump 13 which generates a charge/discharge signal in accordance with the detected phase difference, the loop-filter 14 which generates a differential signal, a spread spectrum modulation circuit 19 which modulates the differential signal and generates a spread spectrum modulation signal, and a clock generator 20 which generates a generated clock having a frequency in accordance with the spread spectrum modulation signal, and is characterized in that the spread spectrum modulation circuit 19 generates a spread spectrum modulation signal the period of which changes so as to take multiple different periods.

FIG. 5A and FIG. 5B are diagrams illustrating the principle of the first aspect of the present invention. In a conventional SSCG circuit, a triangular wave shaped spread spectrum modulation signal which changes in a constant period as shown in FIG. 2 was added to a differential signal. Therefore, for example, if an oscillation frequency of 10 MHz is modulated with 30 kHz, the spectrum components are spaced at intervals of 30 kHz, that is, 9.91 MHz, 9.94 MHz, 9.97 MHz, 10.00 MHz, 10.03 MHz, 10.06 MHz, 10.09 MHz, with 10 MHz being the center, as shown in FIG. 6A. In contrast to this, in the first aspect of the present invention, the period (frequency) of a spread spectrum modulation signal is changed in such a way that tm1=30 kHz, tm2=27 kHz, and tm3=33 kHz, as shown in FIG. 5A or FIG. 5B. In this case, as shown in FIG. 6B, the spectrum components are divided into three groups, that is, one group in which they are spaced at intervals of 27 kHz, another group in which they are spaced at intervals of 30 kHz, and the other group in which they are spaced at intervals of 33 kHz, therefore, the height of each spectrum is reduced compared to the conventional case.

As described above, according to the first aspect of the present invention, as the period of the spread spectrum modulation signal changes so as to take multiple different periods, the spectrum is further spread compared to the case where the period is constant, therefore, the electromagnetic wave radiation can be further reduced. Moreover, as the period of the spread spectrum modulation signal changes for each period in order, the period is unlikely to change rapidly in a short time and the cycle-to-cycle jitter, which is the difference in period between neighboring clock pulses, is small. Therefore, even when the generated clock is used in circuits such as a logic circuit, no problem of circuit operation is brought about.

It is also possible to change the period of the spread spectrum modulation signal at the point of zero-crossing as shown in FIG. 5A, or change the period at the point where the amplitude is minimum as shown in FIG. 5B. There can be various cases of modification such as a case where the period is changed at the position of maximum amplitude and a case where the period is changed at the position where the amplitude reaches a predetermined value. Moreover, the number of variable periods is not limited to three, but may be four or more as long as the number is larger than one.

As a clock generator, a voltage control oscillator (VCO) can be used. When a VCO is used as a clock generator, a spread spectrum modulation signal is obtained by adding the spread spectrum modulation signal generated in the spread spectrum modulation circuit to the differential voltage produced at one end of the loop-filter, and the signal is applied to the VCO.

When a VCO is used as a clock generator, the spread spectrum modulation circuit can be realized by the use of an analog circuit or a digital circuit. When the spread spectrum modulation circuit is realized by the use of an analog circuit, for example, a spread spectrum analog voltage signal, the period of which changes so as to take multiple different periods, is generated in an analog modulator and the spread spectrum analog voltage signal is added to a differential signal in a voltage addition circuit. An analog modulator can be realized by comprising a plurality of different capacitors, a plurality of switches which select one of the plurality of different capacitors, a constant current source which supplies a constant current to the selected capacitor or makes a constant current flow out of the selected capacitor, a hysteresis comparator which detects the fact that the voltage of the selected capacitor reaches a first and second predetermined voltages, and a switch control circuit which switches the selection of a plurality of switches when the hysteresis comparator detects the fact that the first and second predetermined voltages are reached.

Further, when the above circuits are used, a slope of an amplitude of the spread spectrum modulation is straight, and the slope of the amplitude change is determined by the selection of the switches. Therefore, when the selection of the switches is changed in a predetermined period of the spread spectrum modulation signal, a spread spectrum modulation signal shown in FIG. 67 can be obtained. In other words, a spread spectrum modulation signal similar to that shown in FIG. 3 can be obtained by a simple constitution.

When the spread spectrum modulation circuit is realized by the use of a digital circuit, an output code the period of which changes so as to take multiple different periods is generated in the digital control circuit, a spread spectrum voltage signal in accordance with the output code is generated in a digital-to-analog conversion voltage circuit, and the spread spectrum voltage signal is added to a differential signal in a voltage addition circuit.

The present invention can be applied to a spread spectrum modulation circuit which uses a current oscillator (ICO) instead of a VCO. This spread spectrum modulation circuit has a configuration in which a differential voltage is converted into a differential current signal in a voltage-current conversion circuit, the differential current signal is made to go through the spread spectrum modulation in a current variable circuit, and the spread spectrum modulation signal is applied to the current oscillator (ICO). When the present invention is applied to a spread spectrum modulation circuit which uses an ICO, a voltage-current conversion circuit, which converts a differential voltage into a differential current signal, is further comprised and an ICO is used as a clock generator. The spread spectrum modulation circuit comprises a digital control circuit which generates an output code the period of which changes so as to take multiple different periods and a current variable circuit provided between the voltage-current conversion circuit and the ICO and which modulates a differential current signal in accordance with the output code and generates a spread spectrum current modulation signal.

The current variable circuit can be realized by comprising a circuit which generates a differential current signal with a predetermined ratio and a digital-to-analog conversion current circuit which converts an output code into a spread spectrum current signal, which is an analog signal, and adds it to the differential current signal with a predetermined ratio. It is desirable for the current variable circuit to further comprise a low-pass filter which removes a high frequency component.

A digital control circuit can be realized by comprising a plurality of dividers with a different dividing ratio which divides a clock, a switching controller which selects the output of the plurality of the divider in order, an up/down counter which counts the selected diving clock, and a counter which counts the dividing clock and switches between the up operation and the down operation of the up/down counter for each predetermined count number.

A digital control circuit can also be realized by the use of a computer system which is controlled by programs.

When the spread spectrum modulation circuit is realized by the use of a digital circuit, the spread spectrum modulation signal shown in FIGS. 5A,5B and 67 can be easily obtained.

Moreover, in order to realize the above-mentioned first object, a spread spectrum clock generation circuit according to a second aspect of the present invention is characterized in that a spread spectrum modulation circuit modulates a differential signal and generates a spread spectrum modulation signal in which a local maximum and minimum of an amplitude change. For example, the spread spectrum modulation signal has a triangular waveform and its amplitude or mean level in each cycle changes.

The spread spectrum clock generation circuit according to the second aspect also has a configuration as shown in FIG. 4 and the spread spectrum modulation circuit 19 generates a spread spectrum modulation signal in which a local maximum and minimum of an amplitude change.

FIG. 7A to FIG. 7D are diagrams illustrating the principle of the second aspect of the present invention in which the amplitude changes. The amplitude of the spread spectrum modulation signal is changed as shown in FIG. 7A. In this case, the spectrum component becomes one in which both ends are lowered as shown in FIG. 7D, which is a synthesized spectrum of a spectrum whose amplitude is small, as shown in FIG. 7B, and a spectrum whose amplitude is large, as shown in FIG. 7C.

As described above, according to the second aspect of the present invention, as the amplitude of the spread spectrum modulation signal changes so as to have multiple different periods, it is possible to lower both the ends of the spectrum than when the amplitude is constant and the electromagnetic wave radiation can be further reduced. It is desirable for the amplitude of the spread spectrum modulation signal to change without a sudden change between neighboring periods for each period. For example, when the spread spectrum modulation signal changes so as to take positive and negative levels, with the zero level being the center, as shown in FIG. 7A, the amplitude is changed when the signal is at the zero level. When the minimum level is constant, the amplitude is changed when the level is minimum. In this manner, the spread spectrum modulation signal does not change the level suddenly on the way and the cycle-to-cycle jitter, the difference between the periods of neighboring clock pulses is small. Therefore, there is no problem of circuit operation even when the generated clock is used in a logic circuit or the like.

Although FIG. 7A shows a combination of two kinds of amplitudes, that is, a large amplitude and a small amplitude, it is also possible to combine three or more kinds of amplitudes. Further, the mean level of the signal can be shifted in each cycle as shown in FIG. 68. Further, combinations of the first and second aspects are also available. For example, the spread spectrum modulation signal can simultaneously changes its amplitude and/or mean level with the spread spectrum modulation cycle. FIG. 69 shows a waveform of the spread spectrum modulation signal in which the period and the mean level of the spread spectrum modulation signal in each cycle are simultaneously changed. In respective cases, it is important that the amplitude continuously changes.

When a VCO is used as a clock generator, a spread spectrum modulation signal is obtained by adding the spread spectrum modulation signal generated in a spread spectrum modulation circuit to a differential voltage generated at one end of a loop-filter, and the signal is applied to the VCO.

When a VCO is used as a clock generator, a spread spectrum modulation circuit can be realized by the use of an analog circuit or a digital circuit. When a spread spectrum modulation circuit is realized by the use of an analog circuit, for example, a spread spectrum analog voltage signal which changes so as to take multiple different amplitudes is generated in an analog modulator and the spread spectrum analog voltage signal is added to the differential signal in a voltage addition circuit. The analog modulator can be realized by comprising a capacitor, a constant current source which switches between one state in which the capacitor is charged with a constant current and the other state in which a constant current is discharged from the capacitor, and a switching control circuit which changes the switching cycle of the constant current source.

When a spread spectrum modulation circuit is realized by a digital circuit, the spread spectrum modulation circuit can be realized by a digital control circuit which generates an output code which changes continuously between the maximum value and the minimum value and at least one of the maximum value and the minimum value changes so as to take multiple different values for each period in order, a voltage digital-to-analog conversion circuit which generates a spread spectrum modulation voltage signal in accordance with the output code, and a voltage addition circuit which adds the spread spectrum voltage signal to a differential voltage.

It is also possible to apply the second aspect of the present invention to a spread spectrum modulation circuit which uses the above-mentioned ICO. In this case, the spread spectrum modulation circuit comprises a digital control circuit which generates an output code which changes continuously between the maximum value and the minimum value and at least one of the maximum value and the minimum value changes so as to take multiple different values for each period in order, and a current variable circuit which is provided between a voltage-current conversion circuit and a current control oscillator and which generates a spread spectrum current modulation signal by modulating a differential current signal in accordance with the output code.

A current variable circuit can be realized by a digital-to-analog conversion current circuit which converts an output code into a spread spectrum current signal, which is an analog signal, and adds it to a differential current signal. It is desirable for the current variable circuit to further comprise a low-pass filter which removes a high frequency component.

The spread spectrum modulation circuit can be also realized by a digital control circuit which generates a spectrum modulation code the value of which changes in order in a predetermined period and a level change code the value of which changes so as to take multiple different values in order for each predetermined period, a first current variable circuit which is provided between a voltage-current conversion circuit and a current control oscillator and which modulates a current signal with a predetermined ratio of a differential current signal in accordance with a spectrum modulation code, and a second current variable circuit which amplifies the output of the first current variable circuit in accordance with the level change code, and by adding the output of the second current variable circuit to the differential current signal. Moreover, it is possible to carry out the level change earlier in this configuration, and in this case, the first current variable circuit amplifies the current signal with a predetermined ratio of the differential current signal in accordance with the level change code and the second current variable circuit modulates the output of the first current variable circuit in accordance with the spectrum modulation code.

A digital control circuit whose configuration is the same as that used in the first aspect can be used and can also be realized by the use of a computer system controlled by programs.

Moreover, a spread spectrum clock generation circuit according to a third aspect of the present invention in order to realize the above-mentioned first object combines a spread spectrum modulation circuit which carries out the spread spectrum modulation on a current signal in digital processing and an amplifier circuit.

It is desirable to change the waveform of the spread spectrum modulation in accordance with purposes, but the configuration of a current type digital-to-analog converter (IDAC) making up a digital processing type spread spectrum modulation circuit is fixed in a chip and it is necessary to use a large scale IDAC with a large number of bits in order to provide a predetermined resolution for a wide range of amplitude, and as a result, the cost is increased. According to the third aspect of the present invention, it is possible to add a signal, which has gone through the spread spectrum modulation in an IDAC, to a differential current signal after the modulated signal is amplified to a proper amplitude in an amplifier circuit, or to carry out the spread spectrum modulation in an IDAC on a differential current signal amplified to a proper amplitude, therefore, the resolution of the IDAC can always be utilized to the maximum. Because of this, it is possible to use a small scale IDAC with a relatively small number of bits.

Moreover, a spread spectrum clock generation circuit according to a fourth aspect of the present invention in order to realize the above-mentioned first object is configured in such a way that a current injection circuit is connected to the connection node of a resistor and a capacitor making up a loop-filter, and the capacitor is charged and discharged so that the voltage of the capacitor changes with a voltage amplitude smaller than the capacitor voltage in a period of the spread spectrum modulation longer than the period of the generated clock. According to the fourth aspect of the present invention, it is possible to carry out a spread spectrum modulation with a smooth change by the use of a simple circuit.

Moreover, in a jitter generation circuit according to a fifth aspect of the present invention in order to realize the above-mentioned second object, the reversing timing of an output level is changed with respect to a constant interval timing in accordance with the period of the reference input signal by switching the threshold voltages of the circuit. In this manner, an output signal, which is the reference input signal to which a jitter has been added, is output. In this configuration, it is possible to add a jitter to the reference input signal with a simpler circuit configuration than that of the prior art. On the other hand, when the frequency of the reference input signal changes, the jitter of the output signal changes in accordance with the frequency of the reference input signal.

The jitter generation circuit according to the fifth aspect comprises a hysteresis inverter circuit having a hysteresis characteristic, an inverter circuit without a hysteresis characteristic, and a switch circuit provided between an output terminal and the hysteresis inverter circuit and between the output terminal and the inverter circuit, respectively, and the jitter generation circuit is configured in such a way that either the hysteresis inverter circuit or the inverter circuit is connected to the output terminal by the use of the switch circuit. In this manner, the threshold voltages are switched and a jitter can be generated in an output signal.

Moreover, the jitter generation circuit according to the fifth aspect is configured so as to comprise a hysteresis inverter circuit consisting of a plurality of transistors and a switch to cut off the transistors, which are provided to make the hysteresis inverter circuit have hysteresis, from the hysteresis inverter circuit. In this manner, the threshold voltages are switched and it becomes possible to generate a jitter in an output signal.

The jitter generation circuit according to the fifth aspect is also configured in such a way that a plurality of gate circuits, whose threshold voltages are different, are connected in parallel and any one of the gate circuits is selectively connected to an output terminal by the use of a switch circuit provided between the output terminal to output an output signal and each gate circuit, respectively. In this manner, the threshold voltages are switched and it becomes possible to generate a jitter in an output signal.

In a semiconductor device using the jitter generation circuit according to the fifth aspect of the present invention, an output signal to which a jitter has been added is output from the jitter generation circuit and an internal circuit is operated based on the output signal, therefore, the radiation noise produced during operation of the internal circuit is reduced effectively. When the generated clock signal changes in a rectangular wave manner in such a semiconductor device, a circuit is provided which changes a clock signal into a sinusoidal wave signal. A selection signal, which switches the threshold voltages, is generated from the clock signal.

Moreover, when the internal circuit in the semiconductor device can be classified into a plurality of groups whose operation frequency is different, a plurality of jitter generation circuits which add a different amount of jitter are provided to supply a jitter to each circuit group in accordance with the operation frequency. It is also possible to supply a clock signal, to which a jitter is not added, to a circuit group whose operation timing is strict and whose operation frequency is high. In this manner, as it is possible to adjust the amount of jitter in accordance with the operation frequency, the speed of the circuit operation can be increased and at the same time the radiation noise can be reduced. In this case, the jitter generation circuit can be one according to the fifth aspect of the present invention or to another one.

In this case, a dividing circuit is provided in order to generate clock signals with a different frequency and they are supplied to each jitter generation circuit.

Moreover, it is possible to make adjustable the amount of jitter to be added to a clock signal in accordance with the operation state of the internal circuit, for example, the power supply voltage supplied to the internal circuit or the operation speed of the internal circuit.

BRIEF DESCRIPTION OF THE DRAWINGS

The features and advantages of the invention will be more clearly understood from the following description taken in conjunction with the accompanying drawings, wherein:

FIG. 24 is a diagram showing an output of a control circuit (change in code) in a fifth embodiment of the present invention;

FIG. 31A and FIG. 31B are diagrams showing the configuration based on the principle of a third aspect of the present invention;

FIG. 33 is a diagram showing the configuration of an SSCG in an eight embodiment of the present invention;

FIG. 43A to FIG. 43D are diagrams showing the operation waveforms of a current source control signal, a current source output current and a VCO input voltage;

DESCRIPTION OF THE PREFERRED EMBODIMENTS

Figure 1:
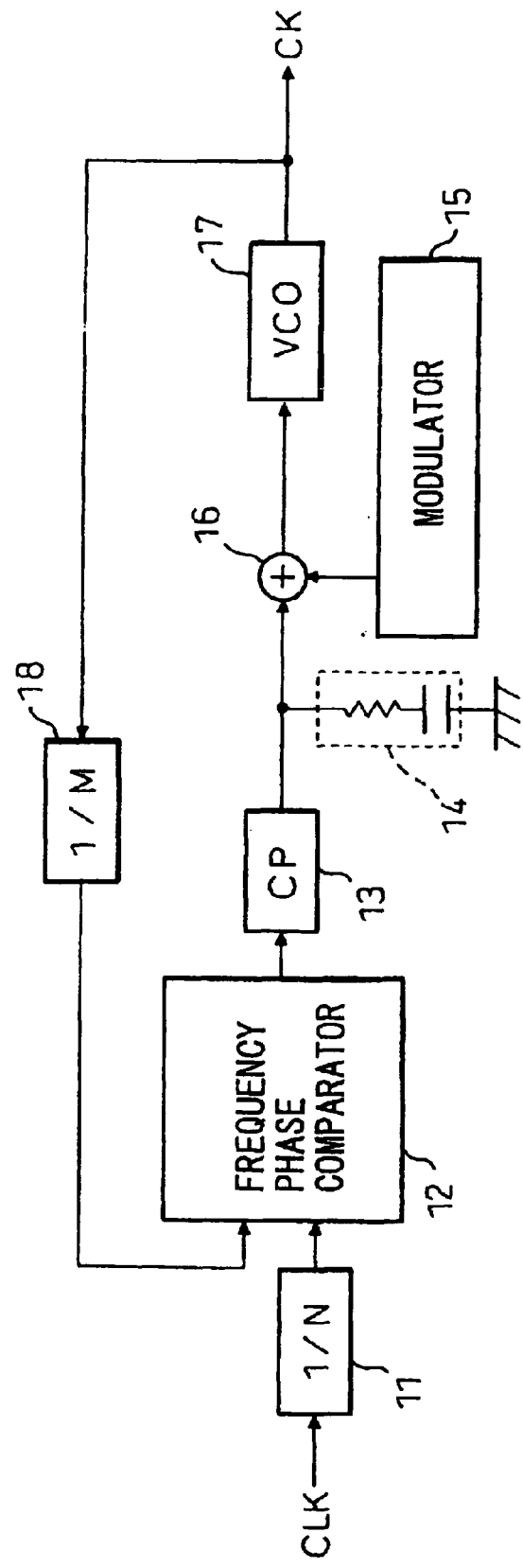
FIG. 1 is a diagram showing a configuration example of a conventional spread spectrum clock generation (SSCG) circuit.
Figure 2:
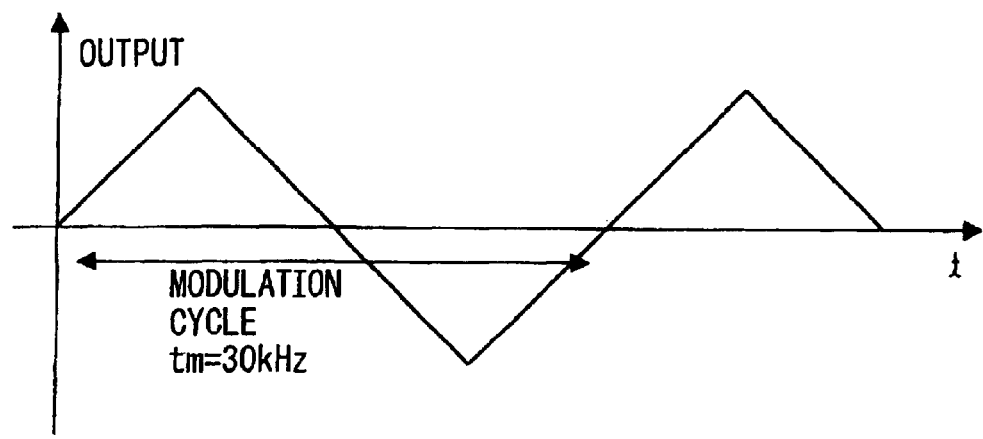
FIG. 2 is a diagram showing a modulator output (spread spectrum modulation signal) in a conventional case.
Figure 5A:
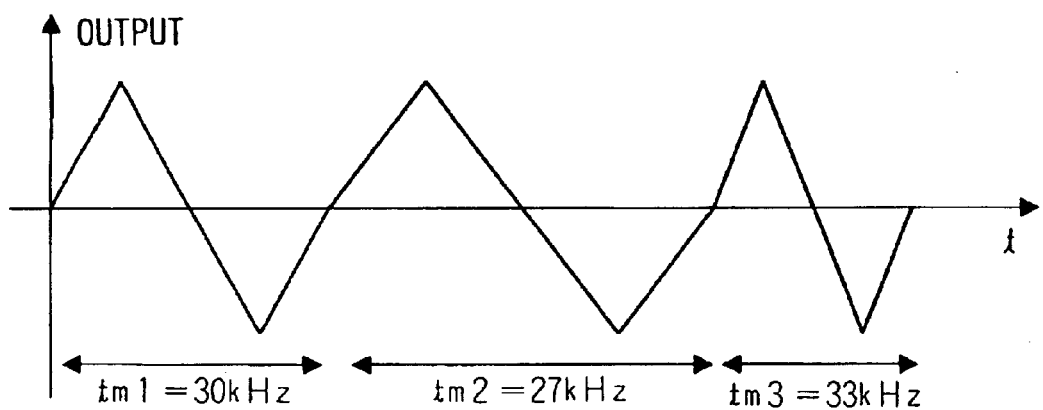
FIG. 5A and FIG. 5B are diagrams illustrating the principle of the first aspect of the present invention and showing an example of a spread spectrum modulation signal of the present invention.
Figure 8:
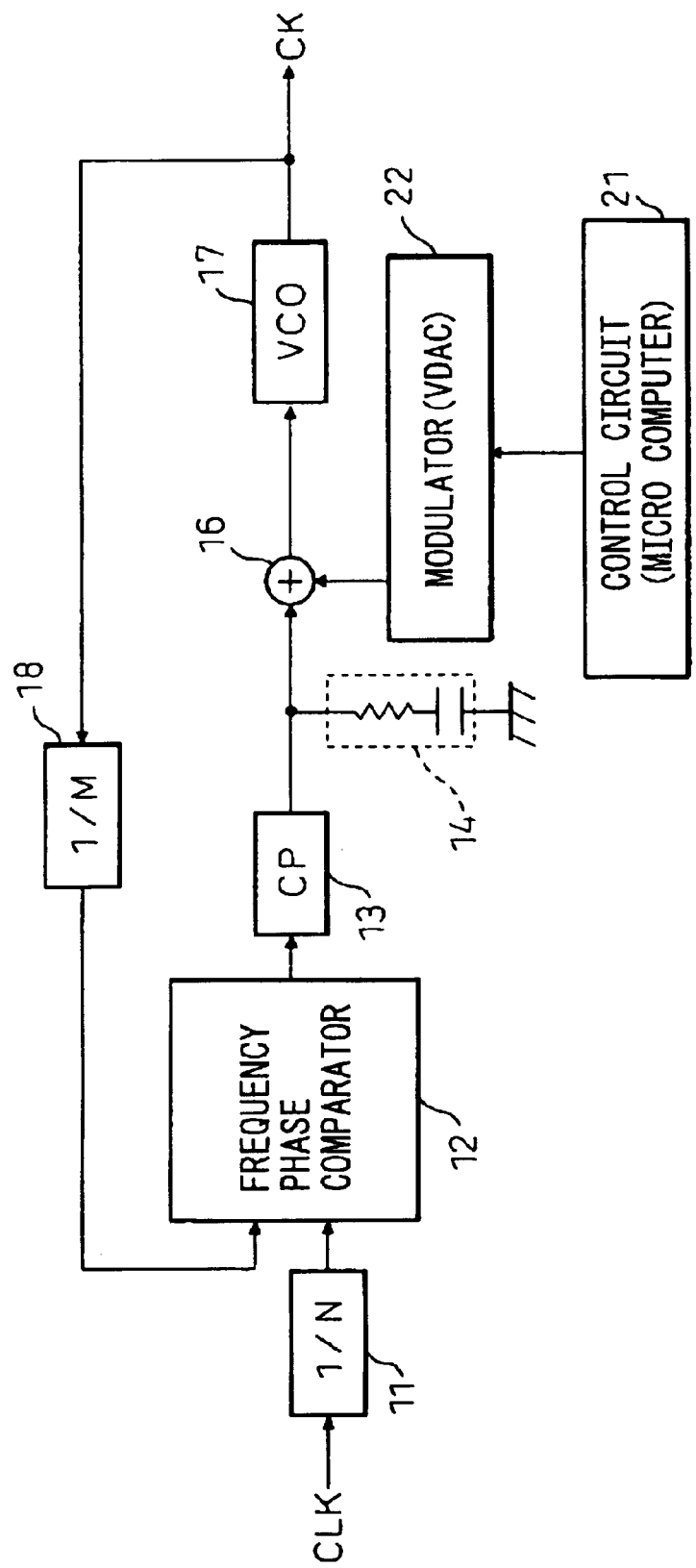
FIG. 8 is a diagram showing the configuration of an SSCG according to a first embodiment of the present invention.

FIG. 8 is a diagram showing the configuration of the spread spectrum clock generation (SSCG) circuit in the first embodiment of the present invention. As shown schematically, this circuit is a circuit in which a clock CK M/N times the reference clock CLK is generated therefrom by the use of a PLL circuit as in the circuit shown in FIG. 1 but differs from a conventional one in that the period of a spread spectrum modulation signal generated by a modulator 22 changes in order as shown in FIG. 5A.

Figure 9:
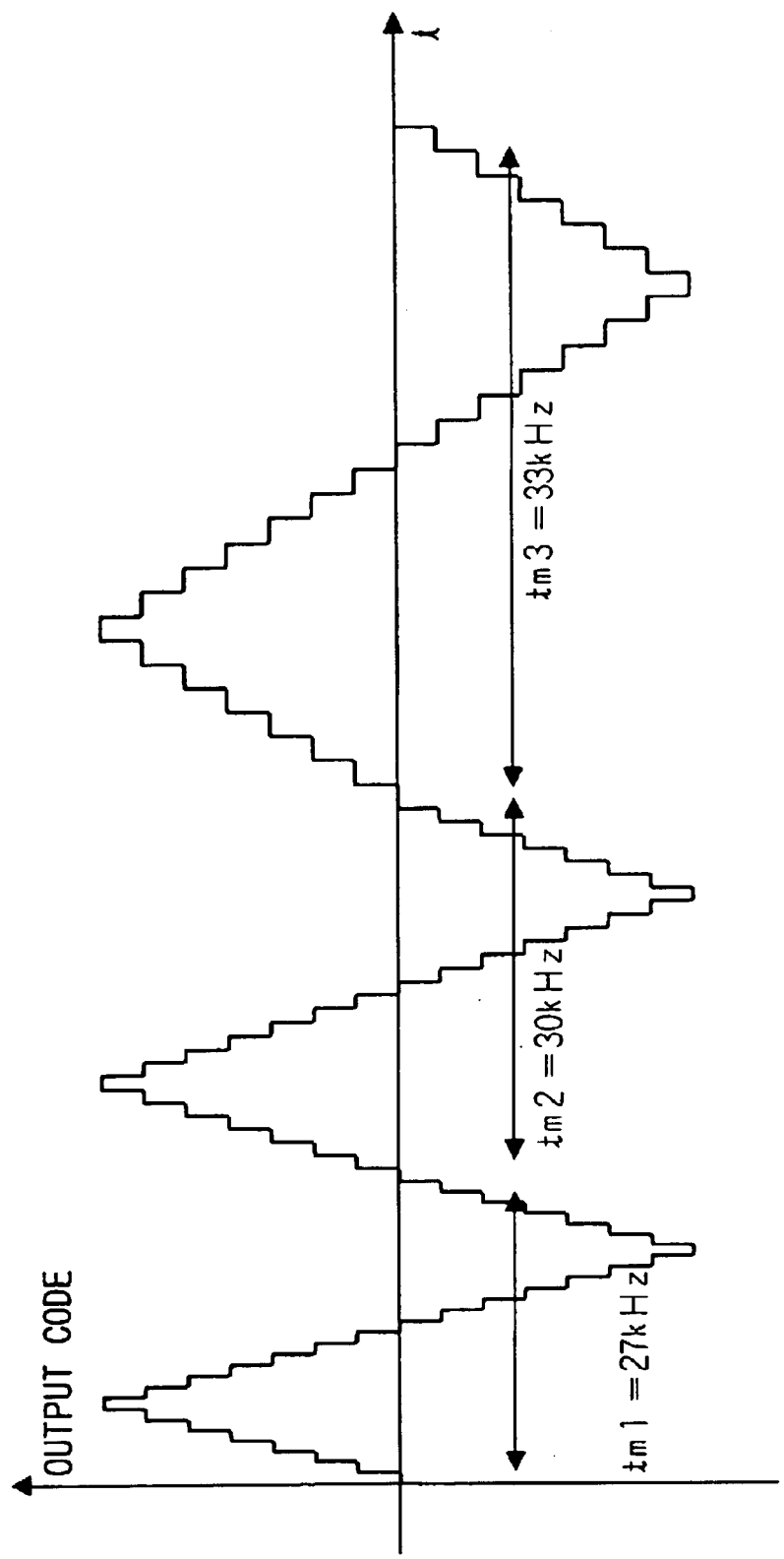
FIG. 9 is a diagram showing the output of a control circuit (change in code) in the first embodiment.

As shown in FIG. 8, in the SSCG circuit in the first embodiment, a control circuit 21 generates an output code such as shown in FIG. 9 and outputs it to the modulator 22. The modulator 22 is a voltage digital-to-analog converter (VDAC) and converts the output code into an analog voltage signal. In this manner, a spread spectrum modulation analog voltage signal as shown in FIG. 5A is obtained. When the voltage signal does not change smoothly because of the voltage change width corresponding to the least significant bit of the output code, a low-pass filter is used for smoothing. The voltage addition circuit 16 adds the spread spectrum modulation analog voltage signal to a differential voltage generated at one end of the loop-filter 14. In this manner, the voltage to be applied to the VCO 17 changes with a small amplitude while the period is changing in order, and the frequency (period) of a clock CK generated by the VCO 17 changes in a small range in a predetermined period and, moreover, the period of change changes in order.

It is possible to realize the control circuit 21 by the use of a digital logic circuit or the like if it is not necessary to change the output code to be generated. The description will not given here because any person skilled in this field can devise such a circuit configuration easily. It is also possible to realize the control circuit 21 by the use of a computer system controlled by programs such as a micro computer or a DSP. In this case, it is also possible to change the output code in accordance with the external control.

Figure 10:
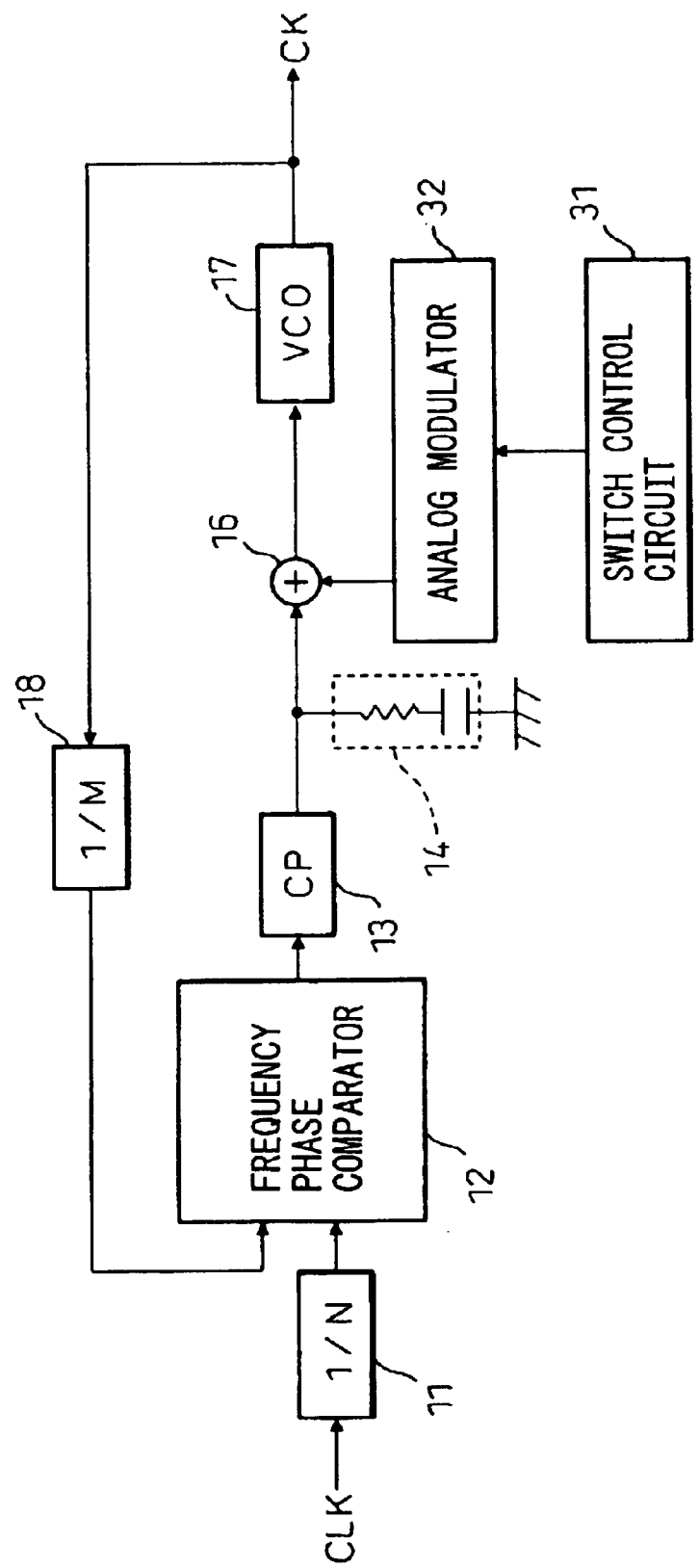
FIG. 10 is a diagram showing the configuration of an SSCG according to a second embodiment of the present invention.

FIG. 10 is a diagram showing the configuration of the SSCG circuit in the second embodiment of the present invention. Although the spread spectrum modulation analog voltage signal is generated by digital processing in the first embodiment, the spread spectrum modulation analog voltage signal is generated by analog processing in the second embodiment.

Figure 11:
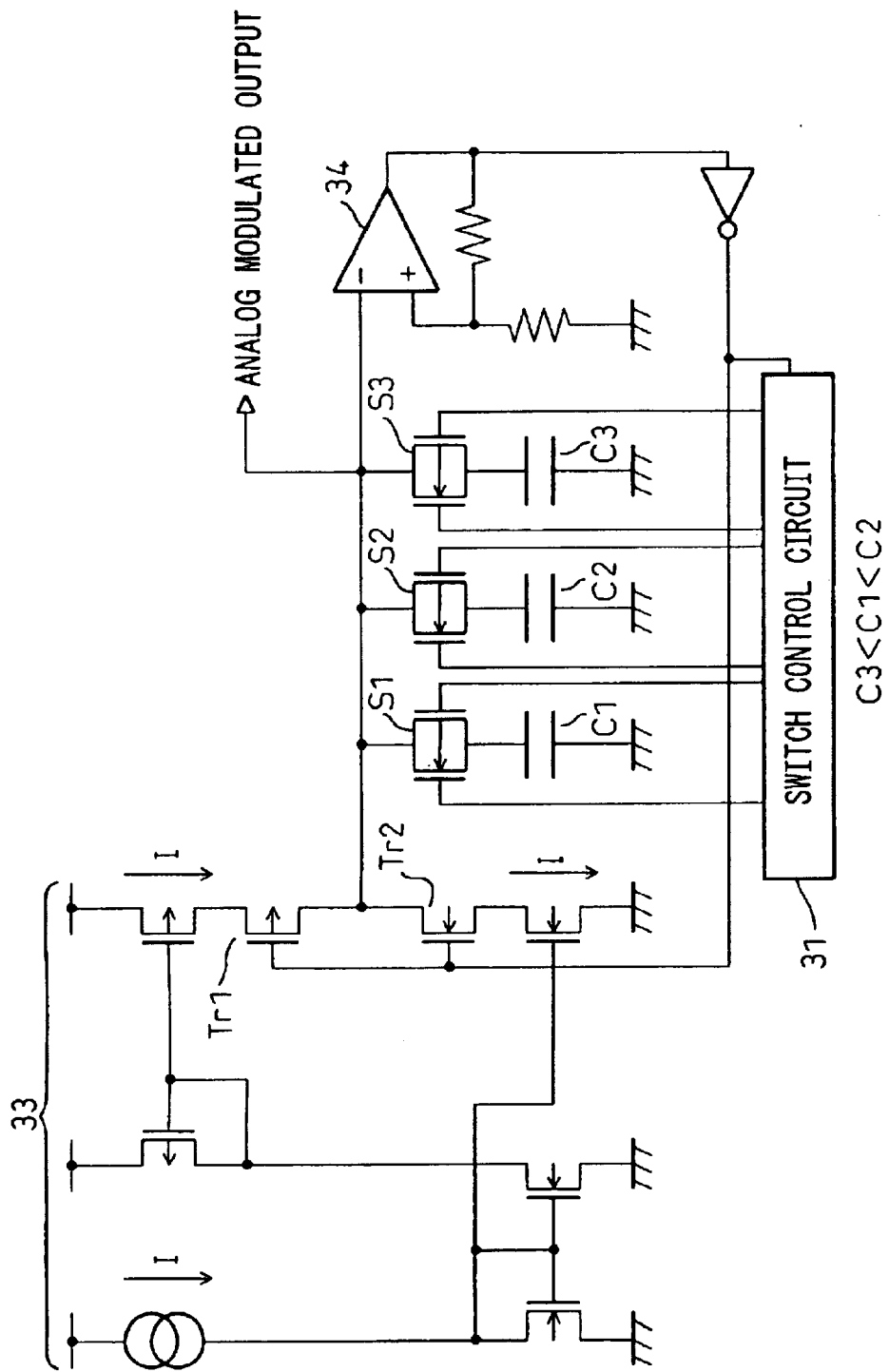
FIG. 11 is a diagram showing the circuit configuration of an analog modulation circuit in the second embodiment.
Figure 12:
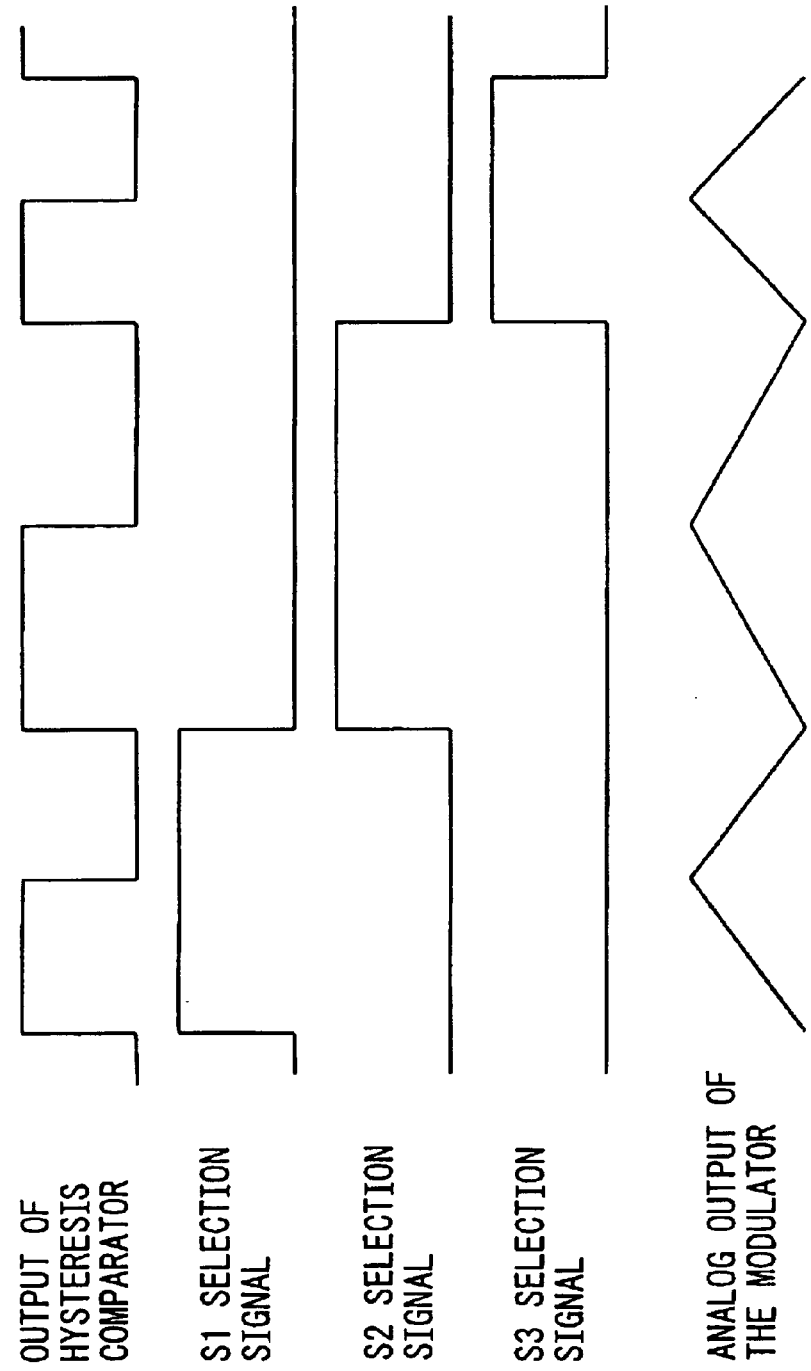
FIG. 12 is a diagram showing the operation of the analog modulation circuit in the second embodiment.

FIG. 11 is a diagram showing the circuit configuration of a switch control circuit 31 and an analog modulator 32 shown in FIG. 10, and FIG. 12 is a diagram showing the operation of the analog modulator. As shown in FIG. 11, three capacitor elements C1 to C3 having a different capacitance are provided in this circuit and one end of each capacitor element is connected to the ground and the other end is connected commonly via switches S1 to S3, respectively. The state of conduction or the state of no conduction of each switch is controlled by the control circuit 31. The portion denoted by reference number 33 is a current source circuit which supplies (charges) a current equal to a current I which flows in a constant current circuit to a terminal to which the switches S1 to S3 are commonly connected or makes the current to flow out (discharge) from the terminal by the use of a current mirror circuit. The terminal to which the switches S1 to S3 are commonly connected is an output terminal of the analog modulator and connected to a hysteresis comparator 34. The hysteresis comparator 34 compares the input voltage of the terminal to which the switches S1 to S3 are commonly connected with first and second reference values and controls transistors Tr1 and Tr2 of the current source circuit in accordance with the comparison result, and switches the current source circuit between the state of charging and the state of discharging.

The operation of the circuit shown in FIG. 11 is described below by referring to FIG. 12.

First, the output of the hysteresis comparator 34 becomes "High (H)", the transistor Tr1 is set to the state of conduction, Tr2 is set to the state of no conduction, and the current source circuit is set to the state of charging. The switch control circuit 31 outputs a selection signal which brings S1 into the state of conduction and S2 and S3, into the state of no conduction. In this manner, the current I is supplied to C1 and the voltage of the analog modulator output increases. When the voltage of the analog modulation output reaches a first predetermined value, the output of the hysteresis comparator 34 changes to "Low (L)", Tr1 is set to the state of out of conduction, Tr2 is set to the state of conduction, and the current source circuit is set to the state of charging. The change in the output of the hysteresis comparator 34 is also notified to the switch control circuit 31. Because of this, the current I flows out from C1 and voltage of the analog modulation output decreases.

When the voltage of the analog modulator output reaches a second predetermined value, the output of the hysteresis comparator 34 changes to "H", Tr1 is set to the state of conduction, Tr2 is set to the state of out of conduction, and the current source circuit is set to the state of charging. The switch control circuit 31 switches S1 into the state of out of conduction and S2, into the state of conduction in accordance with the change in the output of the hysteresis comparator 34. S3 remains in the state of out of conduction. Because of this, as the case of C1, charging of C2 starts and, when voltage of the analog modulator output reaches the first predetermined value, the output of the hysteresis comparator 34 changes to "L", and the current source circuit is set to the state of charging. Then, the voltage of the analog modulator output reaches the second predetermined value.

As the capacitance of C1 is different from that of C2, the times required for charging and discharging differ and, therefore, triangular waves with a different period are obtained. The similar operation is repeated for C3. In this manner, the three analog modulator outputs with an identical amplitude but a different period, as shown in FIG. 11, are obtained.

Although a case where three capacitor elements are used is described here, it is also possible to use four or more capacitor elements, and to utilize the sum of capacitance values of a plurality of capacitor elements to generate angular waves with a different period by controlling two or more switches so that they are brought into the state of conduction at the same time.

Figure 13:
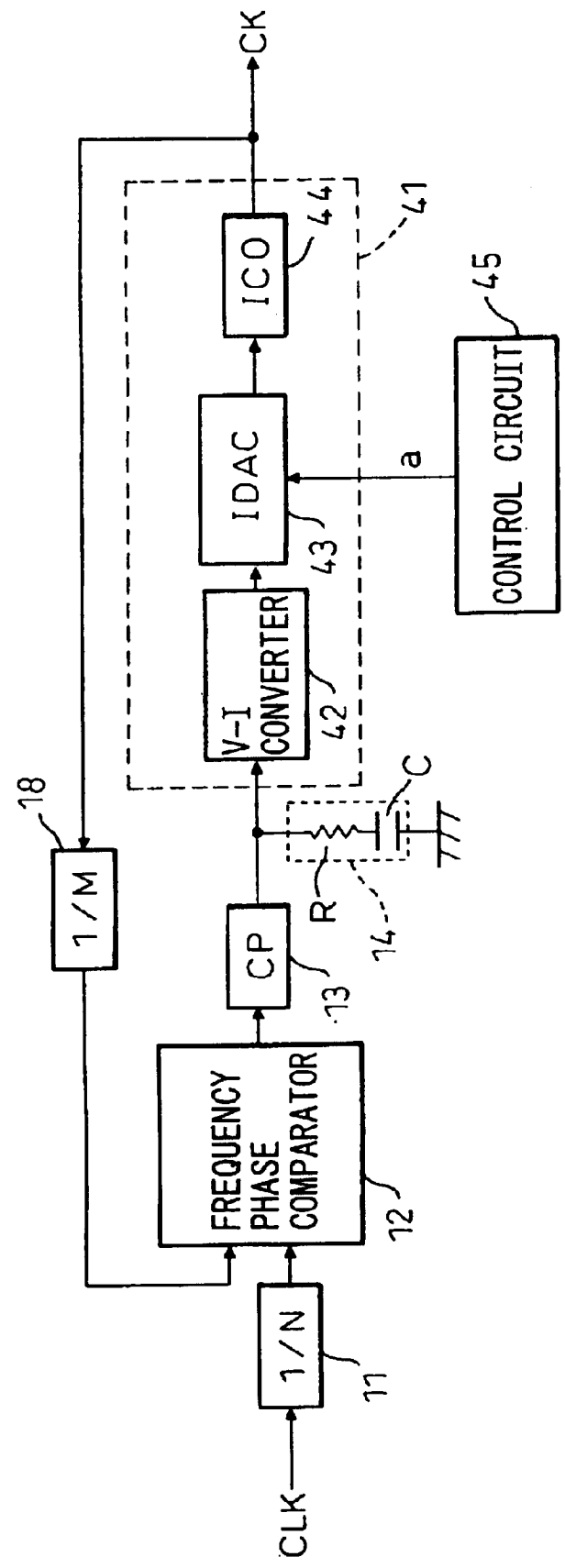
FIG. 13 is a diagram showing the configuration of an SSCG according to a third embodiment of the present invention.

FIG. 13 is a diagram showing the configuration of the SSCG circuit in the third embodiment of the present invention, which is an embodiment in which the present invention is applied to the configuration disclosed in the above-mentioned Japanese Patent Application No. 2002-266631. As shown in FIG. 13, the configuration is similar to that of the circuit in the first embodiment shown in FIG. 8, but differs in that the voltage addition circuit 16, the VCO 17, the control circuit 21 and the modulator (VDAC) 22 are replaced with a current oscillation circuit 41 consisting of a voltage-current conversion (V-I conversion) circuit 42, a current digital-to-analog converter (IDAC) 43 and a current oscillator (ICO) 44. The current oscillation circuit 41 is controlled by a control circuit 45. The V-I conversion circuit 42 converts the terminal voltage (differential voltage) of the loop-filter 14 into a differential current signal. The IDAC43, which corresponds to a current variable circuit, carries out the spread spectrum modulation on the differential current signal in accordance with the output code from the control circuit 45 and applies the modulated spread spectrum modulation current signal to the current oscillator (ICO) 44.

Figure 14:
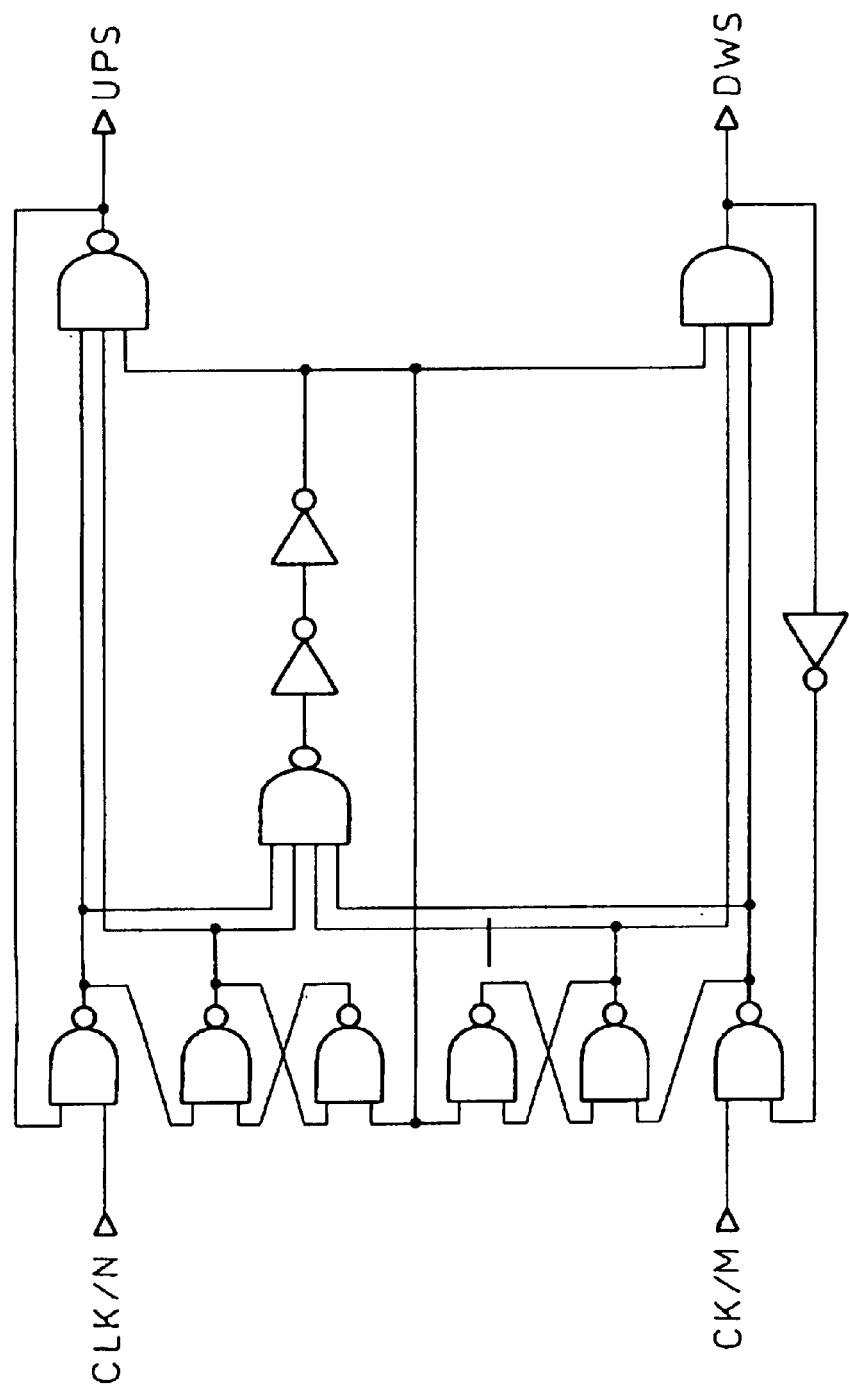
FIG. 14 is a diagram showing the circuit configuration of a frequency phase comparator.
Figure 15:
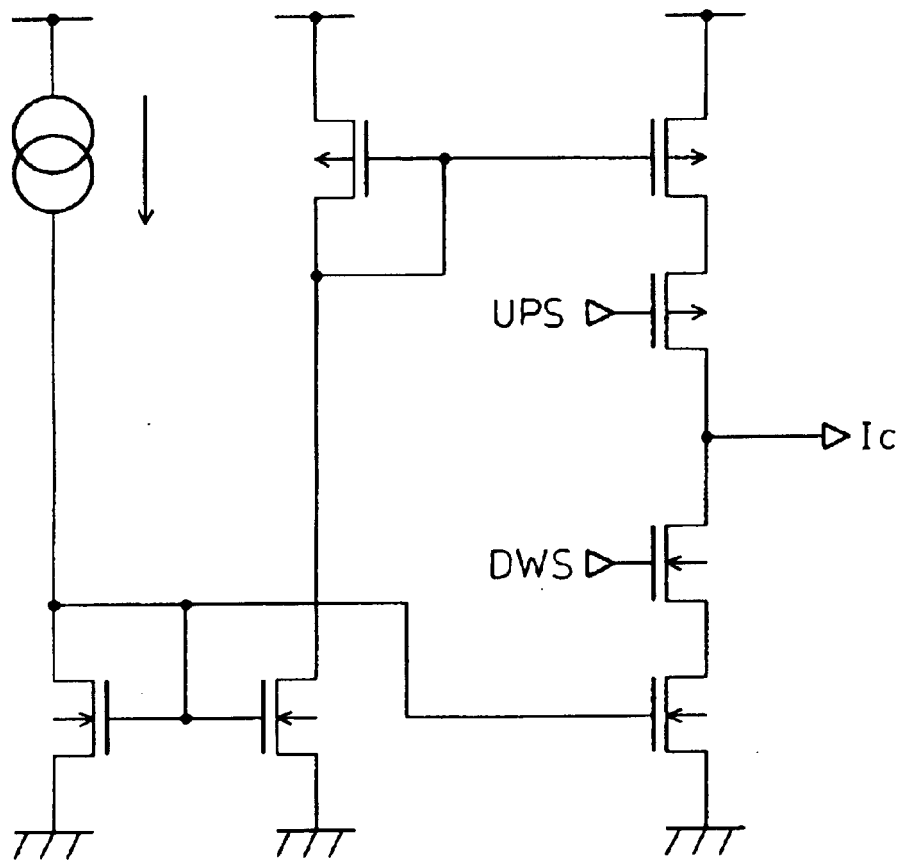
FIG. 15 is a diagram showing the circuit configuration of a charge pump circuit.

FIG. 14 is a diagram showing the circuit configuration of the frequency phase comparator and FIG. 15 is a diagram showing the configuration of the charge pump 13. These circuits can be used in the first to third embodiments. AS these circuits are widely known, no description will be given here.

Figure 16:
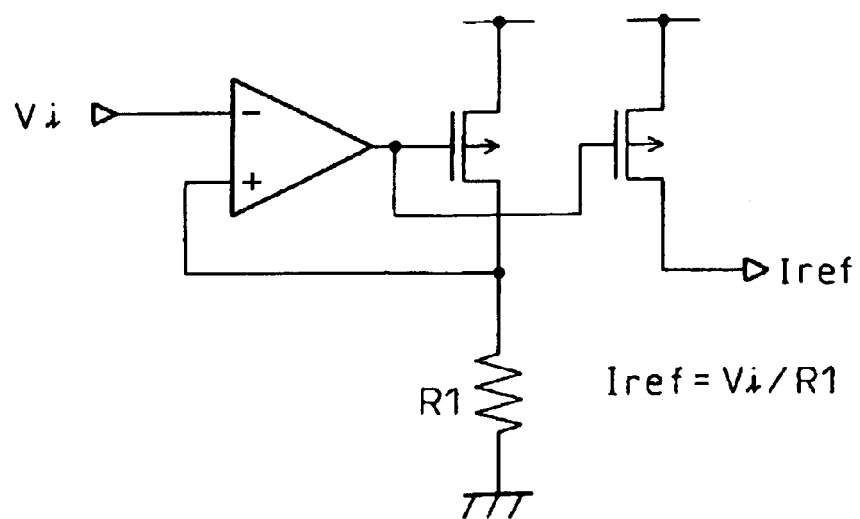
FIG. 16 is a diagram showing the circuit configuration of a voltage-current conversion (V-I conversion) circuit.
Figure 17:
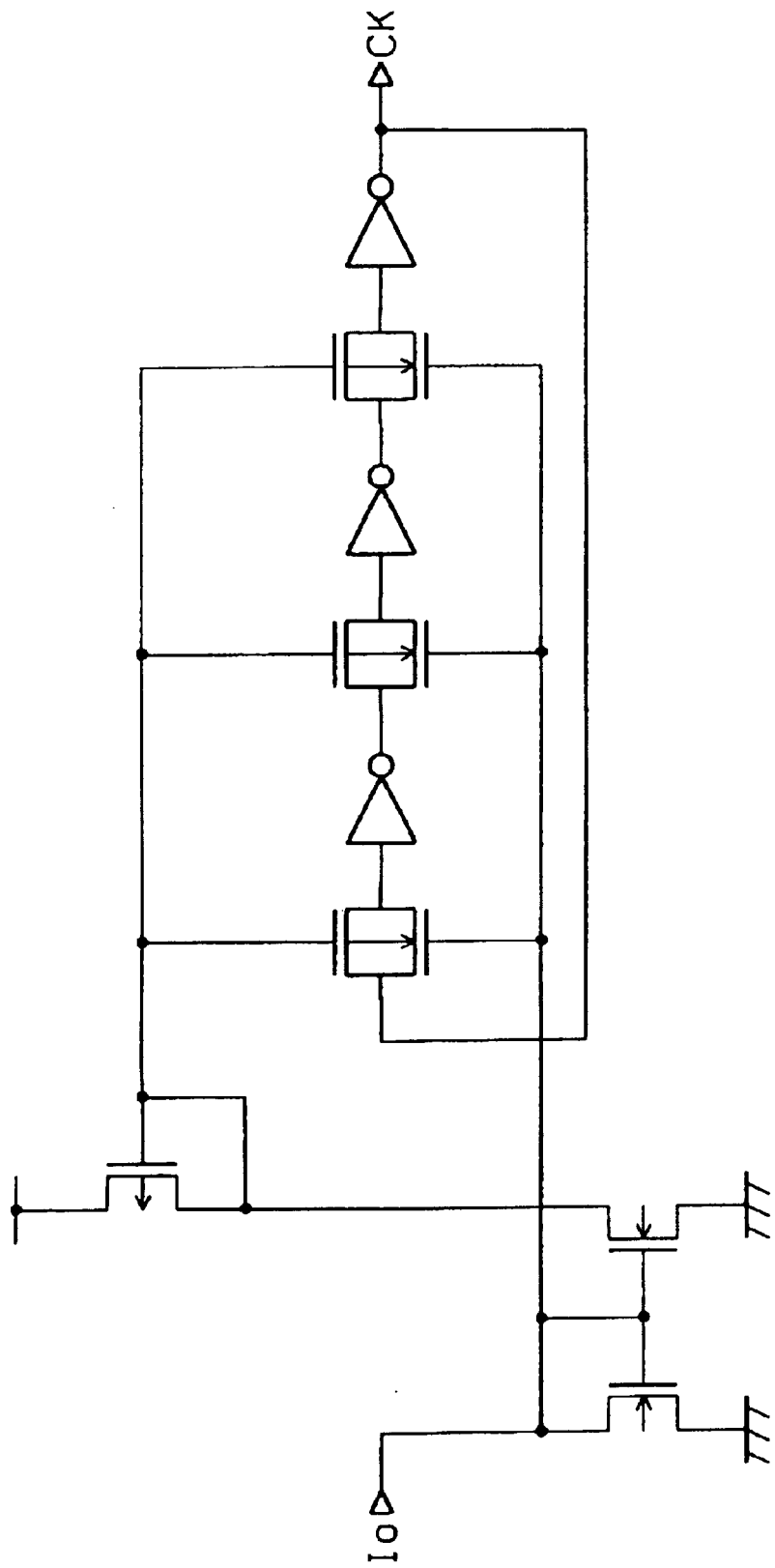
FIG. 17 is a diagram showing the circuit configuration of a current control oscillation circuit (ICO)
Figure 18:
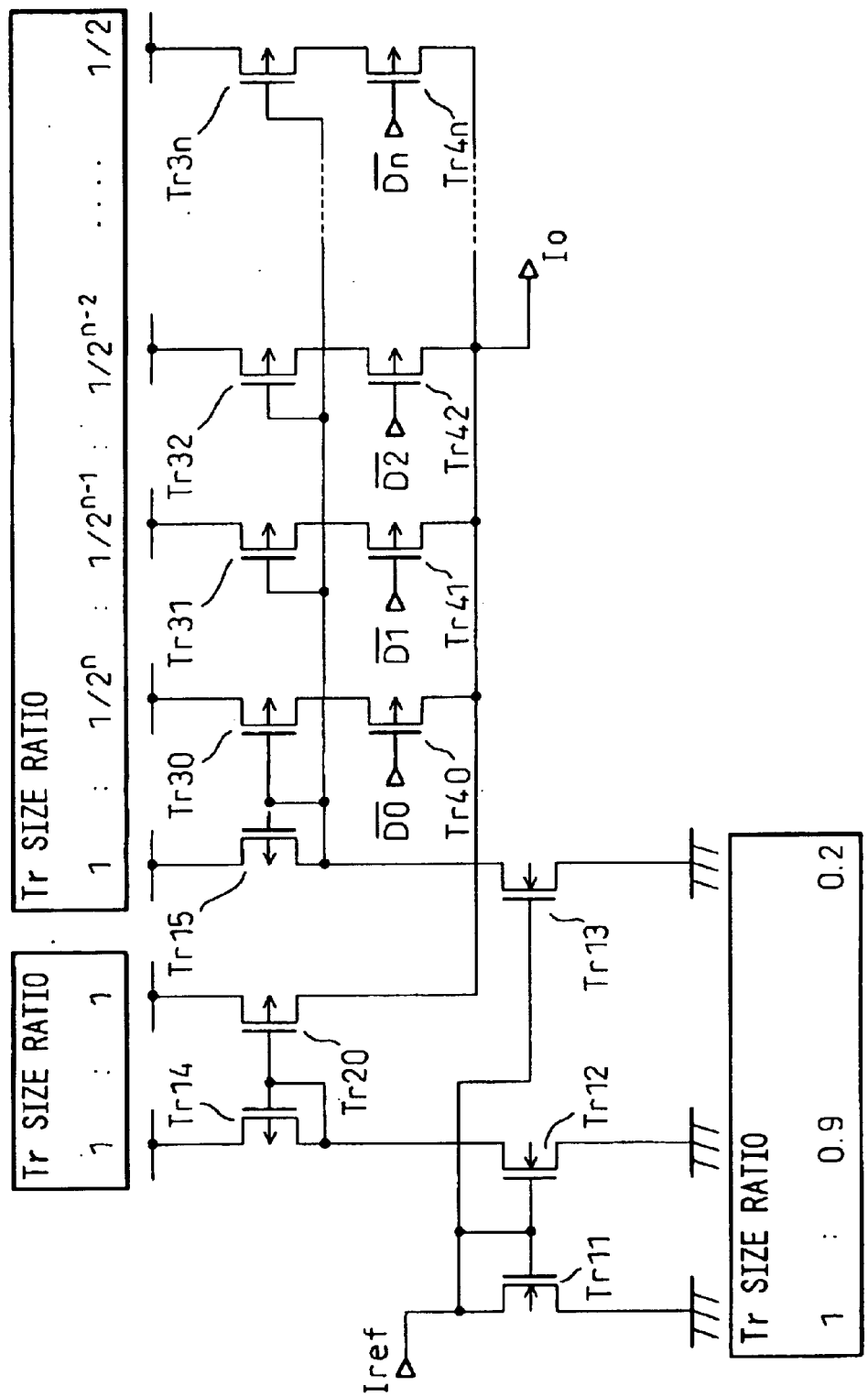
FIG. 18 is a diagram showing the configuration circuit of a current digital-to-analog converter (IDAC)

FIG. 16 shows the circuit configuration of a V-I conversion circuit to be used in the third embodiment, FIG. 17 shows the configuration of an ICO circuit to be used in the third embodiment, and FIG. 18 shows the circuit configuration of an IDAC circuit to be used in the third embodiment.

Figure 19:
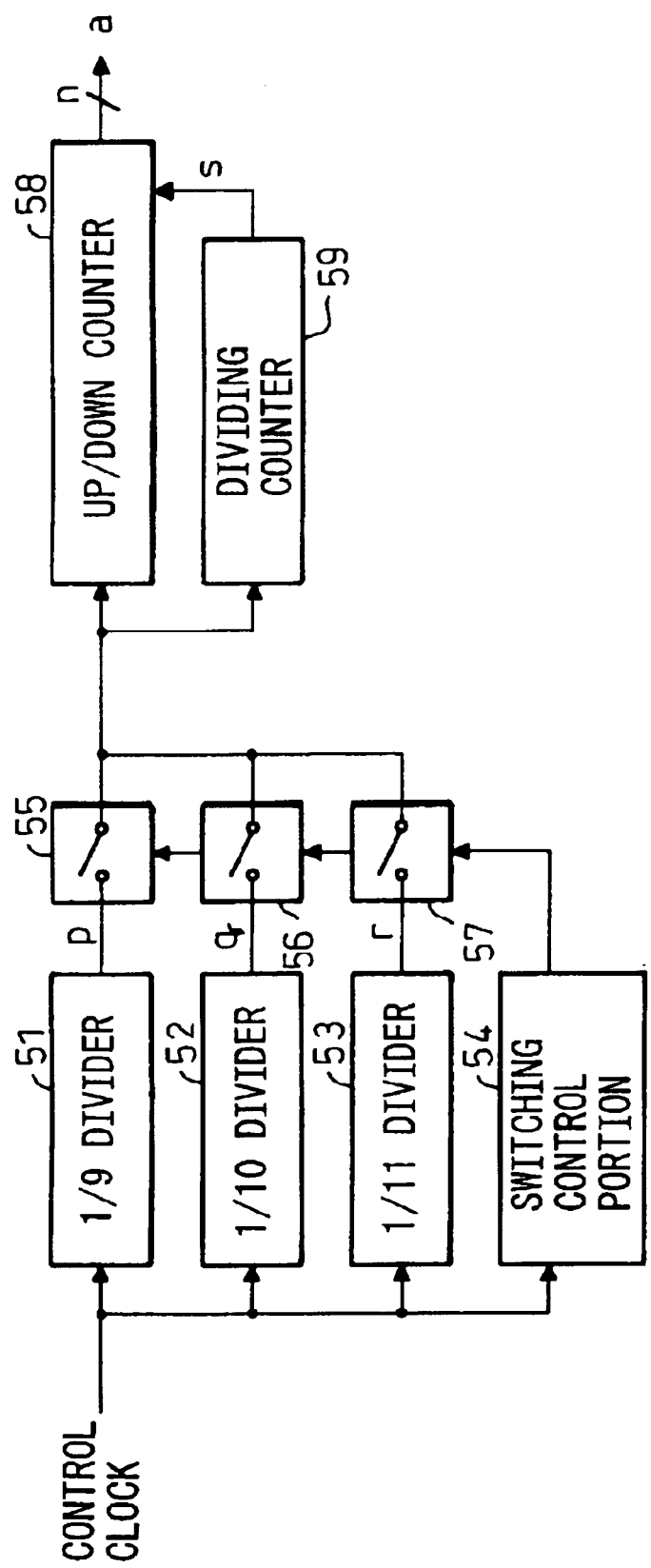
FIG. 19 is a diagram showing the configuration of a control circuit in the third embodiment.

FIG. 19 shows the configuration of the control circuit 14. As shown schematically, the control circuit 41 comprises three dividers 51 to 53 which divide a control clock by different dividing ratios (1/9, 1/10, and 1/11 here), switches 55 to 57 which select an output of any one of the dividers, a switching control portion 54 which selects a switch, an up/down counter 58 which counts a selected dividing clock, and a dividing counter 59 which controls the up/down counter 58. The up/down counter 58 outputs a count value in an n-bit binary code.

Figure 20:
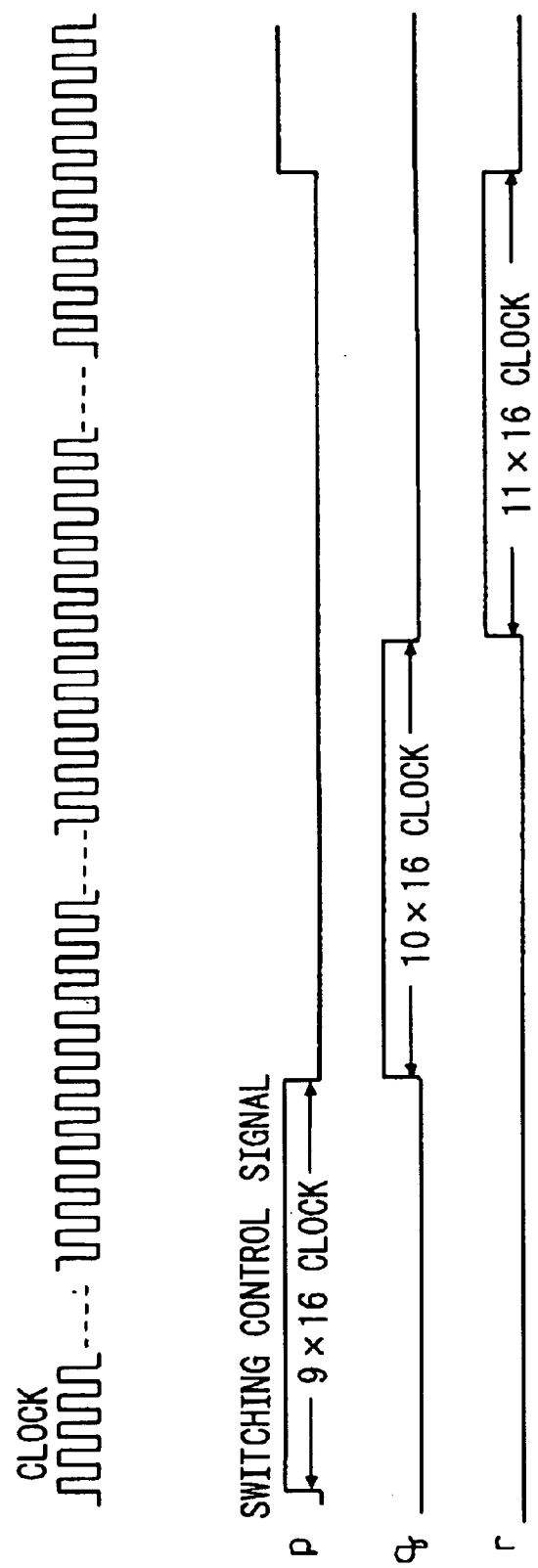
FIG. 20 is a diagram illustrating the generation of a dividing clock in the control circuit in the third embodiment.

FIG. 20 is a diagram showing the operation of the switching control portion 54 and the divider. The dividers 51 to 53 output three kinds of dividing clocks, each being a control clock divided with each dividing ratio, respectively. As shown in FIG. 20, the switching control portion 54 selects the switch 55 so as to bring the switch 55 into the state of conduction while counting the control clock up to 9×16 clock. Therefore, the 1/9 dividing clock is output in the meantime. After counting the control clock up to 9×16 clock, the switching control portion 54 brings the switch 56 into the state of conduction while counting the control clock up to 10×16 clock, then while counting the control clock up to 11×16 clock, the switching control portion 54 brings the switch 57 into the state of conduction, and thus repeats the same operation. In this manner, the up/down counter 58 and the dividing counter 59 are supplied with the 1/9 dividing clock, the 1/10 dividing clock, and the 1/11 dividing clock in this order.

Figure 21:
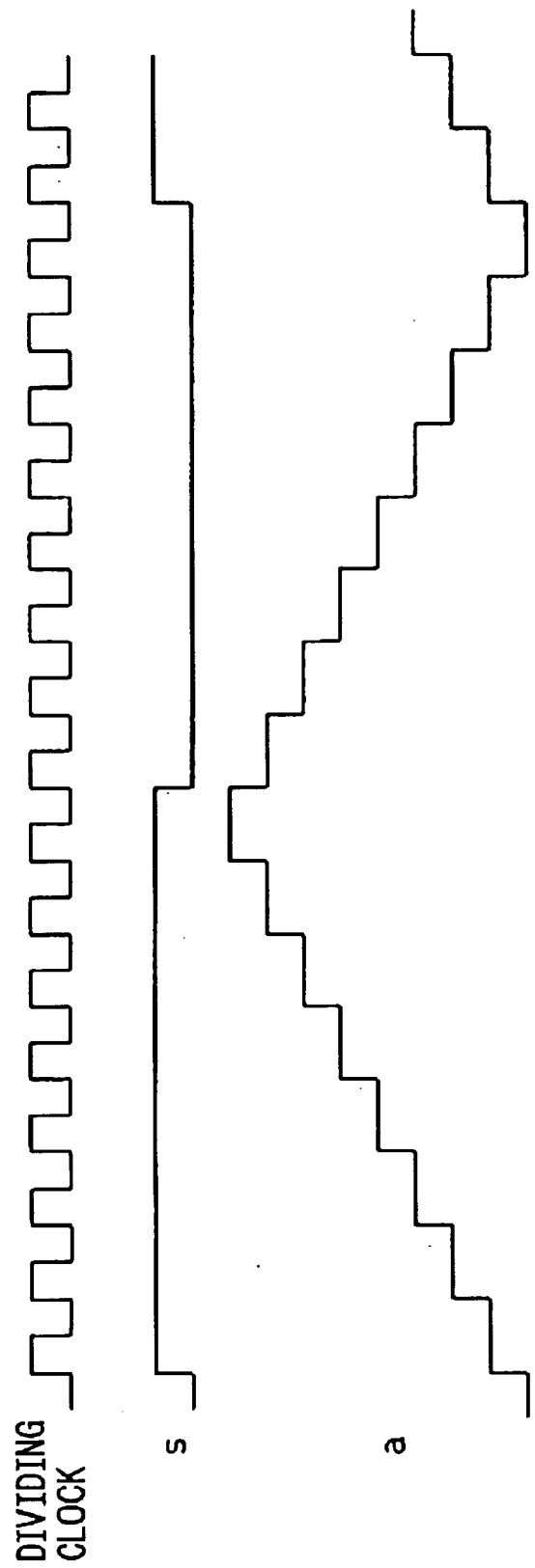
FIG. 21 is a diagram showing the operation of an up/down counter in the control circuit in the third embodiment.

FIG. 21 is a diagram showing the operation of the up/down counter 58 and the dividing counter 59. The dividing counter counts a selected dividing clock and when the count value reaches a predetermined value, the up count operation and the down count operation of the up/down counter 58 are switched, and this operation is repeated. FIG. 21 shows an example in which the up count operation and the down count operation are switched when counted up to eight. When the output code such as shown in FIG. 9 is generated, the operations are switched each time when counted up to 14. The up/down counter 58 counts the selected dividing clock and outputs the count value in an n-bit binary code. As described above, because the period of the dividing clock to be supplied changes, the length of one cycle (period) of the code output to be generated differs accordingly. The code output from the up/down counter 58 is applied to the IDAC 43.

As shown in FIG. 18, the IDAC 43 comprises a current mirror circuit consisting of transistors Tr11 to Tr15, Tr20, and Tr30 to Tr3n. By setting the size of the transistors properly as shown schematically, 90% of a current Iref output from the V-I conversion circuit 42 flows through Tr20, 10% of the Iref flows through Tr3n, $(20 \times 1/2^{n-2})\%$ of the Iref flows through Tr32, $(20 \times 1/2^{n-1})\%$ of the Iref flows through Tr31, and $(20 \times 1/2^{n})\%$ of the Iref flows through Tr30. When Tr4n to Tr40 are brought into the state of conduction by bit data /D0 to /Dn of the output code, a current passing through the corresponding Tr3n to Tr30 flows. Therefore, when all of the Tr4n to Tr40 are brought into the state of no conduction, an amount of current of 90% of the Iref which flows through Tr20 is output, and when all of the Tr4n to Tr40 are brought into the state of conduction, a current which passes through the Tr3n to Tr30 flows in addition to the amount of current of 90% of the Iref which flows through the Tr20, and as a result, an amount of current of about 110% of the Iref is output. In other words, by setting the bit data /D0 to /Dn of the output code to proper values, a proper amount of current of about 90% to 110% of Iref is output as a result.

Therefore, by applying the output code of the up/down counter 58, which changes in such a way as shown in FIG. 21, to the IDAC 43 shown in FIG. 18, it is possible to change the Iref in nine steps in increments of about 2.5% from 90% to about 110%, and at the same time, the period of change changes in three steps. In accordance with this, the ICO 44 repeatedly increases and decreases the frequency (period) in increments and decrements of about 2.5% in a range of ±10%, and generates a clock CK the period of change of which changes. When an output code, which changes in such a way as shown in FIG. 9, is used, a signal which changes in fifteen steps in increments of about 1.4% can be obtained.

Figure 22:
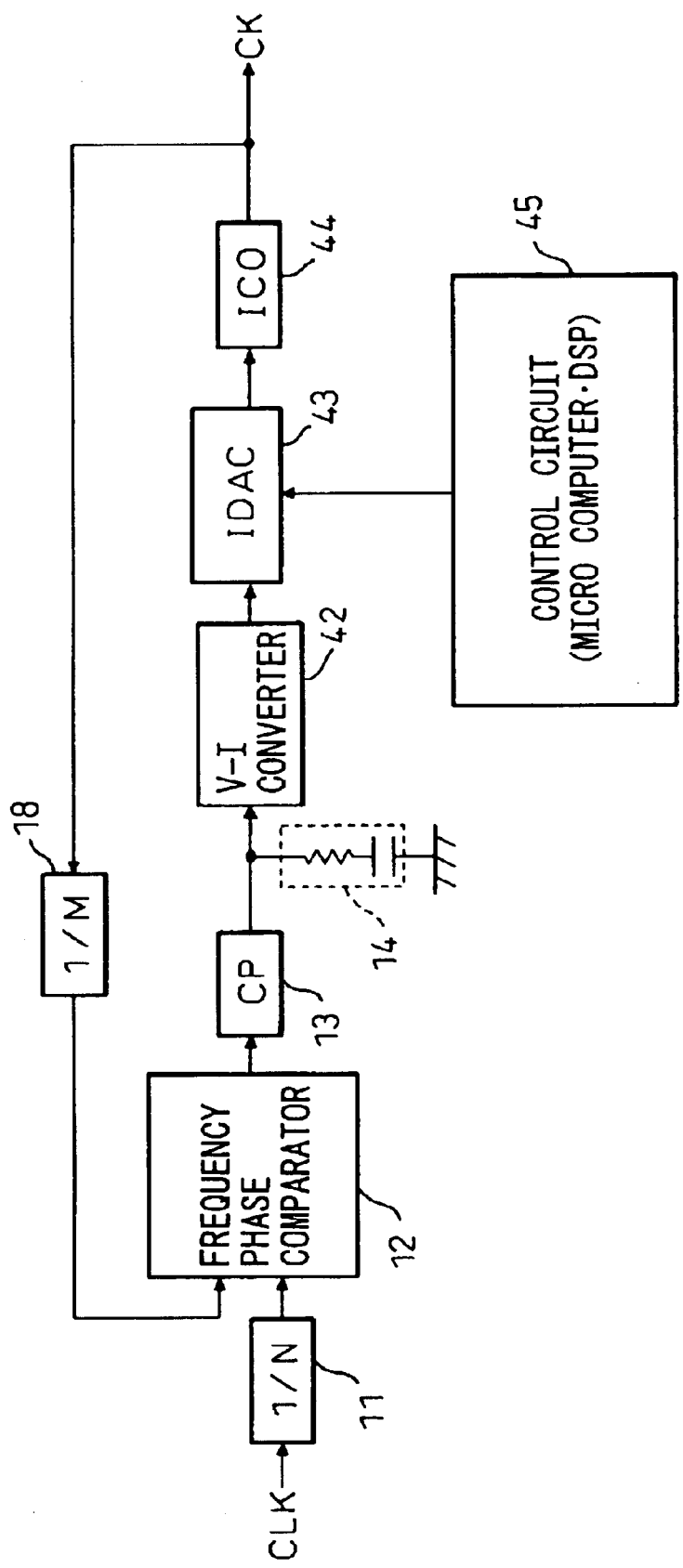
FIG. 22 is a diagram showing the circuit configuration of an SSCG in a fourth embodiment of the present invention.

FIG. 22 is a diagram showing the configuration of the SSCG circuit in the fourth embodiment of the present invention. The SSCG circuit in the fourth embodiment differs from that in the third embodiment in that the control circuit 45 in the third embodiment is composed of a micro computer or a DSP, a code as shown in FIG. 8 is generated, and an IDAC with a low-pass filter as shown in FIG. 23 is used instead of the IDAC.

When a computer system, controlled by programs, such as a microcomputer or a DSP is used, it is possible to easily generate a code as shown in FIG. 8. Moreover, if the computer system has a sufficient capacity of memory and is capable of generating many codes, it is also possible to select a code to be output in accordance with the condition of use. Still moreover, it is also possible to rewrite programs to output a desired code in accordance with the condition of use.

Figure 23:
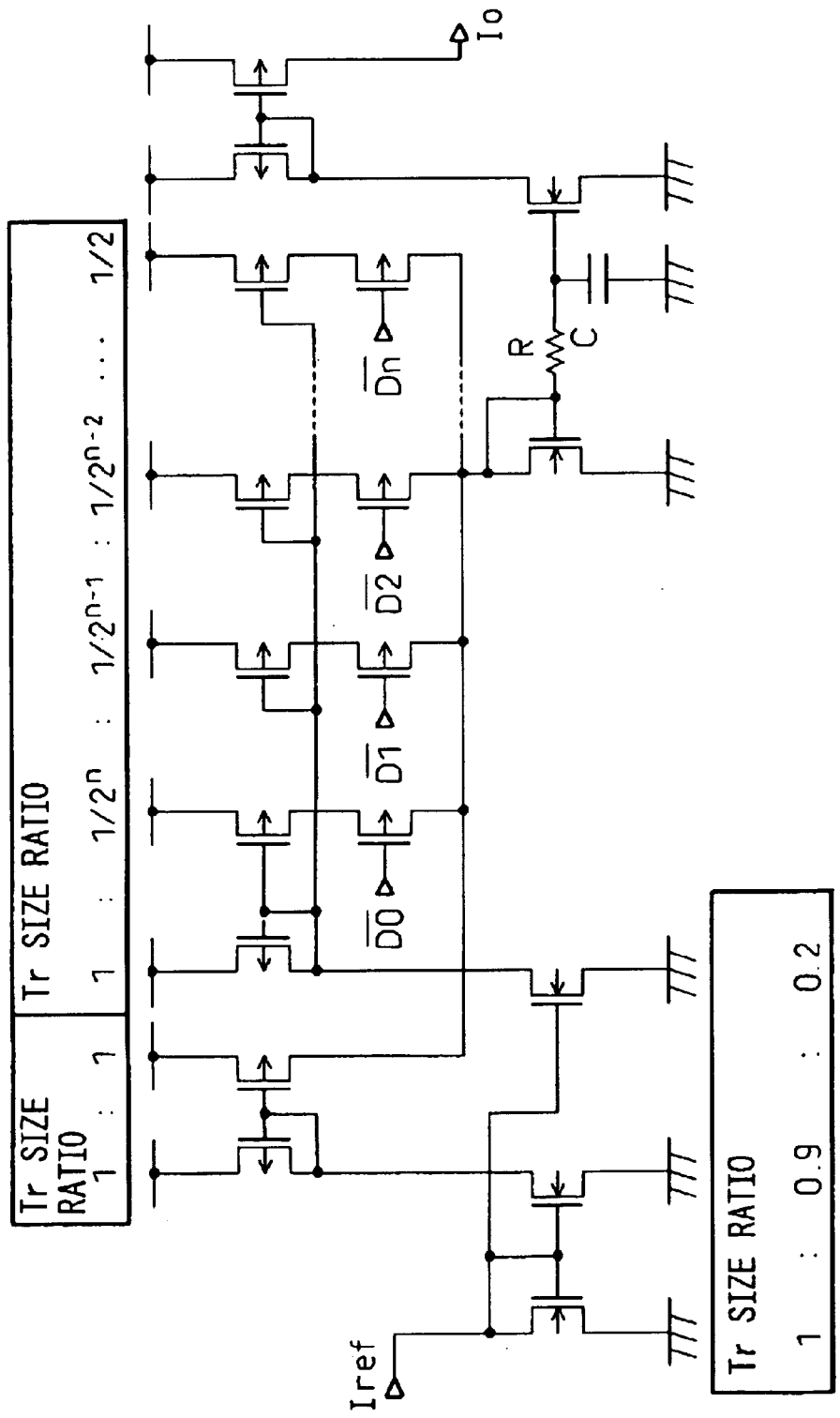
FIG. 23 is a diagram showing the circuit configuration of an IDAC with a low-pass filter.

The IDAC shown in FIG. 23 is a circuit, in which a low-pass filter (LPF) consisting of a resistor R and a capacitor C is provided at the current output portion of the IDAC shown in FIG. 17 and the output thereof is further output from a current mirror circuit. Thanks to this circuit, it is possible to smooth the change in the output current caused by the change in the least significant bit/Dn of the output code and reduce a glitch (noise). If a current signal with a glitch is supplied to the IOC, the IOC outputs a high frequency signal in accordance with the glitch. Because of this, PLL is brought out of the locked state and a problem arises that focusing to the reference frequency cannot be attained, but if an IDAC with LPF is used, such a problem can be avoided.

Figure 5B:
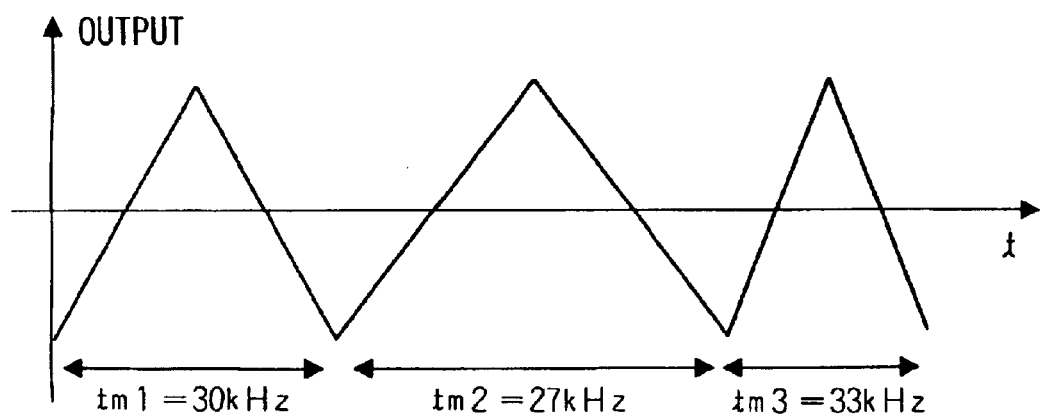
Figure 6B:
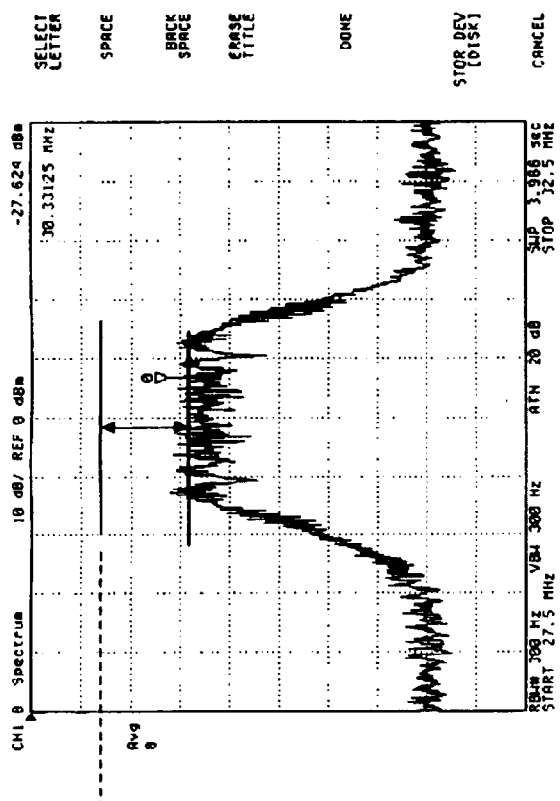
FIG. 6A and FIG. 6B are diagrams showing how the spectrum is improved when the first aspect of the present invention is applied.
Figure 6A:
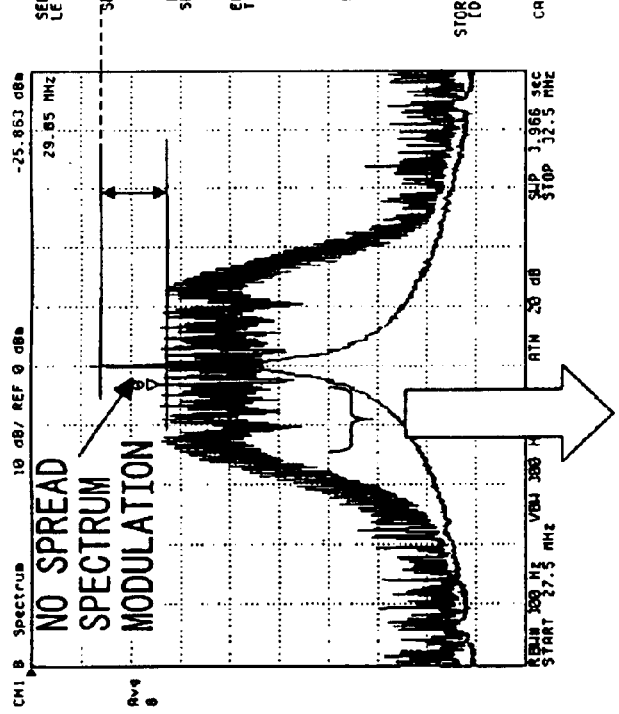

In the first through fourth embodiments, the period of the spread spectrum modulation signal is changed when the value resides at a mean level as shown in FIG. 5A. However, the period of the spread spectrum modulation signal can be changed when the value resides at the maximum or minimum as shown in FIG. 5B. For example, in the circuit constitution shown in FIG. 11, the switches are switched when the analog modulated output becomes the first or second predetermined value, then, the spread spectrum modulation signal shown in FIG. 5B can be obtained. Further, it is apparent that the spread spectrum modulation signal shown in FIG. 5B can be easily obtained in the first, third and fourth embodiments. Further, it is apparent that the spread spectrum modulation signal shown in FIG. 67 can be also obtained in the first, third and fourth embodiments.

Figure 7A:
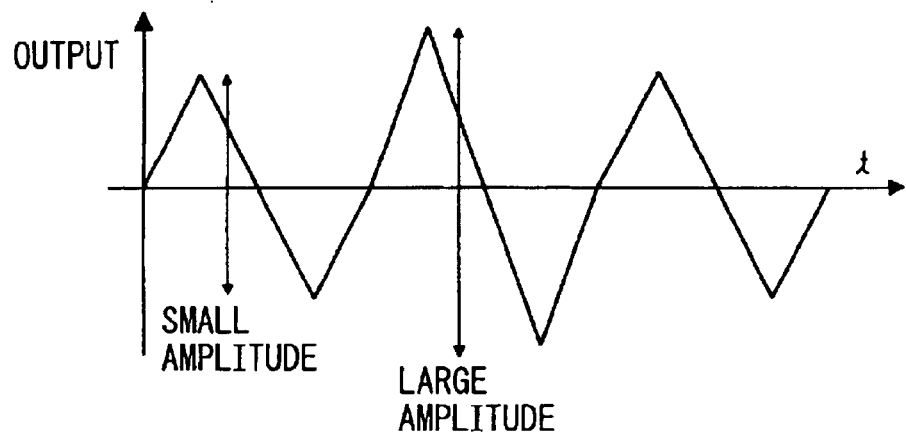
FIGS. 7A to 7D are diagrams illustrating the principle of the second aspect of the present invention and showing an example of the spread spectrum modulation signal of the present invention.
Figure 7B:
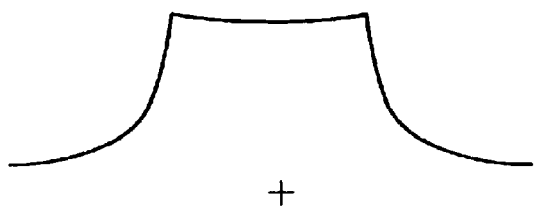
Figure 7C:
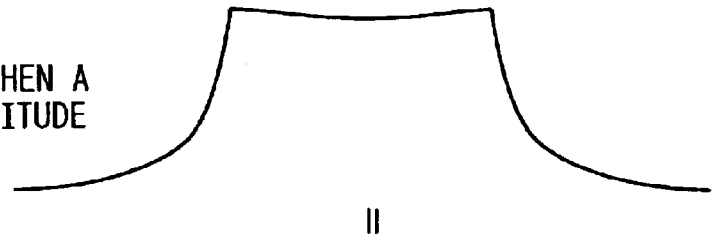
Figure 7D:
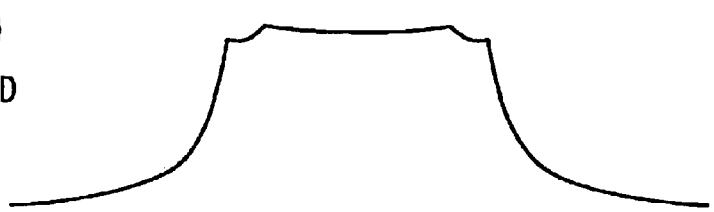

The spread spectrum clock generation (SSCG) circuit, which will be described below, in the fifth embodiment of the present invention has a configuration similar to the SSCG circuit in the first embodiment shown in FIG. 8, but differs from that in the first embodiment in that the amplitude of the spread spectrum modulation signal generated by the modulator 22 changes in order as shown in FIG. 7A.

In the SSCG circuit in the fifth embodiment, the control circuit 21 generates an output code as shown in FIG. 24 and outputs it to the modulator 22. In the first period, the value of this output code increases from the middle value to the first maximum value and decreases to the first minimum value, and then increases again. The period enters the second period when the middle value is reached, and after the value increases from the middle value to the second maximum value, it decreases to the second minimum value, and then increases again. When the middle value is reached, the period enters the first period again, and the same operation is repeated. In this example, the length of one period of the first period is different from that of the second period. If the voltage signal does not change smoothly because of the voltage change width corresponding to the least significant bit of the output code, a low-pass filter is used for smoothing. In this manner, the voltage to be applied to the VCO 17 changes with a small amplitude and the amplitude and the period change for each period. Therefore, the frequency (period) of a clock CK generated by the VCO 17 changes continuously in a small range in each period and the maximum value and the minimum value of the frequency in the period change for each period. Moreover, the period itself changes as a result.

The control circuit 21 can be realized by a computer system, controlled by programs, such as a microcomputer and a DSP, and in such a case, it is possible to change an output code in accordance with the external control.

Figure 25A:
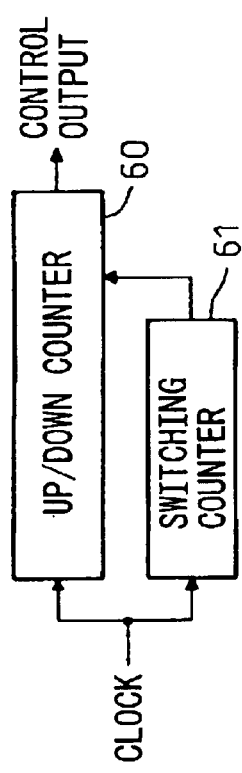
FIG. 25A and FIG. 25B are diagrams showing the configuration and operation for realizing the control circuit in the fifth embodiment by the use of a logic circuit.
Figure 25B:
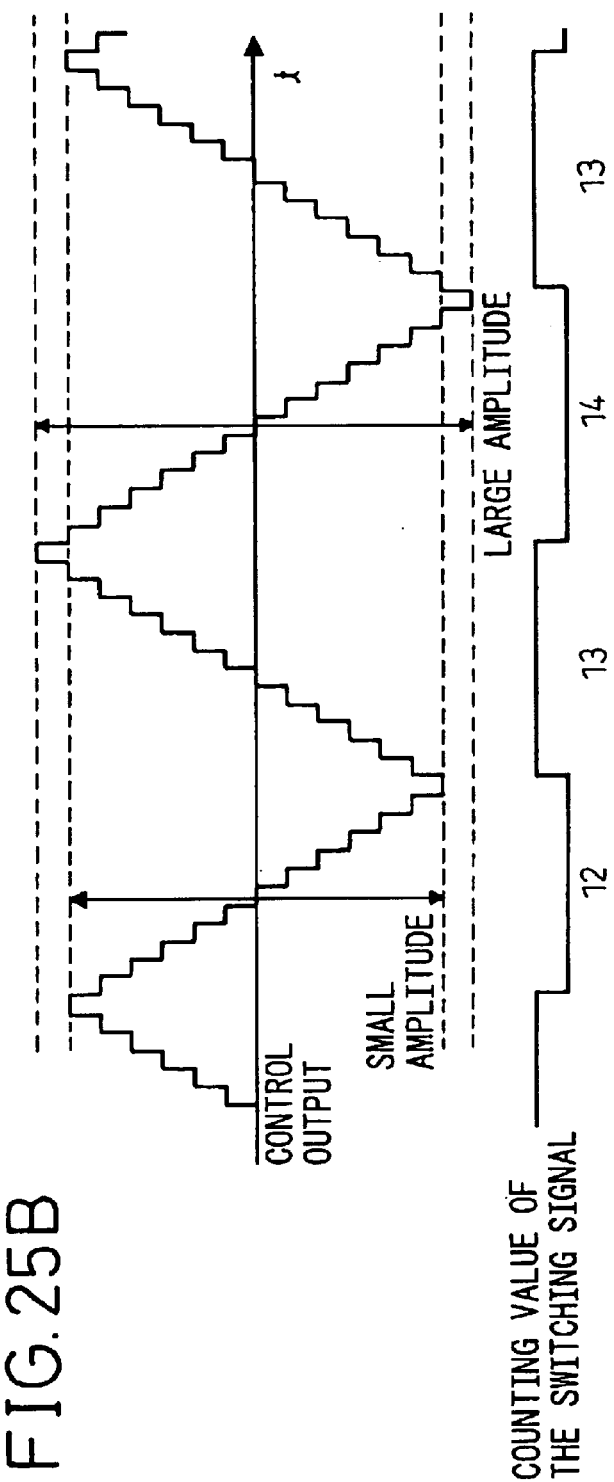

The control circuit 21 can be realized by a digital logic circuit or the like. FIG. 25A and FIG. 25B are diagrams showing the configuration and the operation of the control circuit 21 realized by a digital logic circuit. As shown in FIG. 25A, the control circuit 21 comprises an up/down counter 60 which counts a clock and a switching counter 61 which controls the up/down counter 60. The up/down counter 60 outputs a count value in an n-bit binary code. As shown in FIG. 25B, the switching counter 61 counts a clock and when the count value reaches a predetermined value, the up count operation and the down count operation of the up/down counter 60 are switched and the predetermined value is changed to 13, 14, 13 and 12 in this order, and this operation is repeated afterward. In this manner, an output code which changes in such a way as shown in FIG. 7 is obtained. It is desirable for the minimum value of the count value to be output as a control output to be zero, but this value can be arbitrary and not particularly limited. For example, it is possible to alternately repeat the first period in which the minimum value is zero and the maximum value is 15 and the second period in which the minimum value is one and the maximum value is 14, but the value can be arbitrary and it is also possible to alternately repeat, for example, the first period in which the minimum value is five and the maximum value is 30 and the second period in which the minimum value is seven and the maximum value is 28.

The voltage level output by the modulator 22 in accordance with a code is adjusted with respect to the differential voltage generated at one end of the loop-filter 14 in accordance with the coefficient of change of the spread spectrum modulation.

Figure 26A:
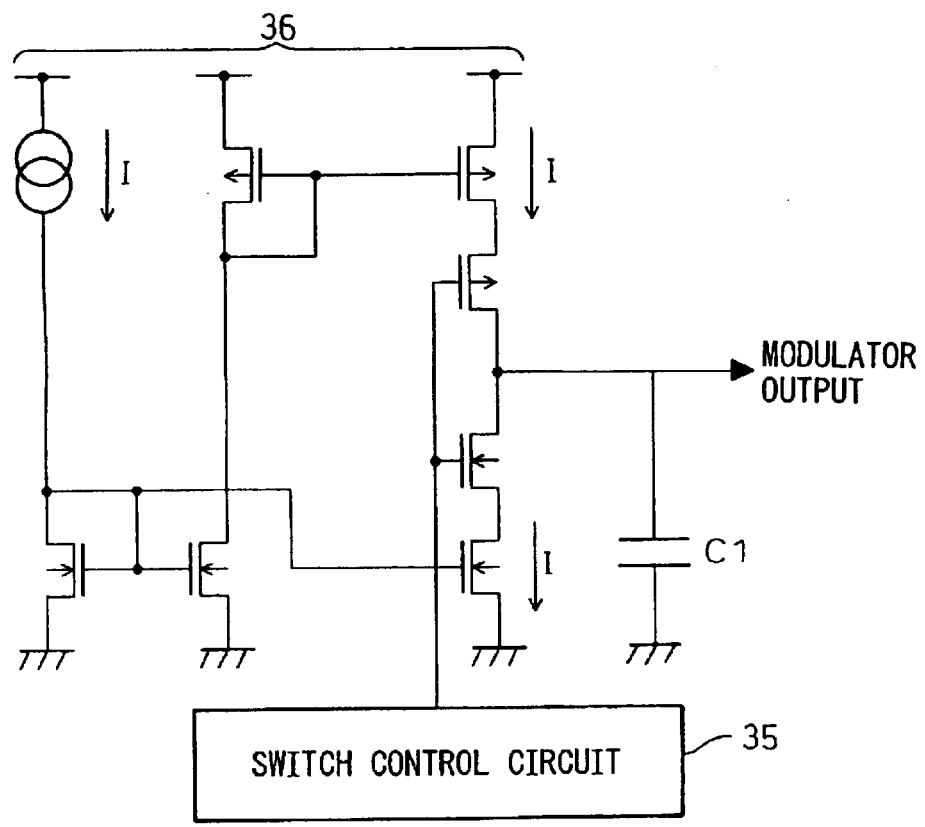
FIG. 26A and FIG. 26B are diagrams showing the configuration and operation of an SSCG in a sixth embodiment of the present invention.
Figure 26B:
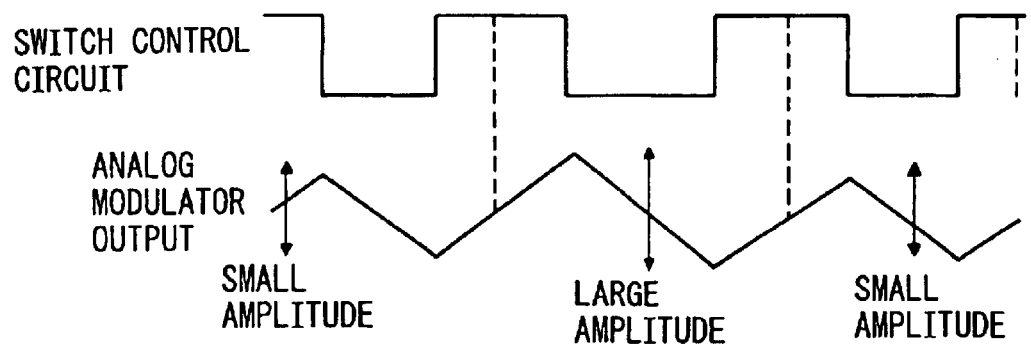

FIG. 26A is a diagram showing the configuration of the analog modulator in the SSCG circuit in the sixth embodiment of the present invention, and FIG. 26B is a diagram showing the operation of the analog modulator. The spread spectrum modulation analog voltage signal is generated by digital processing in the fifth embodiment, but in the sixth embodiment, the spread spectrum modulation analog voltage signal is generated by analog processing.

As shown in FIG. 26A, this circuit is provided with a capacitor element whose capacitance value is C1 and one end of the capacitor element is connected to the ground. The portion denoted by reference number 36 is a current source circuit which supplies (charges) to or extracts (discharges) from the capacitor a current equal to the current I which flows through the constant current circuit by the use of a current mirror circuit, as the analog modulator in FIG. 11, and charging and discharging are switched by the control of a switch control circuit 35. When the current source circuit is brought into the state of charging, the capacitor is charged with the current I and the voltage at the end of the capacitor (analog modulator output voltage) increases. Then, when the current source circuit is brought into the state of discharging, the current I is discharged from the capacitor and the analog modulator output voltage decreases. As the capacitance value and the current value are constant, if the charging time and the discharging time are changed, the maximum voltage and the minimum voltage change accordingly. As shown in FIG. 26B, when the voltage reaches the middle value while it is increasing, if charging is carried out for a charging time t1 which corresponds to ¼ the period, the voltage reaches a maximum voltage VH1. Then, if discharging is carried out for a discharging time 2t1, the voltage reaches a minimum voltage VL1. Next, if charging is carried out for the charging time t1, the voltage reaches the middle voltage. After this, if charging is carried out for a charging time t2, which is shorter than t1, the voltage reaches a maximum voltage VH2, which is smaller than VH1. Then, if discharging is carried out for a charging time 2t2, the voltage reaches a minimum voltage VL2, which is higher than VL1. Finally, if charging is carried out for the charging time t2, the voltage reaches the middle voltage. The same operation is repeated.

In this manner, the spread spectrum voltage signal whose amplitude changes for each period is obtained. In the second embodiment also, both the amplitude and the period of the spread spectrum voltage signal change. In order to generate a spread spectrum voltage signal only the amplitude of which changes and the period of which does not change, a constant current source capable of charging or discharging with different currents is provided in the circuit shown in FIG. 26A and the current to be supplied is switched for each period. In this case, the switch control circuit 35 switches the power supply between charging and discharging in a predetermined period.

Figure 67:
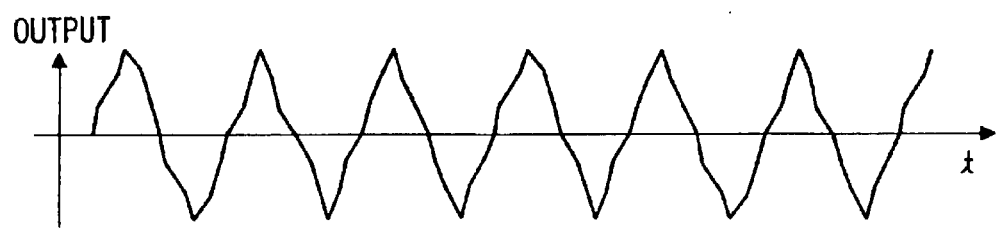
FIG. 67 is a diagram showing an example of a spread spectrum modulation signal of the present invention.

Further, the spread spectrum modulation signal shown in FIG. 67 can be also obtained in the above circuit. In this case, the current to be supplied is switched in each cycle.

Although a case of switching between two amplitudes is shown here, it is also possible to switch among three or more amplitudes.

As described above, the SSCG circuit in the fifth and sixth embodiments has a configuration similar to that in the first and second embodiments, in which the amplitude of the spread spectrum modulation signal changes. It is also possible to change the amplitude of the spread spectrum modulation signal by the use of the SSCG circuit in the third and fourth embodiments. As it is easy for any engineer skilled in this field to understand the configuration and operation in this case, a detailed description will not be given here. It is also possible to change only the amplitude without changing the period if an IDAC having a resolution with a large number of bits is used.

Figure 68:
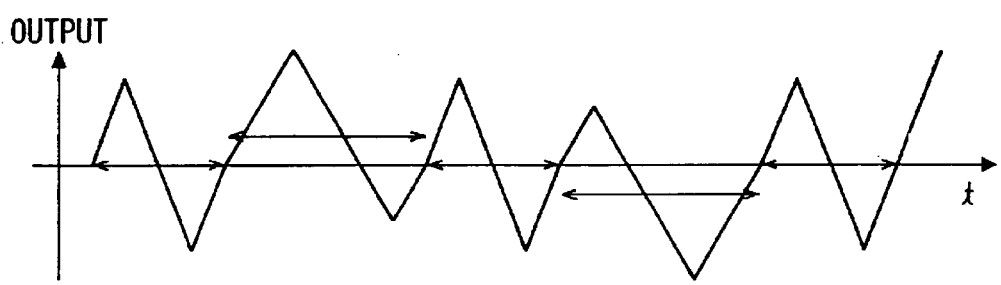
FIG. 68 is a diagram showing an example of a spread spectrum modulation signal of the present invention.
Figure 69:
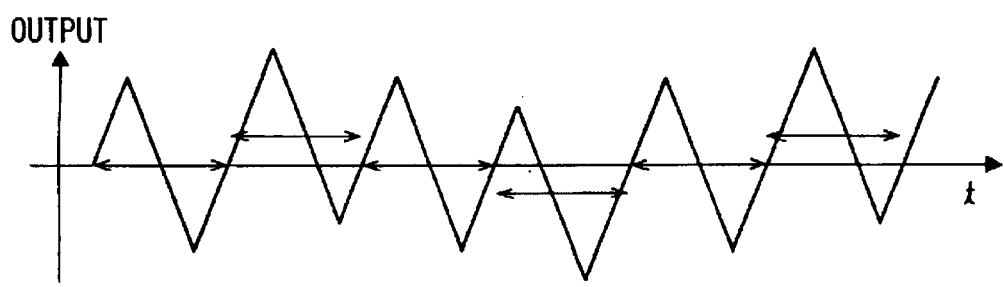
FIG. 69 is a diagram showing an example of a spread spectrum modulation signal of the present invention.

In the fifth and sixth embodiments, the switching of the amplitude is carried out when the signal value crosses the reference level as shown in FIG. 7A. However, it is also possible that a local maximum and/or a local minimum of the value of the spread spectrum modulation signal in each cycle change. For example, in the circuit shown in FIG. 25A, the predetermined values for switching the up and down operations are shifted in one direction (increased or decreased) and the spread spectrum modulation signal shown in FIG. 68 is obtained. In other words, a spread spectrum modulation signal of which mean level in each cycle is shifted can be obtained. Further, a spread spectrum modulation signal in which the local maximum and/or the local minimum of the signal value change can be obtained by changing the switching timing of the circuit shown in FIG. 26A. It is also apparent that such spread spectrum modulation signal can be easily obtained by the digital controlled modulator.

Further, a spread spectrum modulation signal in which both of the local maximum and/or the local minimum of the signal value and the period change can be obtained by combinations of the above-mentioned circuits. It is also apparent that such spread spectrum modulation signal can be easily obtained by the digital controlled modulator.

Figure 27:
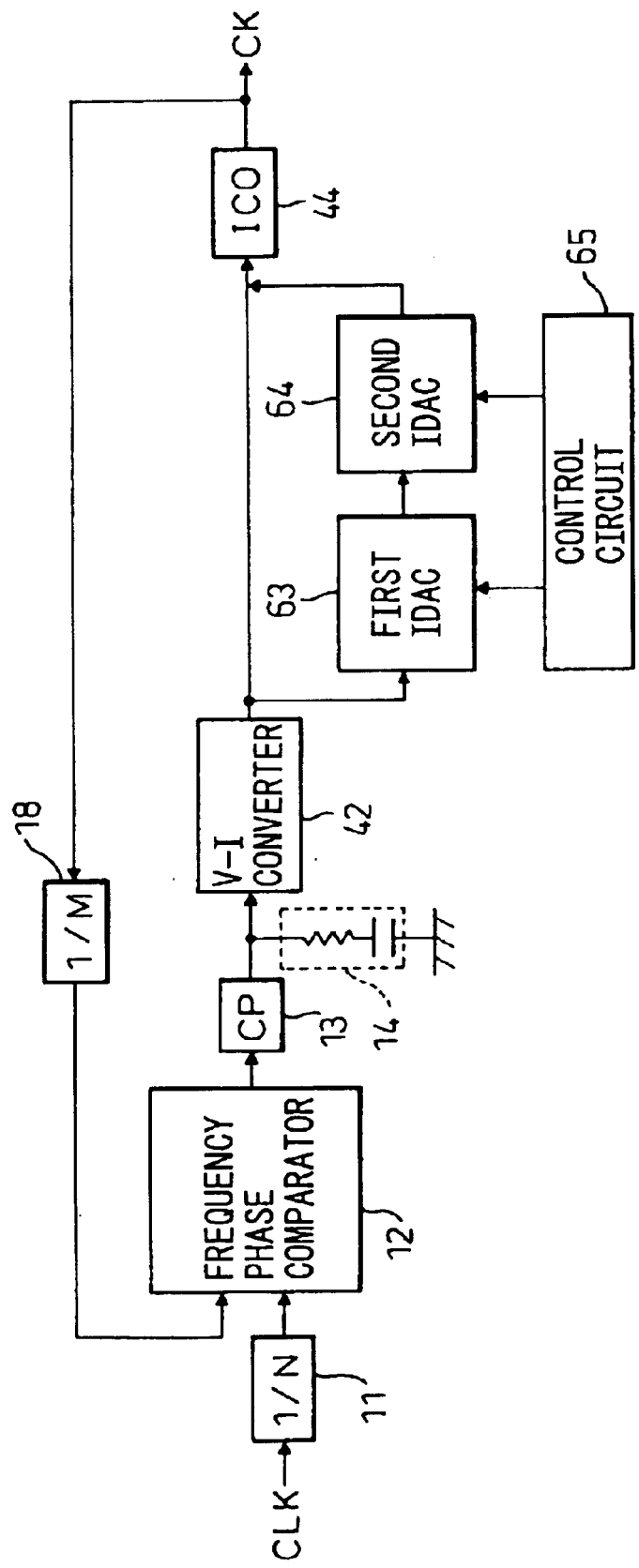
FIG. 27 is a diagram showing the circuit configuration and operation of an analog modulation circuit in a seventh embodiment of the present invention.

FIG. 27 is a diagram showing the configuration of the SSCG circuit in the seventh embodiment of the present invention. In the fifth and sixth embodiments, the period as well as the amplitude of the spread spectrum modulation signal is changed. Although it is also possible to change only the amplitude without changing the period by the use of the above-mentioned IDAC with high resolution, in the seventh embodiment, only the amplitude is changed without changing the period by the use of another method.

As shown in FIG. 27, in the SSCG in the seventh embodiment, when the amplitude is changed by the use of the SSCG circuit in the fourth embodiment, a first IDAC 63, a second IDAC 64 and a control circuit for controlling these IDACs are provided and a signal, which has branched off from the output of the V-I conversion circuit 42 and gone through the spread spectrum modulation, is added to the output of the original V-I conversion circuit 42 and applied to the ICO 44.

Figure 28:
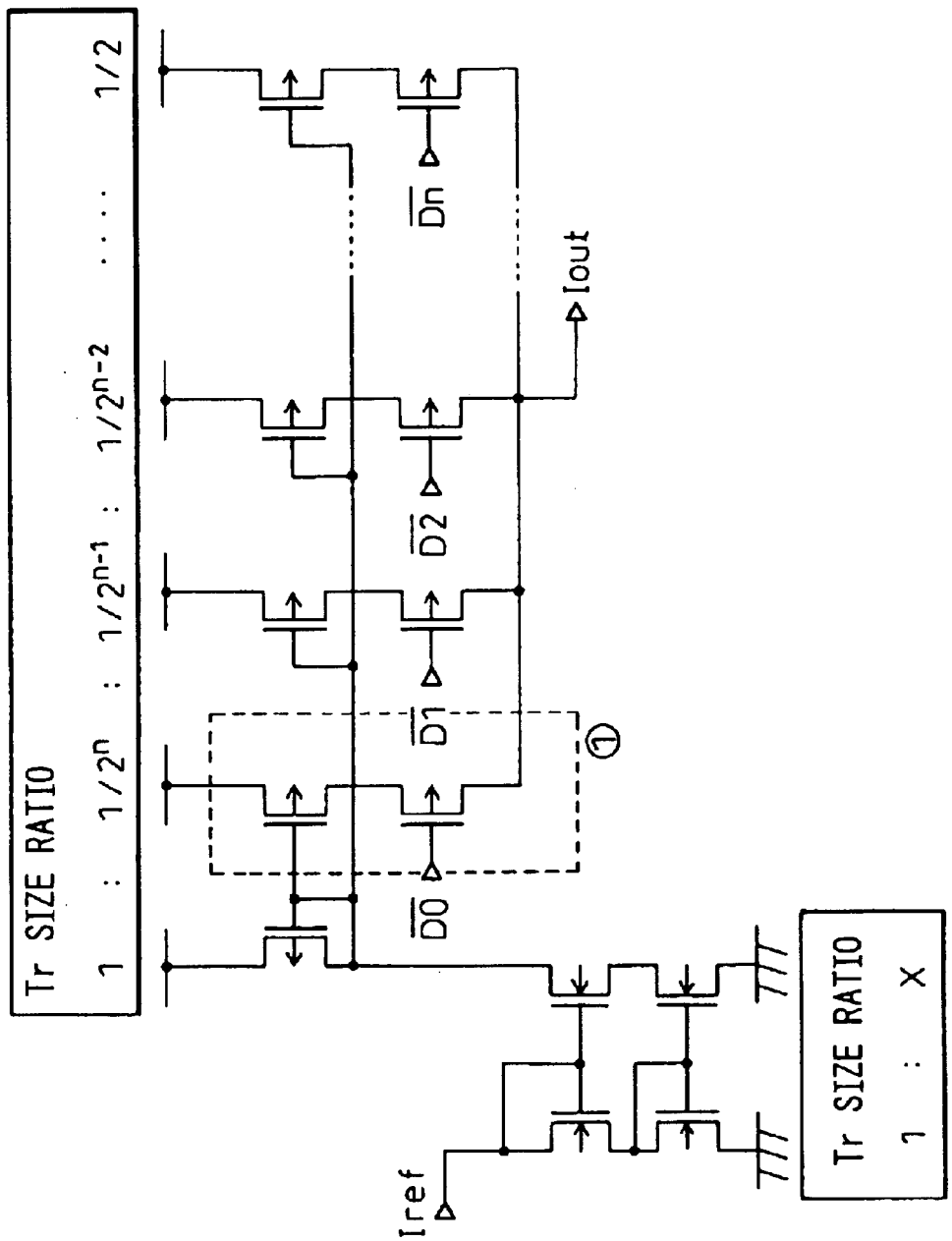
FIG. 28 is a diagram showing the circuit configuration of a first IDAC in the seventh embodiment.
Figure 29:
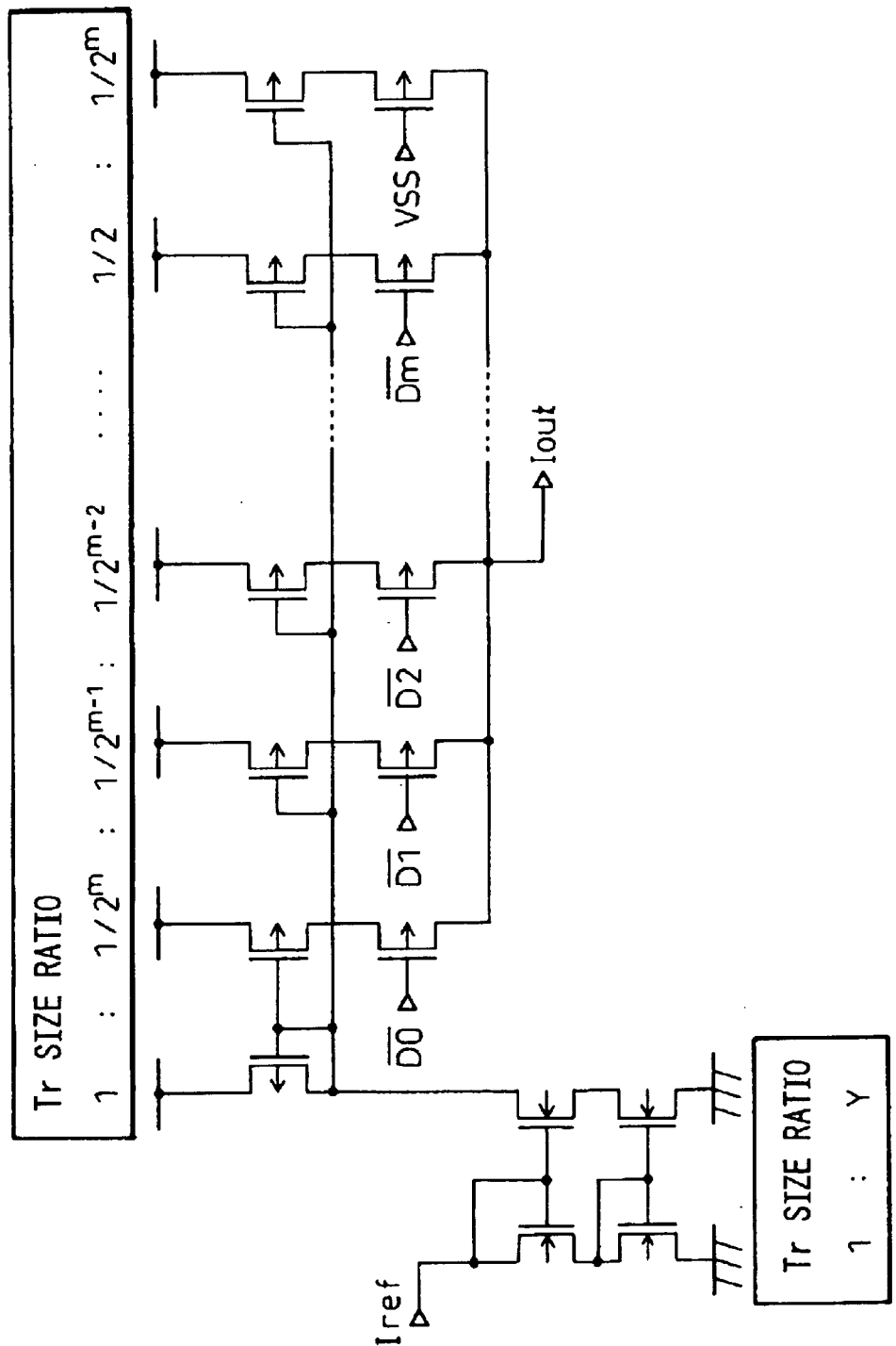
FIG. 29 is a diagram showing the circuit configuration of a second IDAC in the seventh embodiment.

FIG. 28 is a diagram showing the configuration of the first IDAC 63, and FIG. 29 is a diagram showing the configuration of the second IDAC 64. The first IDAC 63 is modified from the IDAC shown in FIG. 18 by eliminating Tr12, Tr14 and Tr20 and setting the Tr size ratio of Tr13 to X, and the current input Iref can be controlled in a range from zero to Iref $(1-1/2^n)/X$ with n bits. Similarly, the second IDAC 64 can control the current input Iref in a range from Iref/$(2^m Y)$ to Iref/Y with m bits. As a result, it is possible to carry out amplification with an arbitrary amplification factor in this range by setting Y and an m-bit code properly.

In the seventh embodiment, in accordance with the control code output from the control circuit 65, the first IDAC 63 carries out the spread spectrum modulation on the current of 1/X Iref with a fixed amplitude and period as conventionally. The second IDAC 64 carries out amplification with a fixed amplification factor during one period of the spread spectrum modulation and changes the amplification factor when the period changes. In this manner, a spread spectrum modulation signal, the period of which is constant and only the amplitude of which changes for each period, is obtained. This spread spectrum modulation signal is added to Iref from the V-I conversion circuit 42 (this is done only by connecting a signal line) and applied to the ICO 44.

It is also possible to reverse the arrangement of the first IDAC 63 and the second IDAC 64, and first carry out amplification by changing the amplification factor for each period and then carry out the spread spectrum modulation on the amplified current signal.

As described above, in the SSCG circuit in the first to seventh embodiments, it is possible to realize a spread spectrum clock generation circuit capable of an excellent spread spectrum modulation with a simple configuration.

The SSCG circuit using the above-mentioned IDAC is characterized in that the configuration of the addition circuit or the like is simple, the change of the oscillation frequency can be controlled in a digital manner, and the control is precise and easy. The IDAC shown in FIG. 18 can control the amount of current to be output by dividing about 20% of the range of change into n bits. In other words, the minimum resolution is $20/2^n$%. For example, when n=9, $2^9=512$ and the resolution is 0.04%, which is obtained by dividing 20% into 500 steps, and the output current can be controlled with a 0.04% pitch from 80% to 100%.

Generally, the SSCG circuit is used in a form of a chip or a chip into which other circuits are integrated together. It is necessary for the SSCG circuit which carries out the spread spectrum modulation to change the amplitude of the spread spectrum modulation in accordance with the purpose of its use. For example, when the electromagnetic wave radiation is more important than the change of period, the amplitude of the spread spectrum modulation need to be made larger and when the change of period is required to be small, the amplitude of the spread spectrum modulation needs to be made smaller. Therefore, it is made possible to arbitrarily set the output code which the control circuit outputs in order to increase the flexibility of the SSCG circuit chip and deal with various purposes.

Figure 30A:
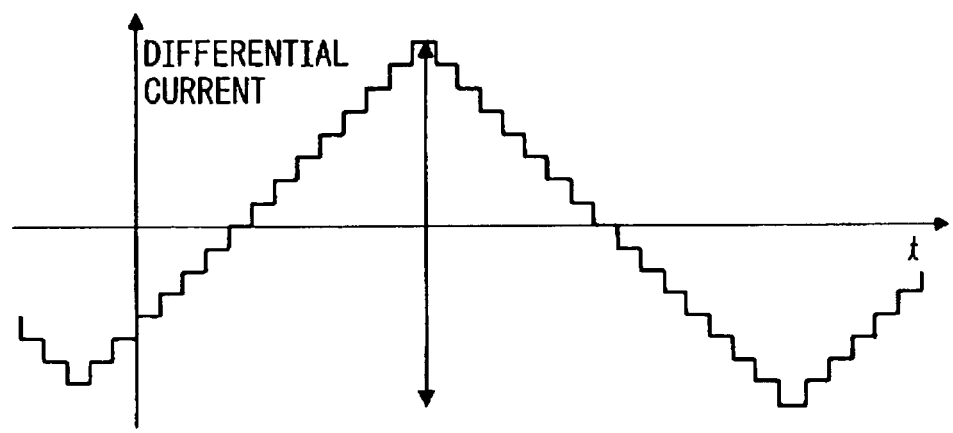
FIG. 30A to FIG. 30C are diagrams illustrating the problem when the amplitude is changed by the use of the IDAC.
Figure 30B:
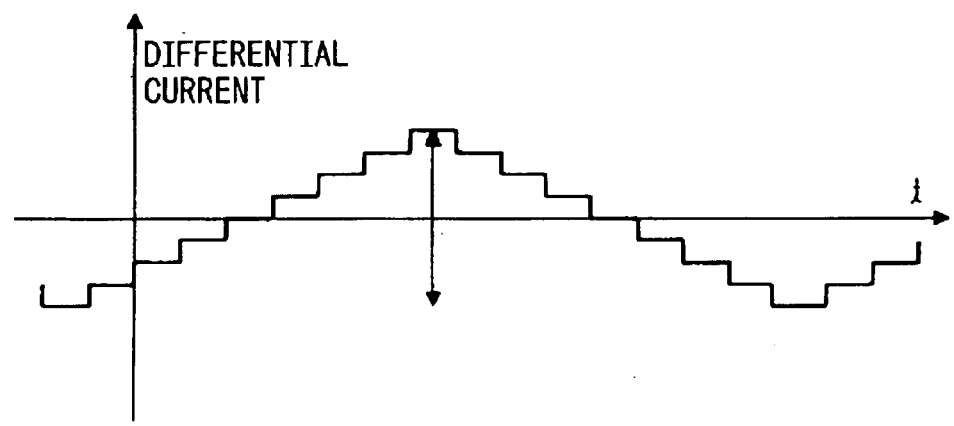
Figure 30C:
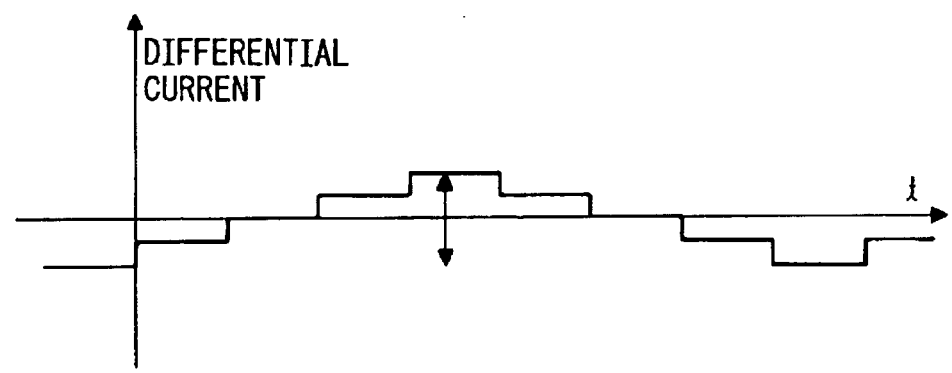

Even though it is made possible to arbitrarily set an output code to be applied to an IDAC, the configuration of the IDAC itself is fixed in a chip and the range in which the input current Iref can be changed and the minimum step (resolution) for change are fixed. FIG. 30A to FIG. 30C show the change of an output code when the amplitude is changed, and in accordance with the change of the output code, the current changes, and the differential current which changes in such a way as shown schematically, can be obtained. As shown in FIG. 30A, when the amplitude is large, the amplitude is large compared with the minimum step and the current changes in a relatively smooth manner. In contrast to this, when the amplitude is halved, the change becomes less smooth as shown in FIG. 30B than the case shown in FIG. 30A. If the amplitude is further halved, that is, when the amplitude is ¼ the original amplitude, the change of the differential current signal becomes still less smooth as shown in FIG. 30C. As the change of the differential current signal becomes less smooth, the high-frequency component of the current to be applied to the ICO increases and the operation of PLL is adversely affected.

In order to obtain a differential current signal which changes in a sufficiently smooth way even when the amplitude is made smaller, it is necessary to increase the number of bits of an output code by increasing the number of transistors. For example, a nine-bit output code is necessary for the ability to adjust an amplitude with five bits, that is, the ability to adjust the amplitude in the range from 100% to 3%, and for the resolution of four bits for the minimum amplitude, that is, the resolution adjustable in 15 steps. In the circuit configuration shown in FIG. 18, when n=9, it is necessary to make the size of the transistor with the maximum size $2^8=256$ times the size of that with the minimum size, and to make the chip area $2^9=512$ times the area of the transistor with the minimum size. Therefore, the size of Tr3n and Tr4n is 256 times the size of Tr30 and Tr40. As the size of the transistor with the minimum size is determined by the manufacturing process, a problem arises that the size of the transistor with the maximum size becomes very large and the area required for the size also becomes large.

The transistor train with the circuit size ratio shown in FIG. 18 is realized by forming a plurality of transistors with minimum size in parallel and changing the number of transistors with minimum size in powers of two, that is, the minimum size transistor is formed by one of the transistors with minimum size, the second smallest size transistor is formed by two of the transistors with minimum size connected in parallel, the third smallest size transistor is formed by four of the transistors with minimum size connected in parallel, and so on. In this case, if n=9, the maximum sized transistor is formed by connecting in parallel 256 of the transistors with minimum size. Therefore, in order to realize the set of Tr30 and Tr40 from the set of Tr3 and Tr4n, 512 sets of Tr30 and Tr40 are necessary.

Either way, the size of transistor increases at a rate of powers of two when the number of bits of an output code is increased, therefore, a problem arises that the circuit scale and the cost increase.

It is possible for the spread spectrum clock generation (SSCG) circuit to be described below according to the third aspect of the present invention to ensure a wide amplitude adjustable range and a sufficient resolution even for the minimum amplitude without increasing the circuit scale so much.

FIG. 31A and FIG. 31B show the configuration based on the principle of the SSCG circuit according to the third aspect of the present invention.

As shown in FIG. 31A, the spread spectrum clock generation circuit of the present invention is provided with a spread spectrum modulation circuit 71 and an amplifying circuit 72, and after going through the spread spectrum modulation and the amplitude adjustment separately, the differential current signal is added to the original differential current signal. In concrete terms, the spread spectrum modulation circuit 71 and the amplifying circuit 72 are cascaded, and after the differential current signal output from the voltage-current (V-I) conversion circuit 42 is modulated in the spread spectrum modulation circuit 71, the spread spectrum modulation signal is amplified and the amplitude is adjusted in the amplifying circuit 72, then the signal the amplitude of which is adjusted is added to the original differential current signal and applied to the ICO 44.

As shown in FIG. 31A and FIG. 31B, the order of the spread spectrum modulation circuit 71 and the amplifying circuit 72 can be reversed.

Figure 32A:
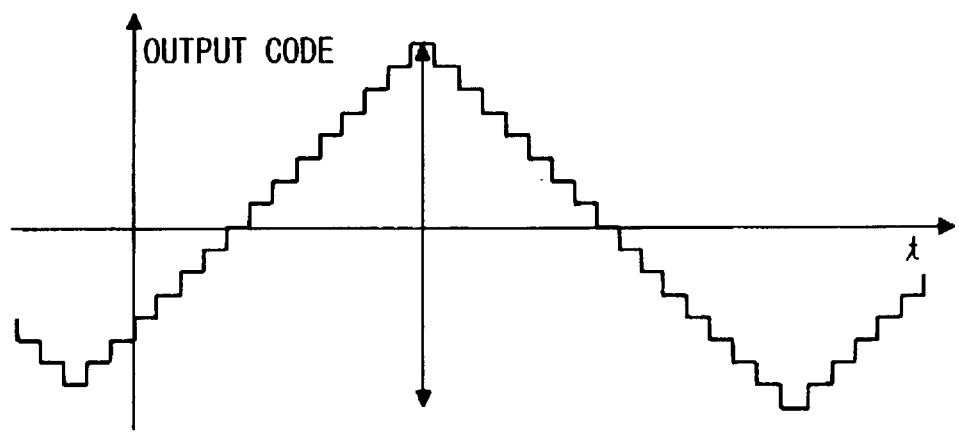
FIG. 32A and FIG. 32B are diagrams illustrating the principle of the third aspect of the present invention.
Figure 32B:
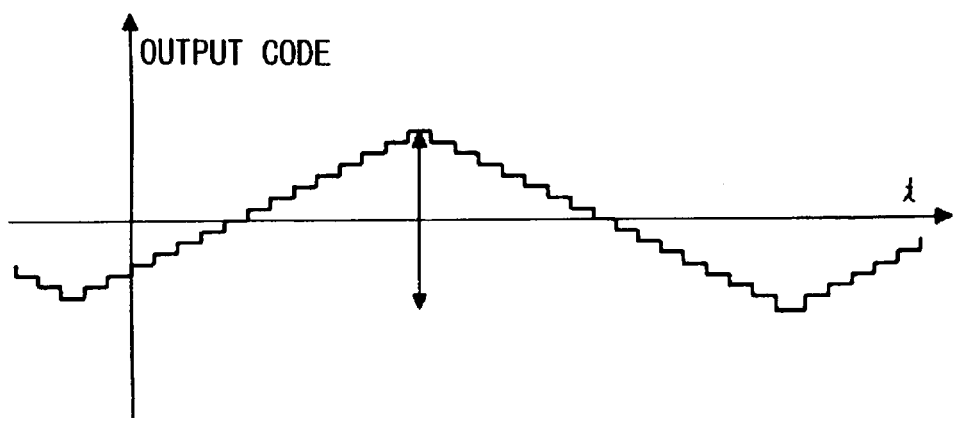

FIG. 32A and FIG. 32B are diagrams illustrating the principle of the third aspect of the present invention: FIG. 32A shows the modulated current signal after a pattern modulation with n-bit is carried out on a differential current signal with amplitude A in the spread spectrum modulation circuit 71; and FIG. 32B shows the signal shown in FIG. 32A the amplitude of which has been amplified (attenuated) by a factor of k/m. Even if the amplitude is amplified by a factor of k/m, the resolution (number of steps) does not change.

Figure 3:
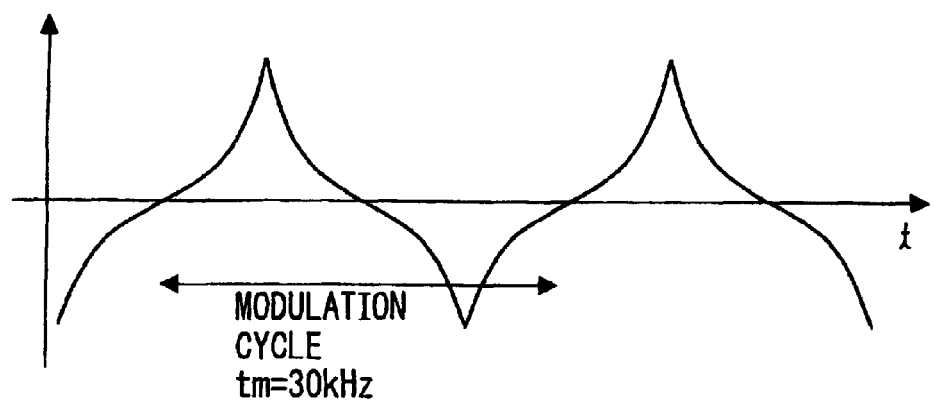
FIG. 3 is a diagram showing another example of a modulator output (spread spectrum modulation signal) in a conventional case.
Figure 4:
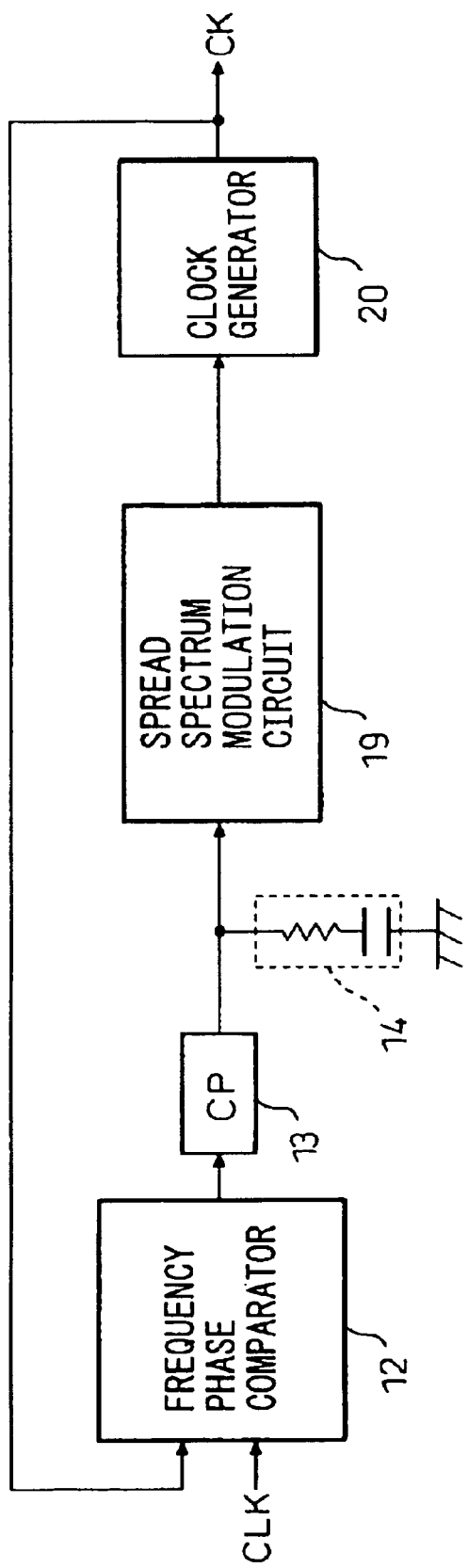
FIG. 4 is a diagram showing a configuration based on the principle in first and second aspects.

In the SSCG circuit of the third aspect of the present invention, as the pattern modulation and the amplitude adjustment are carried out independently, a modulated current with a constant resolution independent of the amplitude adjustment is output. As described above, in order to realize the 5-bit amplitude adjustment and the 4-bit resolution for the minimum amplitude in the conventional configuration in FIG. 3, an area $2^9$=512 times the size of the set of the minimum sized transistors Tr30 and Tr40 is required to obtain Tr3$n$ from Tr30, and Tr4$n$ from Tr40 when n=9. In contrast to this, in the spread spectrum clock generation circuit of the present invention, only an area $2^5+2^4$=48 times the size is required, therefore, the circuit scale can be reduced.

If the SSCG circuit in the seventh embodiment shown in FIG. 27 is compared with the SSCG circuit in the third aspect shown in FIG. 31A, it will be found that both have the same configuration. In other words, the SSCG circuit in the seventh embodiment realizes the third aspect.

As described above, the IDAC also operates as an amplifying circuit, therefore, the spread spectrum modulation circuit 71 and the amplifying circuit 72 can be realized by the use of the current digital-to-analog conversion circuit (IDAC) shown in FIG. 18.

FIG. 33 is a diagram showing the configuration of the spread spectrum clock generation (SSCG) circuit in the eighth embodiment of the present invention. As shown schematically, the SSCG circuit in the eighth embodiment has a configuration similar to that of the SSCG circuit in the seventh embodiment, a pattern IDAC 73 has a configuration similar to that of the first IDAC 63 shown in FIG. 28, and a level IDAC 74 has a configuration similar to that of the second IDAC 64 shown in FIG. 29.

As shown in FIG. 33, in the SSCG circuit in the eighth embodiment, the differential current signal, which the V-I converter 42 in the current oscillation circuit 41 outputs, is applied to the ICO 44 and at the same time input to the pattern IDAC 73. The pattern IDAC 73 carries out the spread spectrum modulation on the differential current signal in accordance with the output code output from a pattern control circuit 75 and generates a spread spectrum modulation signal. The level IDAC 74 amplifies (attenuates) the spread spectrum modulation signal in accordance with the output code output from a level control circuit 76 and adjusts the amplitude.

The output code output from the level control circuit 76 is adjusted by the outside in accordance with the purpose of use and has a constant value.

The pattern control circuit 75 outputs a spread spectrum modulation code.

Figure 34A:
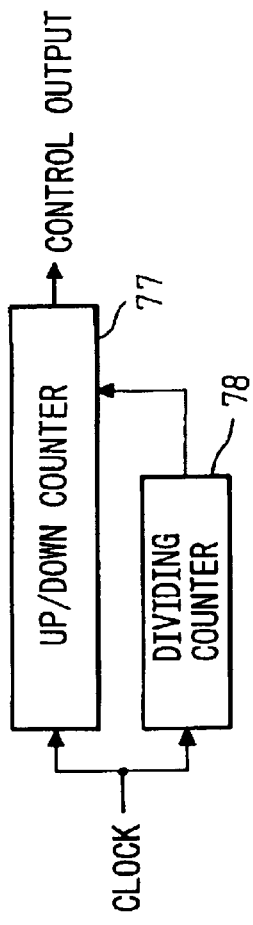
FIG. 34A and FIG. 34B are diagrams showing the configuration and operation for realizing a pattern control circuit in the eighth embodiment by the use of a logic circuit.
Figure 34B:
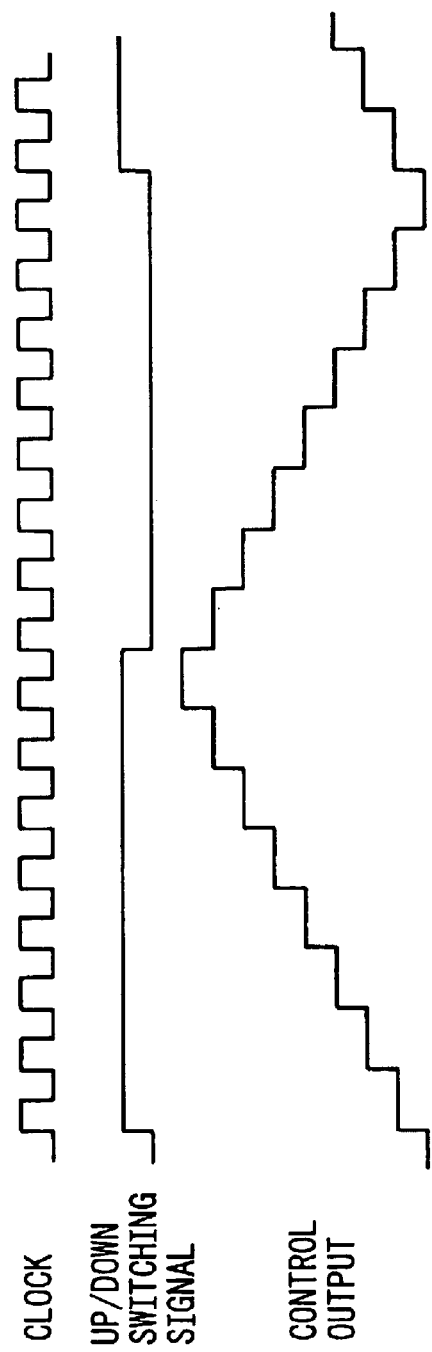

FIG. 34A and FIG. 34B are diagrams showing the configuration and operation of the pattern control circuit 33 realized by the use of a digital logic circuit. As shown in FIG. 34A, the pattern control circuit 75 comprises an up/down counter 77 for counting a clock and a dividing counter 78 for controlling the up/down counter 77. The up/down counter 77 outputs a count value in an n-bit binary code. As shown in FIG. 34B, the dividing counter 78 counts a clock and when the count value reaches a predetermined value, the up count operation and the down count operation of the up/down counter are switched. In this manner, an output code which changes in such a way as shown in FIG. 34B is obtained. Here, it is desirable for the count value to change between the maximum value and the minimum value specified by the number of bits.

Figure 35:
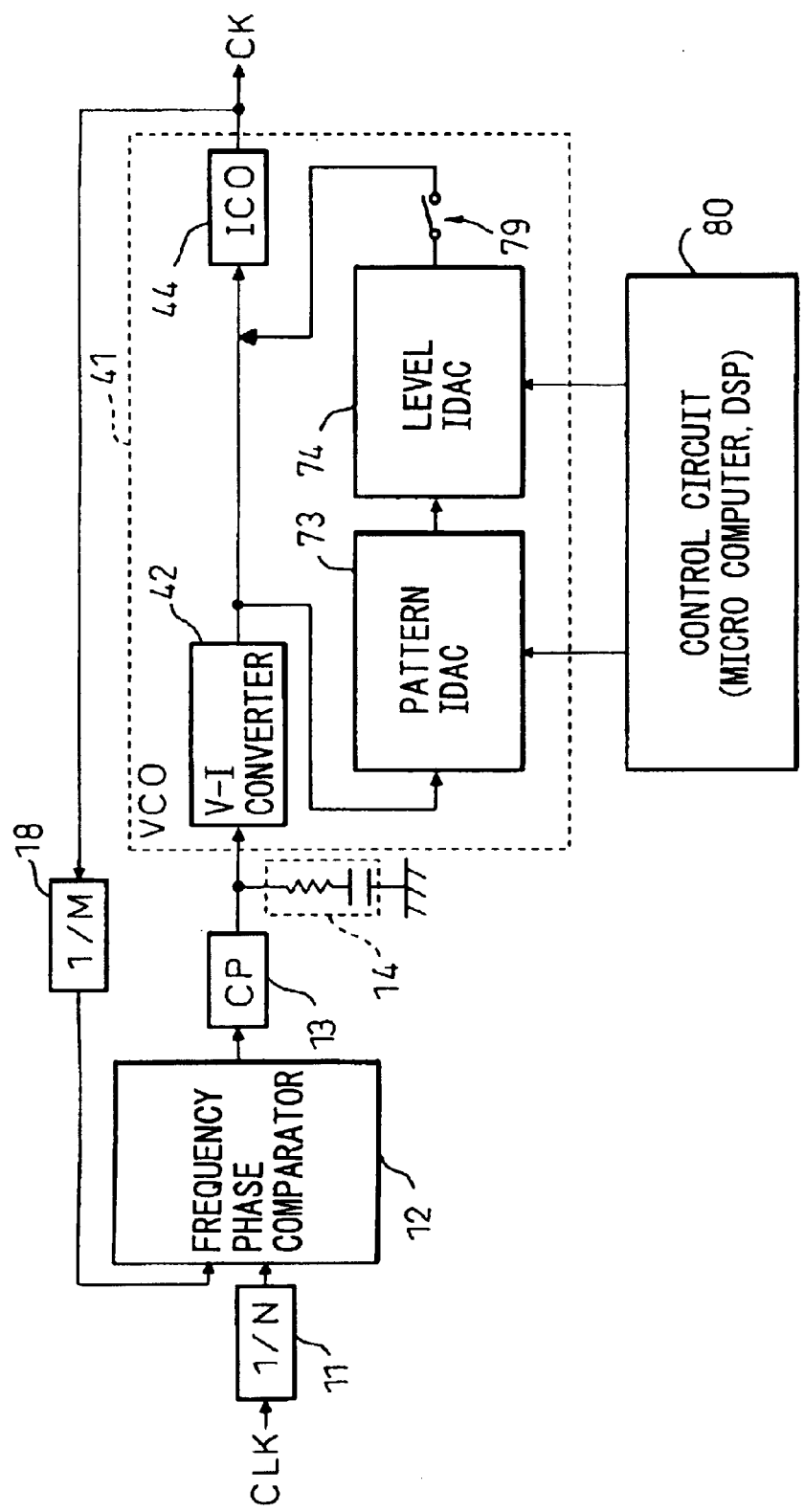
FIG. 35 is a diagram showing the configuration of an SSCG in a ninth embodiment of the present invention.

FIG. 35 is a diagram showing the configuration of the SSCG circuit in the ninth embodiment of the present invention. Although the pattern control circuit 75 and the level control circuit 76 are realized by the use of a logic circuit in the eighth embodiment, these are realized by the use of a computer system such as a microcomputer and a DSP in the ninth embodiment. Other parts are the same as those in the eighth embodiment.

As described above, according to the eighth and ninth embodiments, a spread spectrum clock generation circuit, which ensures a wide amplitude adjustable range and a sufficient resolution for the minimum amplitude, can be realized with a small circuit scale and a spread spectrum clock generation circuit having a high flexibility can be obtained at a low cost.

Figure 36A:
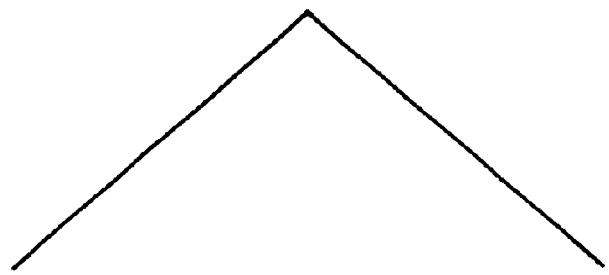
FIG. 36A to FIG. 36C are diagrams showing examples of a modulated waveform when the IDAC is used.
Figure 36B:
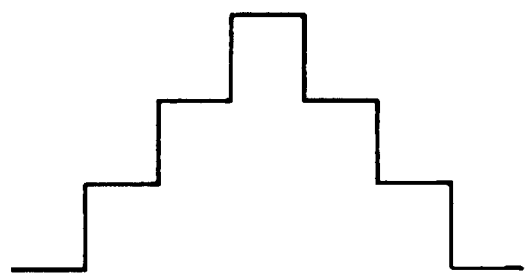
Figure 36C:
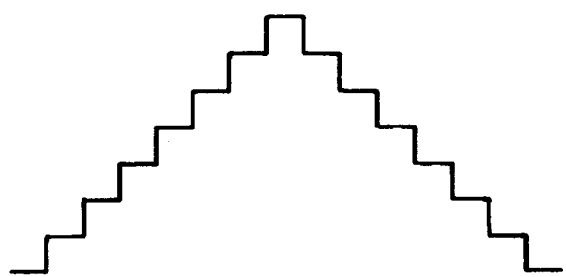

In the SSCG circuit using the IDAC described above, it is general to change a current to be input to the ICO 44 so as to have a triangular wave shape as shown in FIG. 36A. In the case of an IDAC with 2-bit configuration, a current is changed in only four steps as shown in FIG. 36B. In the case of an IDAC with 3-bit configuration, a current is changed in only eight steps as shown in FIG. 36C. As described above, if the number of bits of an IDAC is small, the step width with which a current changes becomes wider as shown in FIG. 36B and FIG. 36C, the high frequency component in the current to be applied to the ICO increases, and a problem arises that the PLL operation is adversely affected and at the same time the electromagnetic radiation is not reduced sufficiently.

In order to make smooth the change of the current to be input to the ICO and reduce the electromagnetic radiation sufficiently in the IDAC with this configuration, it is necessary to increase the number of bits of the IDAC. For example, the IDAC has a 5-bit configuration, in which a current is changed into 32 steps, but this is still insufficient and it is necessary to further increase the number of bits of the IDAC 17. However, if the number of bits of the IDAC is increased, the size of the IDAC and the circuit scale of the control circuit become larger accordingly, and a problem arises that the cost is raised.

In the spread spectrum clock generation (SSCG) circuit in the fourth aspect of the present invention, it is possible to further reduce the electromagnetic radiation with a simple configuration.

Figure 37:
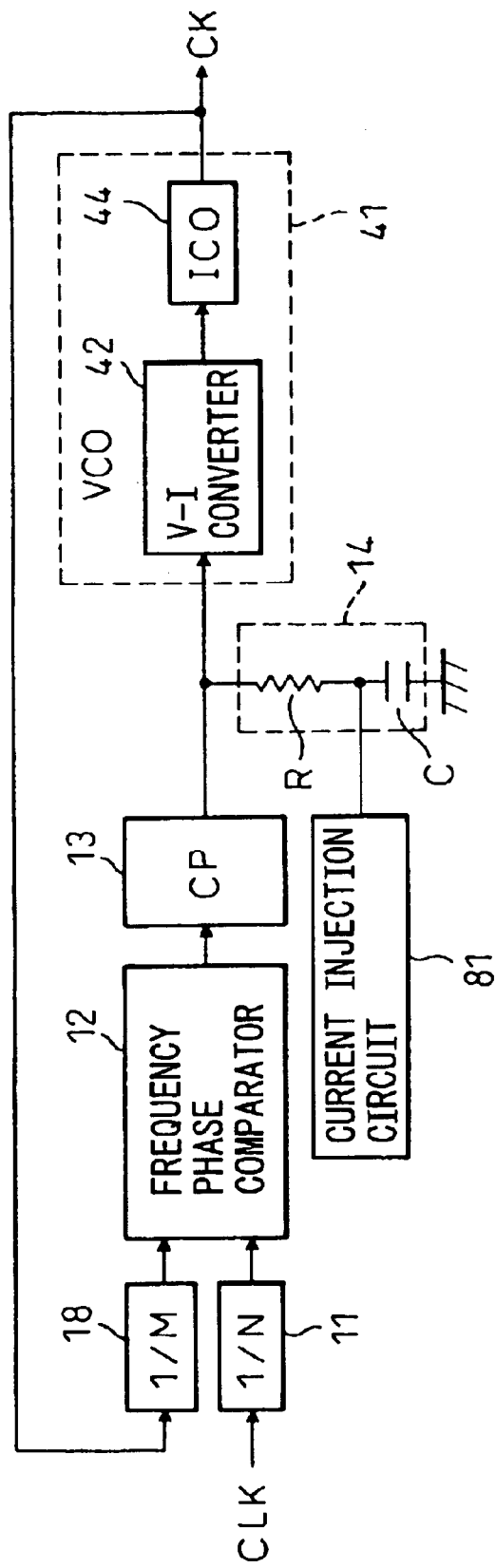
FIG. 37 is a diagram showing the basic configuration of a spread spectrum clock generation (SSCG) according to a fourth aspect of the present invention.

FIG. 37 is a diagram showing the basic configuration of the SSCG circuit in the fourth aspect of the present invention.

As shown in FIG. 37, in the SSCG circuit in the fourth aspect of the present invention, a current injection circuit 81 is connected to the connection node of a resistor R and a capacitor C making up the loop-filter 14, and the charging and discharging are carried out in such a way that the voltage of the capacitor C changes with a voltage amplitude smaller than the voltage of the capacitor in a spread spectrum period longer than the generated clock period.

Figure 38:
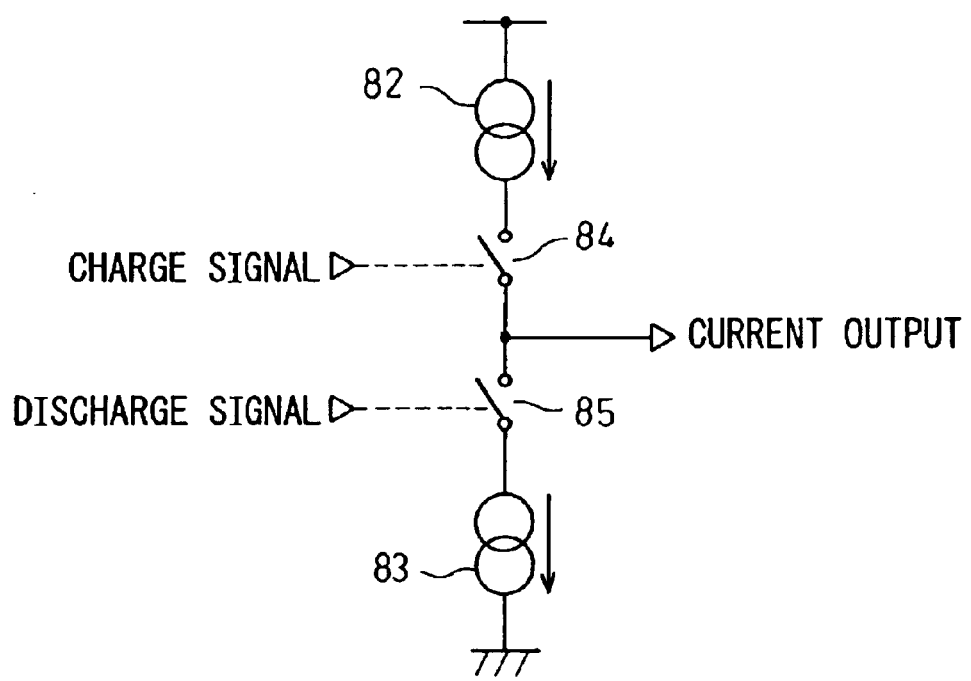
FIG. 38 is a diagram showing the basic configuration of a current injection circuit used in the fourth aspect.

FIG. 38 is a diagram showing the basic configuration of the current injection circuit 81. As shown in FIG. 38, the current injection circuit comprises two switches 84 and 85 connected in series between a constant current source 82 on the high potential power source side and a constant current source 83 on the low potential power source side, and controls the switches 84 and 85 by the use of a charge signal and a discharge signal, which are in a complementary relationship. Charging is carried out when the switch 84 is in the state of connection and the switch 85 is in the state of cutoff, and discharging is carried out when the switch 84 is in the state of cutoff and the switch 85 is in the state of connection.

According to the fourth aspect of the present invention, when the input voltage (differential voltage signal) of the VCO or the current oscillation circuit is changed, the control voltage of the VCO or the current oscillation circuit also changes, therefore, it is possible to realize a clock generation circuit which can reduce the electromagnetic radiation by effecting the oscillation frequency transition of the clock generated by the VCO or the current oscillation circuit. In the present invention, as the voltage of a capacitor is changed by carrying out charging and discharging of the capacitor making up the loop-filter, the voltage of the capacitor increases or decreases at a constant rate if the current used for charging and discharging is constant, therefore, the change is smooth as shown in FIG. 36A. Therefore, the current injection circuit 81 requires only the use of a small-scale current source circuit and a simple current source control circuit for switching between the charging period and the discharging period, and it is possible to reduce a glitch caused by the step-wise change even if the circuit scale of the whole SSCG circuit is made smaller. If the current used for charging and discharging is constant, it is possible to change the period and amplitude of the voltage change of the capacitor by controlling the time for charging and discharging. As described so far, the current source used as the current injection circuit 81 can be easily controlled in a digital manner and it is possible to effect the frequency transition more exactly and more precisely than when the spread spectrum process is carried out using a general D/A converter as a VCO.

Figure 39:
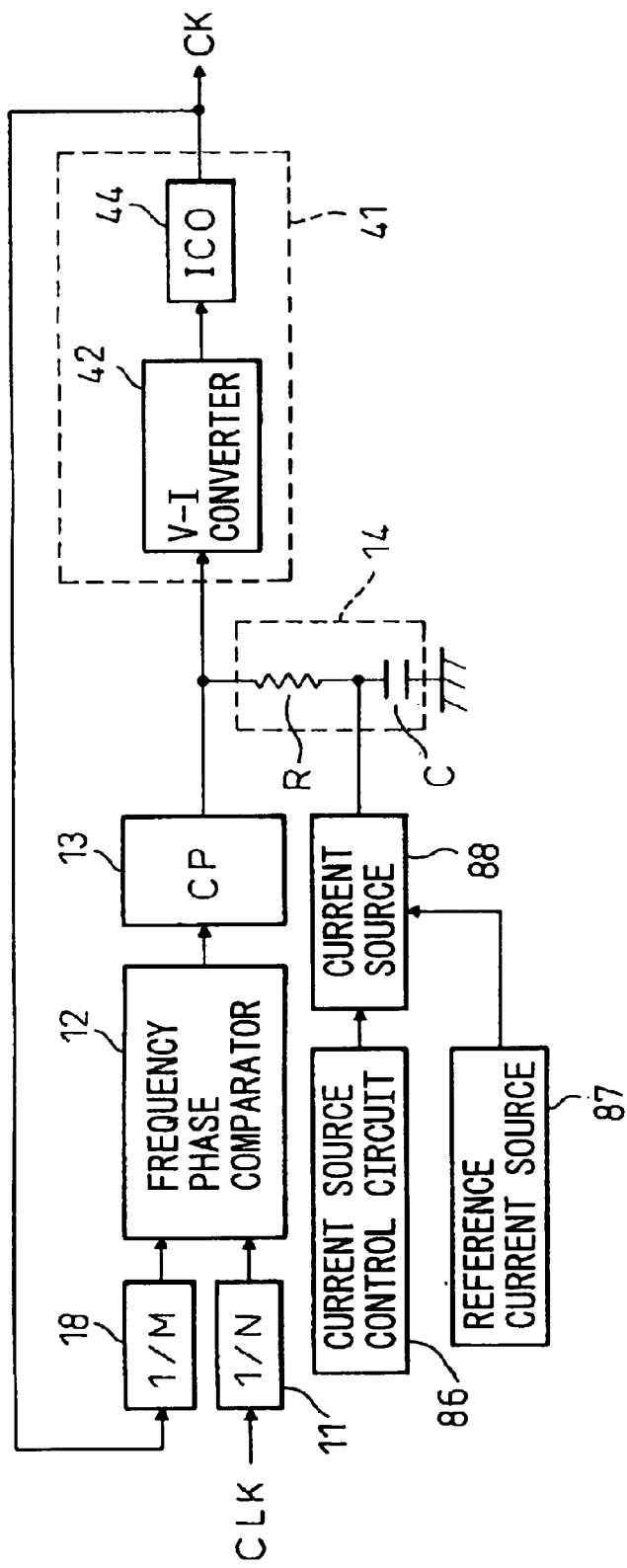
FIG. 39 is a diagram showing the basic configuration of an SSCG circuit in a tenth embodiment of the present invention.

FIG. 39 is a diagram showing the configuration of the SSCG circuit in the tenth embodiment of the present invention. As obvious from the comparison with the SSCG circuit in FIG. 13, the SSCG circuit in the tenth embodiment has a configuration modified from that of the SSCG circuit in the third embodiment by eliminating the IDAC 17 and the control circuit 19, and by connecting a current injection circuit consisting of a current source control circuit 86, a reference current source 87 and a current source 88 to the connection node of the resistor R and the capacitor C making up the loop-filter 14. Therefore, the description about the configuration of the frequency phase comparator 12, the charge pump 13, the V-I conversion circuit 16, the ICO circuit 18, and so on, is not given here.

Figure 40:
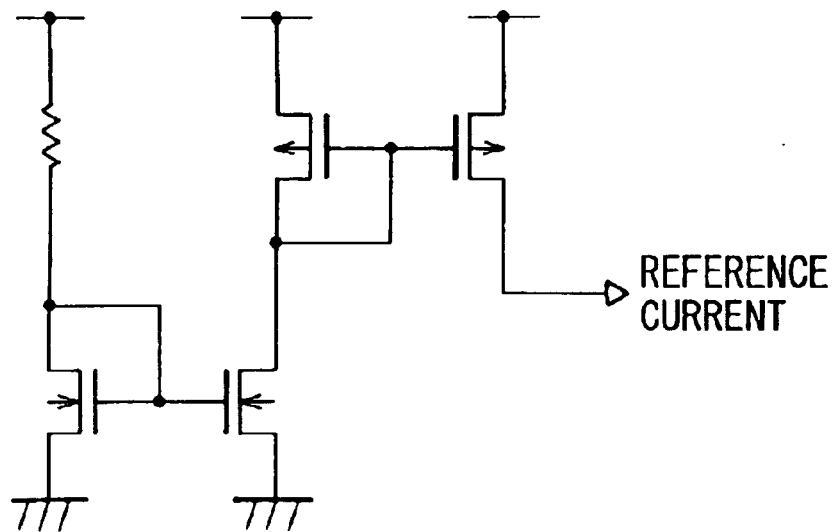
FIG. 40 is a diagram showing the configuration of a reference current source circuit.
Figure 41:
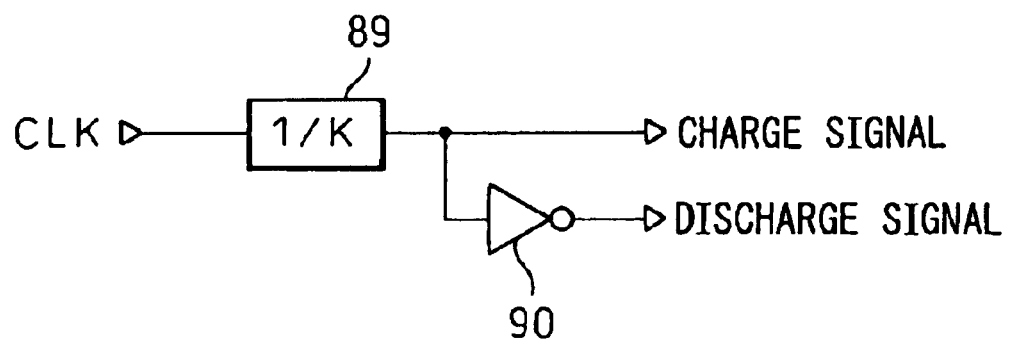
FIG. 41 is a diagram showing the configuration of a current source control circuit.
Figure 42:
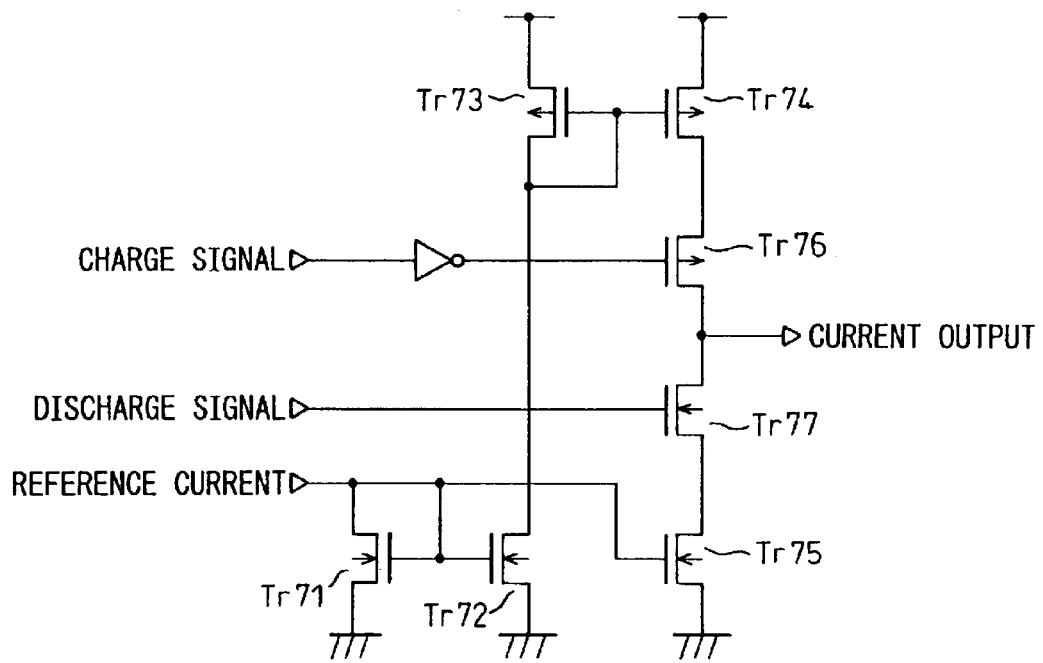
FIG. 42 is a diagram showing the configuration of a current source circuit.

FIG. 40 is a diagram showing the circuit configuration of the reference current source circuit 87, FIG. 41 is a diagram showing the circuit configuration of the current source control circuit 86, and FIG. 42 is a diagram showing the circuit configuration of the current source circuit 88.

The reference current source circuit 87 is a widely known current mirror circuit and a reference current whose amount of current is constant is output. The current source control circuit 86 comprises a 1/K dividing circuit 89 and generates a clock signal with a duty ratio of 50% in the spread spectrum modulation period by dividing the reference clock CLK by a factor of 1/K. The generated clock signal is output as a charge signal and at the same time inverted in an inverter 90 and output as a discharge signal. Therefore, the charge signal and the discharge signal are complementary signals.

In the current source circuit 88, the current mirror circuit is composed of transistors Tr71 to Tr75, and the transistor Tr74 serves as a constant current source which charges the reference current output from the reference current source 87, and the transistor Tr75 serves as a constant current source which discharges the reference current. Between the transistors Tr74 and Tr75, transistors Tr76 and Tr77 are connected in series and a charge signal is applied to the gate of the transistor Tr76 via an inverter and a discharge signal is applied to the gate of the transistor Tr77. When the charge signal is at "high (H)" and the discharge signal is at "low (L)", the transistor Tr76 is set to the ON state, the transistor Tr77 is set to the OFF state, and a current in accordance with the reference current is output via the transistors Tr74 and Tr76 so as to charge the capacitor C. When the charge signal is at "L", and the discharge signal is at "H", the transistor Tr76 is set to the OFF state, the transistor Tr77 is set to the ON state, and a current in accordance with the reference current is drained in via the transistors Tr76 and Tr75 so as to discharge the capacitor C.

FIG. 43A to FIG. 43D are diagrams showing the change in the current which flows through the current source 88 in accordance with the charge signal and the discharge signal and the change of the voltage (VCO control voltage) of the connection node of the resistor R and the capacitor C making up the loop-filter 14. As shown schematically, when the charge signal is at "H" and the discharge signal is at "L", the current source 88 outputs a constant current and in accordance with this, the VCO control voltage increases, and when the charge signal switches to "L" and the discharge signal switches to "H", the current source 88 drains a constant current and, in accordance with this, the control voltage of the current oscillation circuit 41 decreases, changing into a triangular wave shape. In accordance with this, the frequency of the clock CK, which the current oscillating circuit 41 generates, changes.

Figure 44:
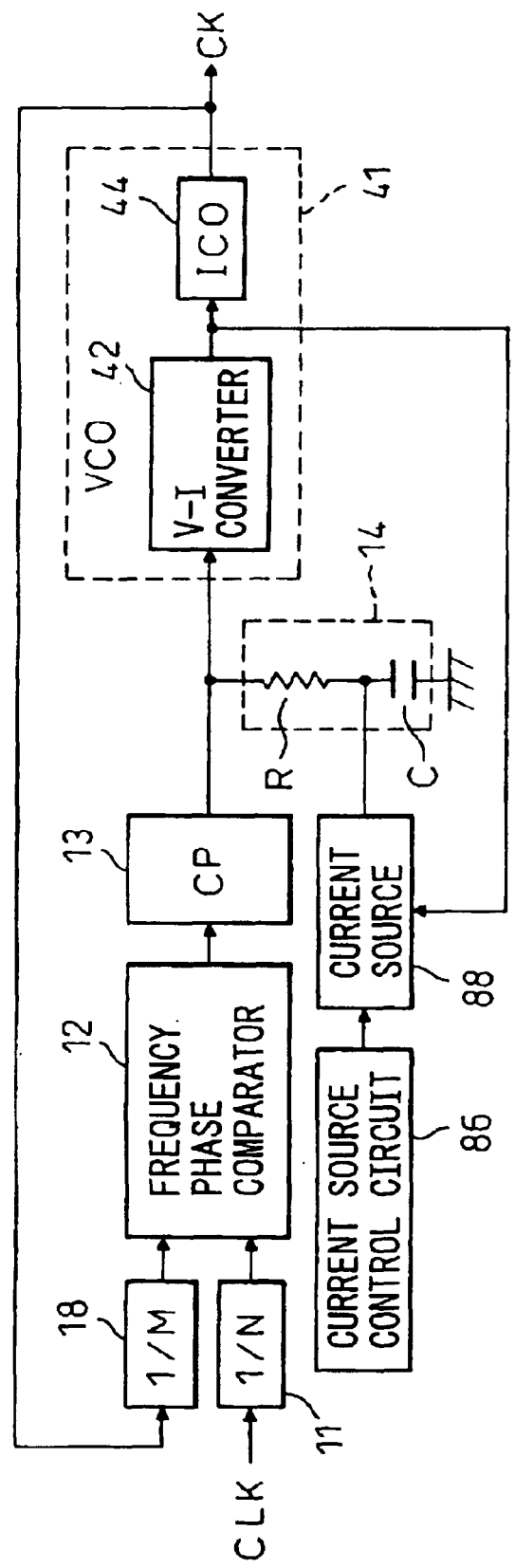
FIG. 44 is a diagram showing the circuit configuration of an SSCG circuit in an eleventh embodiment of the present invention.

FIG. 44 is a diagram showing the configuration of the SSCG circuit in the eleventh embodiment of the present invention. As shown schematically, the SSCG circuit in the eleventh embodiment differs from the SSCG circuit in that the reference current source 87 is removed and the output of the V-I conversion circuit 42 is input as the reference current of the current source 88.

In the SSCG circuit in the tenth embodiment, the reference circuit is constant and regardless of the VCO control voltage, the current to be supplied to or to be drained from the capacitor changes in a predetermined way and the spread spectrum voltage is constant. Therefore, the ratio of the spread spectrum voltage to the VCO control voltage differs depending on the VCO control voltage. As a result, if it is assumed that the oscillating frequency is in proportion to the VCO control voltage, the ratio of the frequency which changes according to the spread spectrum modulation is different between a low frequency and a high frequency. In contrast to this, in the SSCG circuit in the second embodiment, as the reference current changes in accordance with the VCO control voltage, the ratio of frequency which changes according to the spread spectrum modulation is the same for the low frequency and the high frequency. Because of this, in the SSCG circuit in the eleventh embodiment, it is possible to carry out the spread spectrum modulation at the same ratio for each oscillating frequency.

Moreover, in the SSCG circuit in the tenth and eleventh embodiments, the PLL circuit is formed in such a way that the clock CK generated in the current oscillation circuit 41 is fed back. Therefore, even if the characteristic of the ICO 44, as a single unit, or the current oscillation circuit 41 changes because of the variations in manufacturing process, changes in temperature or changes in current source voltage, a clock CK in accordance with the frequency of the reference clock CLK is finally generated. In the tenth embodiment, however, as the feedback is not carried out in the circuit portion where the spread spectrum modulation process is carried out, the spread spectrum modulation process is affected by such variations. In contrast to this, in the second embodiment, as the output current of the V-I converter 42 is reflected in the current source output current by feeding back the output current as the reference current of the current source 88, that is, as the feedback is also carried out for the spread spectrum modulation process, the control voltage of the current oscillation circuit 41 is not affected by the variations and a clock CK having a desired spread width is output.

Figure 45:
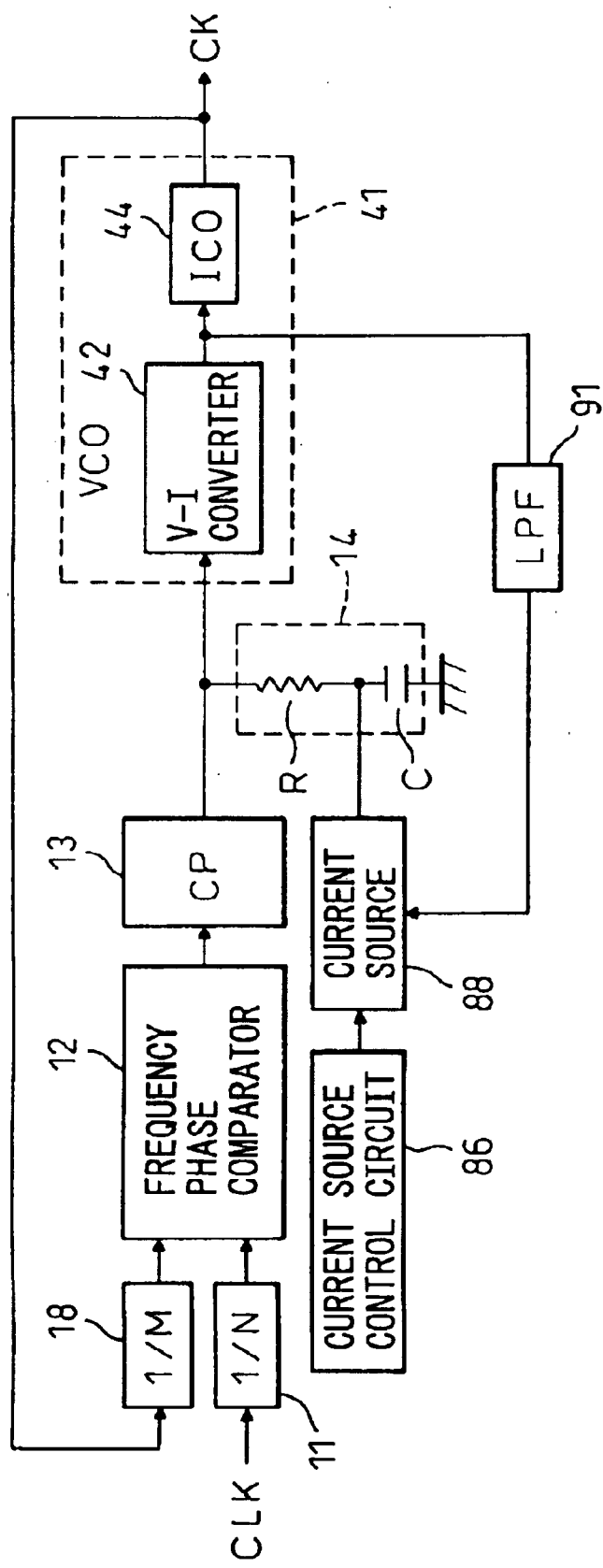
FIG. 45 is a diagram showing the circuit configuration of an SSCG circuit in a twelfth embodiment of the present invention.

FIG. 45 is a diagram showing the configuration of the SSCG circuit in the twelfth embodiment of the present invention. As shown schematically, the SSCG circuit in the twelfth embodiment differs from the SSCG circuit in the eleventh embodiment in that, after being filtered by a low-pass filter (LPF) 91 in order to remove the high frequency component, the output of the V-I conversion circuit 42 is input as the reference current of the current source 88. Because of this, unlike the eleventh embodiment, it is possible to remove the spread spectrum component from the output of the V-I conversion circuit 42 and carry out the spread spectrum modulation at a constant spread rate all the time.

Figure 46:
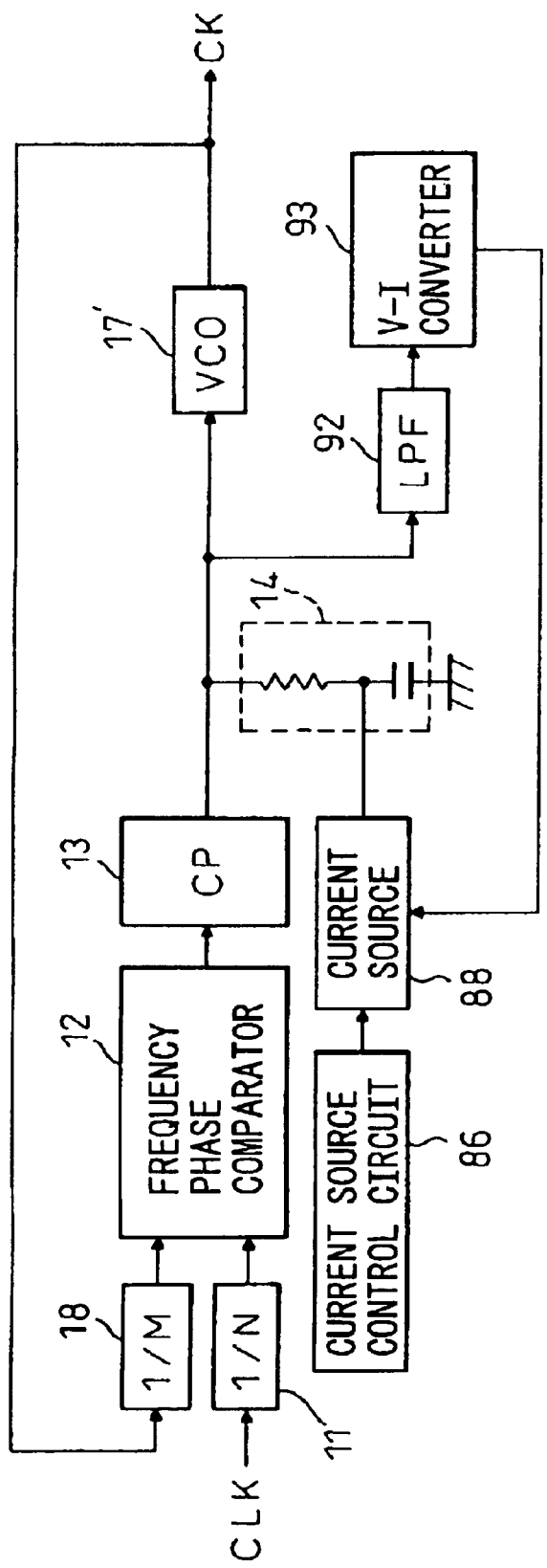
FIG. 46 is a diagram showing the circuit configuration of an SSCG circuit in a thirteenth embodiment of the present invention.

FIG. 46 is a diagram showing the configuration of the SSCG circuit in the thirteenth embodiment of the present invention. As shown schematically, in the SSCG circuit in the thirteenth embodiment, after branching from and being filtered by an LPF 92, the VCO control voltage to be input to a VCO 17' is converted into a current signal in a V-I conversion circuit 93 and fed back as the reference current of the current source 88. In the thirteenth embodiment, as a voltage signal is filtered, the LPF 92 can be realized by a simple circuit by the use of capacitors and resistors, it is possible to reduce the circuit size and at the same time obtain the same effects as those of the twelfth embodiment.

Figure 47:
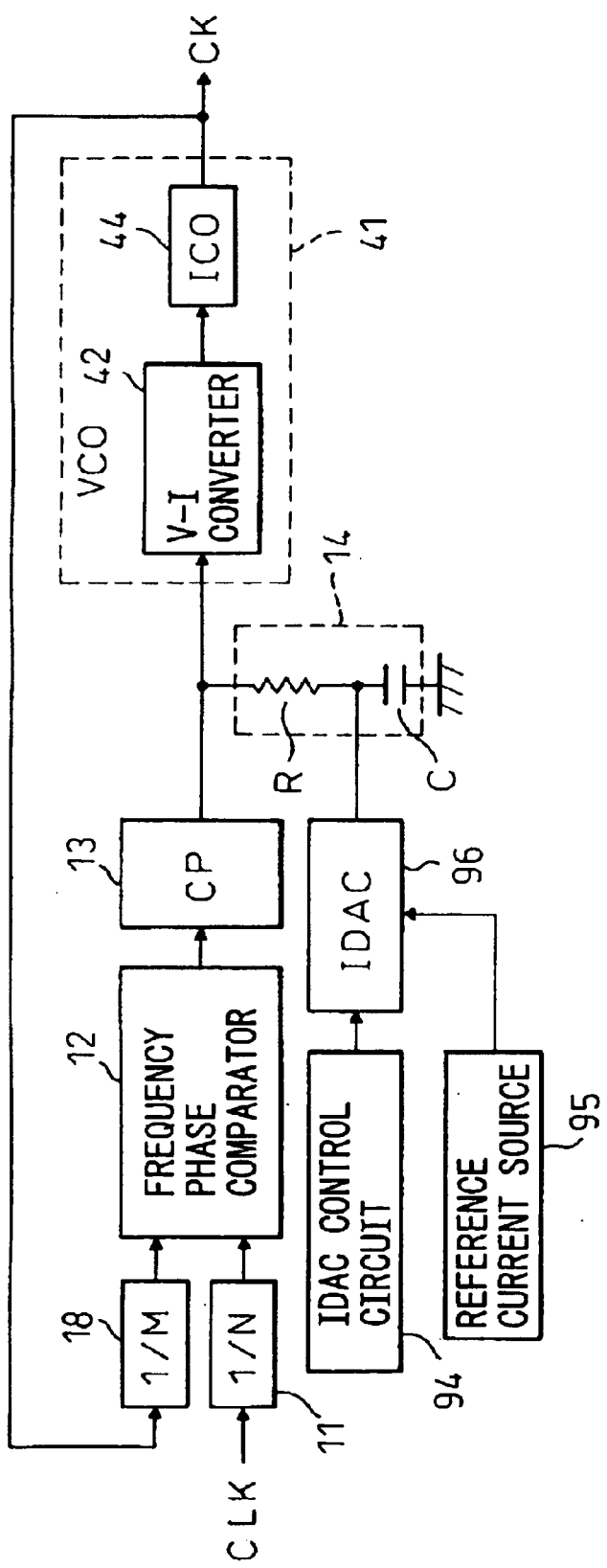
FIG. 47 is a diagram showing the circuit configuration of an SSCG circuit in a fourteenth embodiment of the present invention.

FIG. 47 is a diagram showing the configuration of the SSCG circuit in the fourteenth embodiment of the present invention. As shown schematically, the SSCG circuit in the fourteenth embodiment differs from that in the tenth embodiment in that an IDAC control circuit 94 and an IDAC circuit 96 are provided instead of the current source control circuit 86 and the current source 88.

Figure 48:
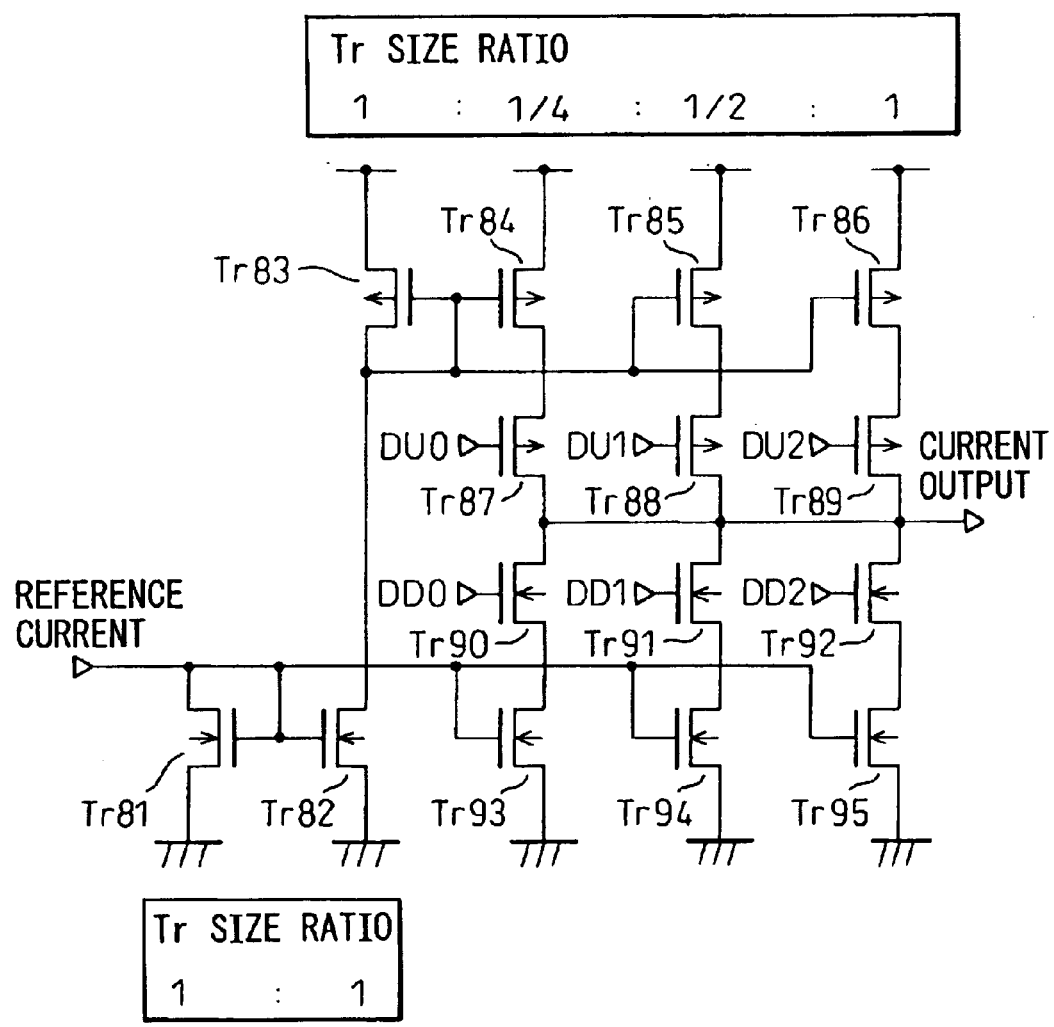
FIG. 48 is a diagram showing the circuit configuration of a push-pull type IDAC used in the SSCG circuit in the fourteenth embodiment.

FIG. 48 is a diagram showing the configuration of the IDAC circuit 96. The IDAC circuit 96 used in the fourteenth embodiment is a push-pull type, which not only outputs a current but also drains (pulls out) a current. The detailed description is not given here.

Figure 49:
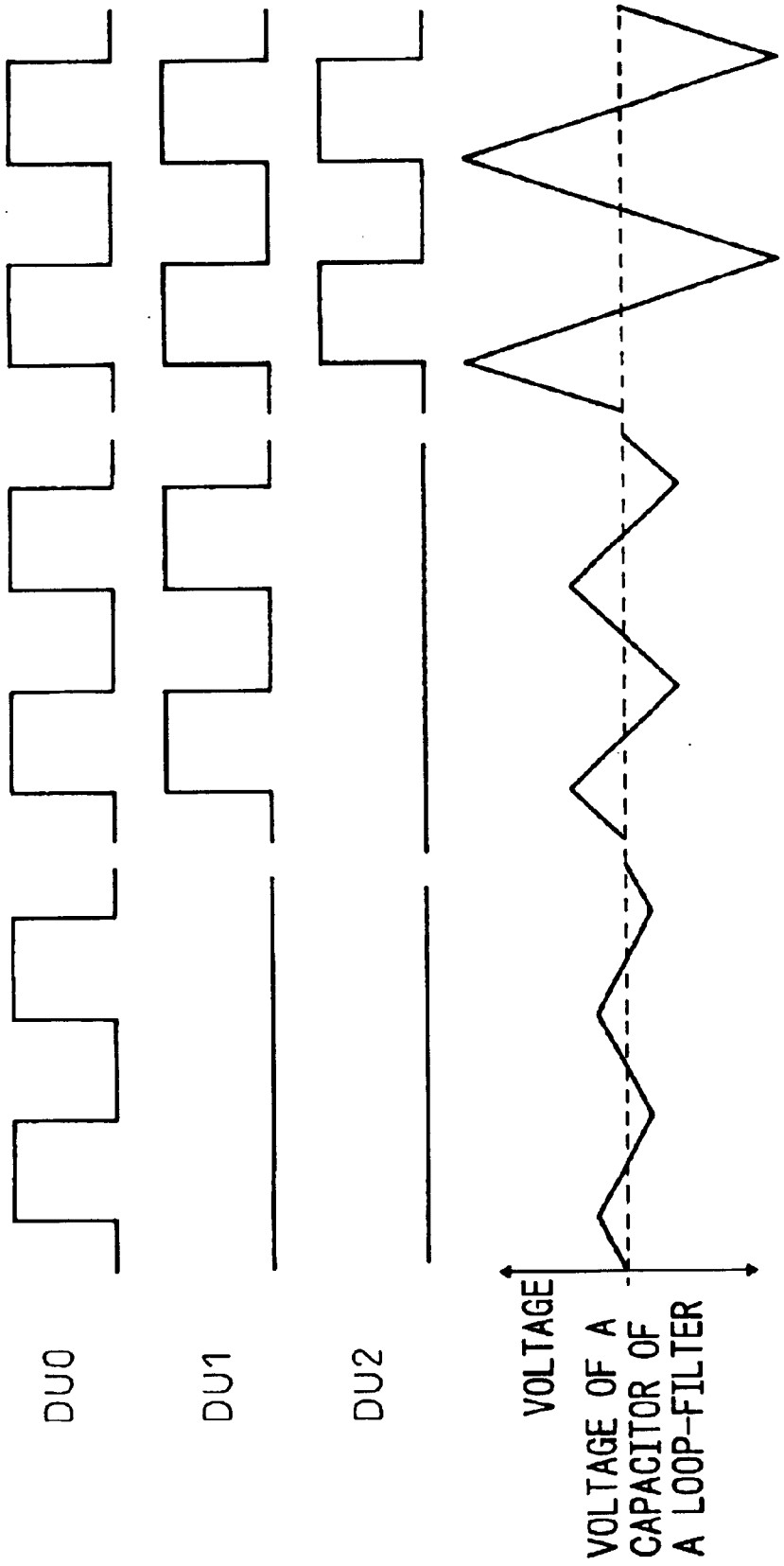
FIG. 49A to FIG. 49C are diagrams illustrating the operation of a push-pull type IDAC in the fourteenth embodiment.

FIG. 49A to FIG. 49C are diagrams showing the change of the voltage of the capacitor C of the loop-filter versus the change of control data DU0 to DU2 and DD0 to DD2 of the IDAC circuit 96 shown in FIG. 48: FIG. 49A shows the case of one-bit drive, FIG. 49B shows the case of two-bit drive, and FIG. 49C shows the case of three-bit drive.

As shown in FIG. 49A, in the case of one-bit drive, DU0 changes in such a way as shown schematically, and DU1 and DU2 maintain the "H" state. DD0 and DU0 are identical signals and DD1 and DD2 maintain the "L" state. In this manner, only Tr87 and Tr90 shown in FIG. 48 repeat the ON and OFF states, therefore, an small amount of current is supplied to or drained from the capacitor C from or by the IDAC 96, and the voltage of the capacitor C changes in a triangular wave form with a small-sized amplitude.

As shown in FIG. 49B, in the case of a two-bit drive, DU0 and DU1 change in such a way as shown schematically, and DU2 maintains the "H" state. DD0 and DD1 are signals identical to DU0 and DU1, respectively, and DD2 maintains the "L" state. In this manner, Tr87, Tr88, Tr90 and Tr91 shown in FIG. 48 repeat the ON and OFF states, therefore, a medium amount of current is supplied to or drained from the capacitor C from or by the IDAC 96 and the voltage of the capacitor C changes in a triangular wave form with a middle-sized amplitude.

As shown in FIG. 49C, in the case of a three-bit drive, DU0 to DU2 change in such a way as shown schematically, and DD0 to DD2 are signals identical to DU0 to DU2, respectively. In this manner, Tr87 to Tr89 and Tr90 and Tr92 shown in FIG. 48 repeat the ON and OFF states, therefore, a large amount of current is supplied to or drained from the capacitor C from or by the IDAC 96 and the voltage of the capacitor C changes in a triangular wave form with a large-sized amplitude.

As described above, it is possible to change the amount of current for charging and discharging the capacitor C in the SSCG circuit in the fourteenth embodiment.

The IDAC control circuit 94 outputs the control data DU0 to DU2 and DD0 to DD2 as shown in FIG. 49A to FIG. 49C. Although the IDAC control circuit 94 can be realized by the use of a dedicated logic circuit, it is also possible to realize by the use of a micro computer or DSP. Moreover, a reference current source 95 has a configuration similar to that of the circuit shown in FIG. 40.

It can be said that the current source 88 in the tenth embodiment represents a case where the IDAC in the fourteenth embodiment is changed into a one-bit configuration.

Figure 50:
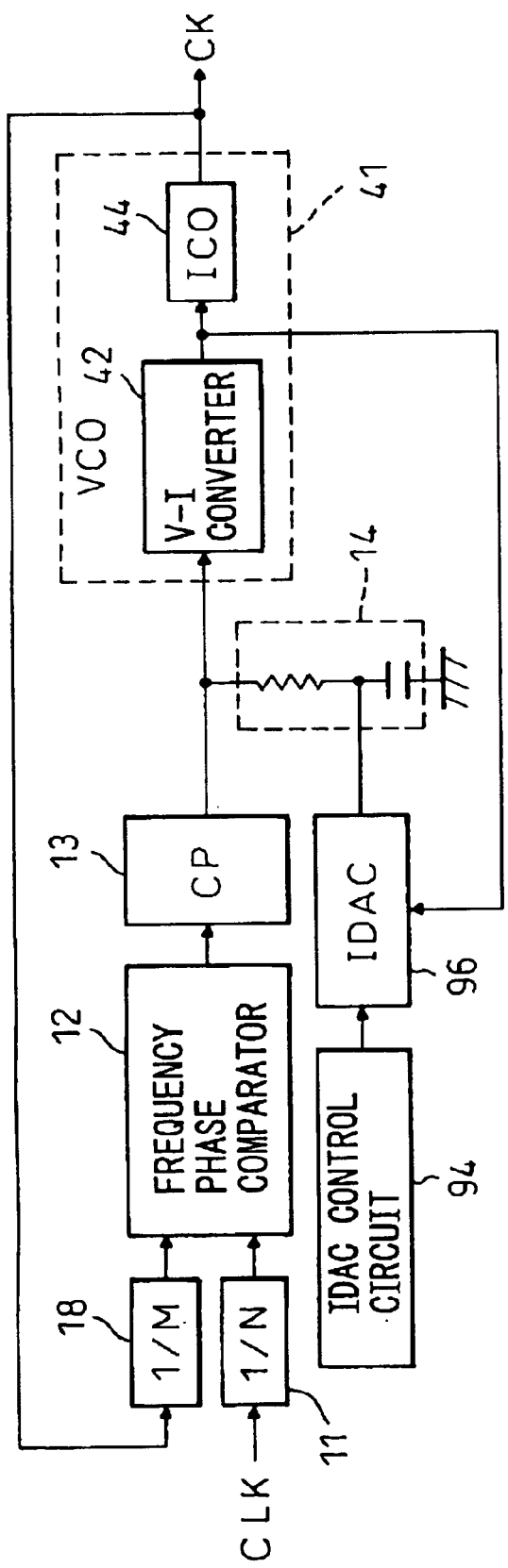
FIG. 50 is a diagram showing the circuit configuration of an SSCG circuit in a fifteenth embodiment of the present invention.

FIG. 50 is a diagram showing the configuration of the SSCG circuit in the fifteenth embodiment of the present invention. The SSCG circuit in the fifteenth embodiment has a configuration modified from that of the SSCG circuit in the eleventh embodiment by replacing the current source control circuit 86 and the current source 88 with the IDAC control circuit 94 and the IDAC circuit 96 in the fourteenth embodiment. Therefore, this SSCG circuit has the characteristic of the fourteenth embodiment in addition to that of the eleventh embodiment.

Figure 51:
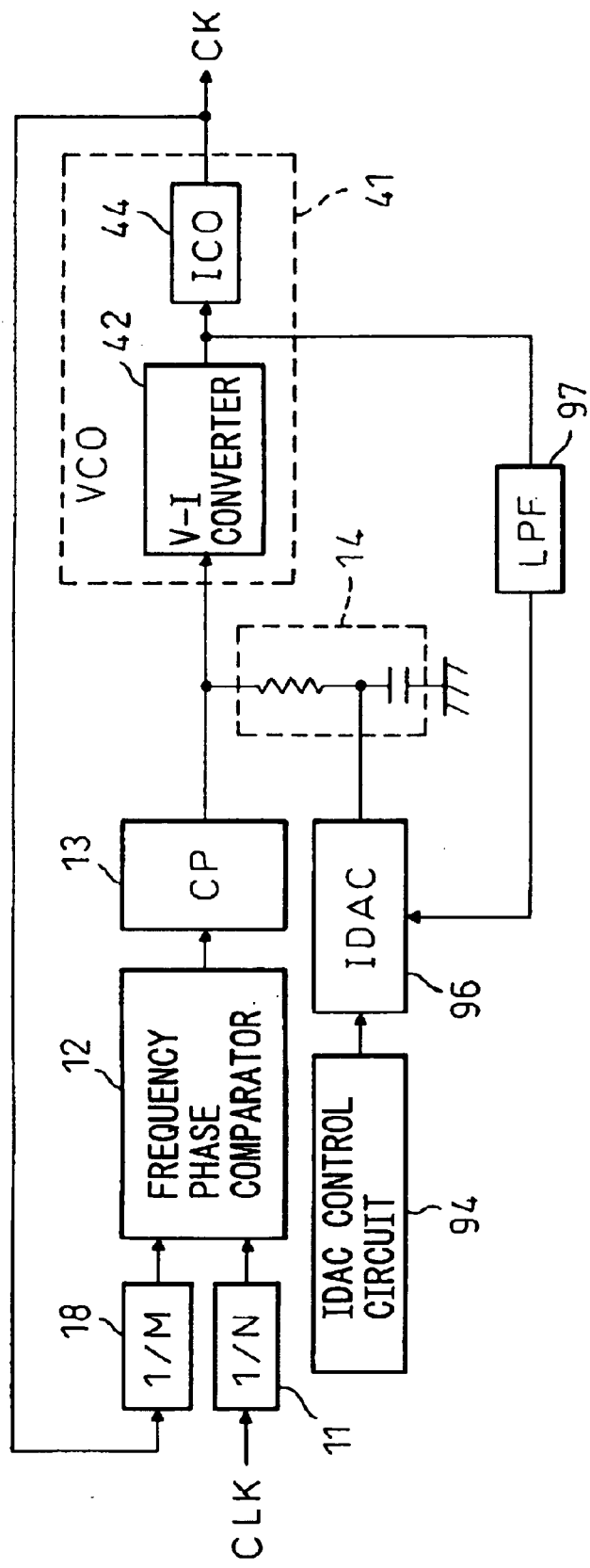
FIG. 51 is a diagram showing the circuit configuration of an SSCG circuit in a sixteenth embodiment of the present invention.

FIG. 51 is a diagram showing the configuration of the SSCG circuit in the sixteenth embodiment of the present invention. The SSCG circuit in the sixteenth embodiment has a configuration modified from that of the SSCG circuit in the twelfth embodiment by replacing the current source control circuit 86 and the current source 88 with the IDAC control circuit 94 and the IDAC circuit 96 in the fourteenth embodiment. Therefore, this SSCG circuit has the characteristic of the fourteenth embodiment in addition to that of the twelfth embodiment.

Figure 52:
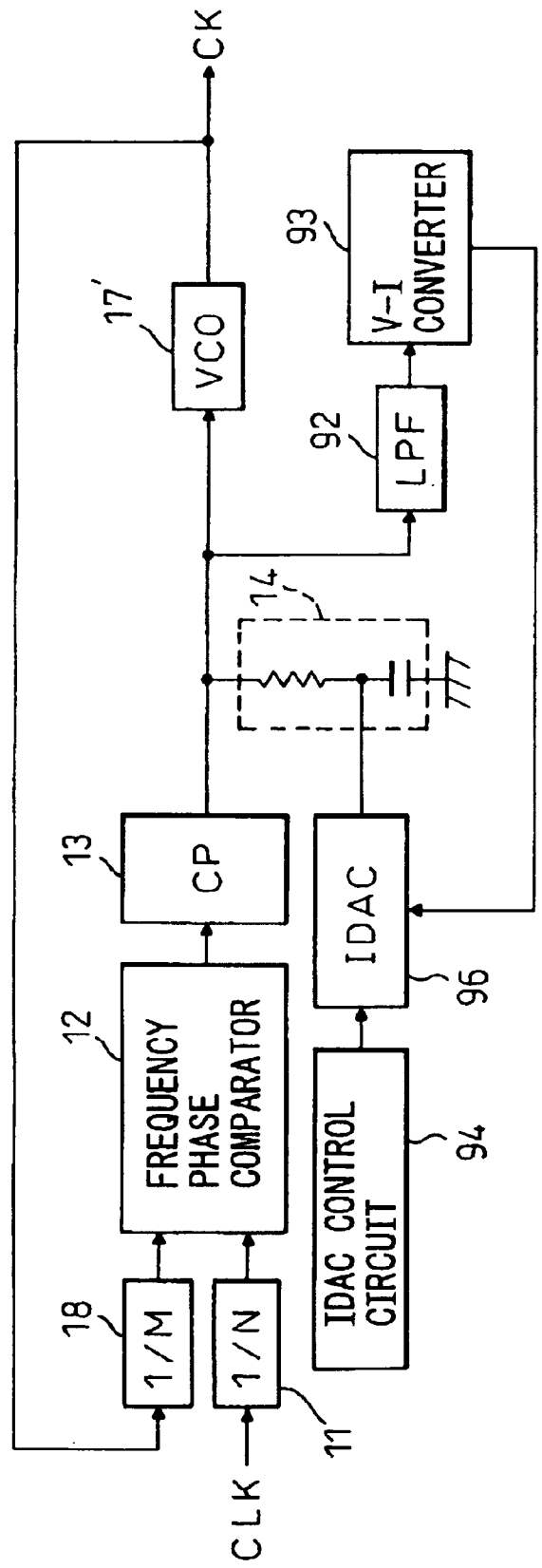
FIG. 52 is a diagram showing the circuit configuration of an SSCG circuit in a seventeenth embodiment of the present invention.

FIG. 52 is a diagram showing the configuration of the SSCG circuit in the seventeenth embodiment of the present invention. The SSCG circuit in the seventeenth embodiment has a configuration modified from that of the SSCG circuit in the thirteenth embodiment by replacing the current source control circuit 86 and the current source 88 with the IDAC control circuit 94 and the IDAC circuit 96 in the fourteenth embodiment. Therefore, this SSCG circuit has the characteristic of the fourteenth embodiment in addition to that of the thirteenth embodiment.

Figure 53:
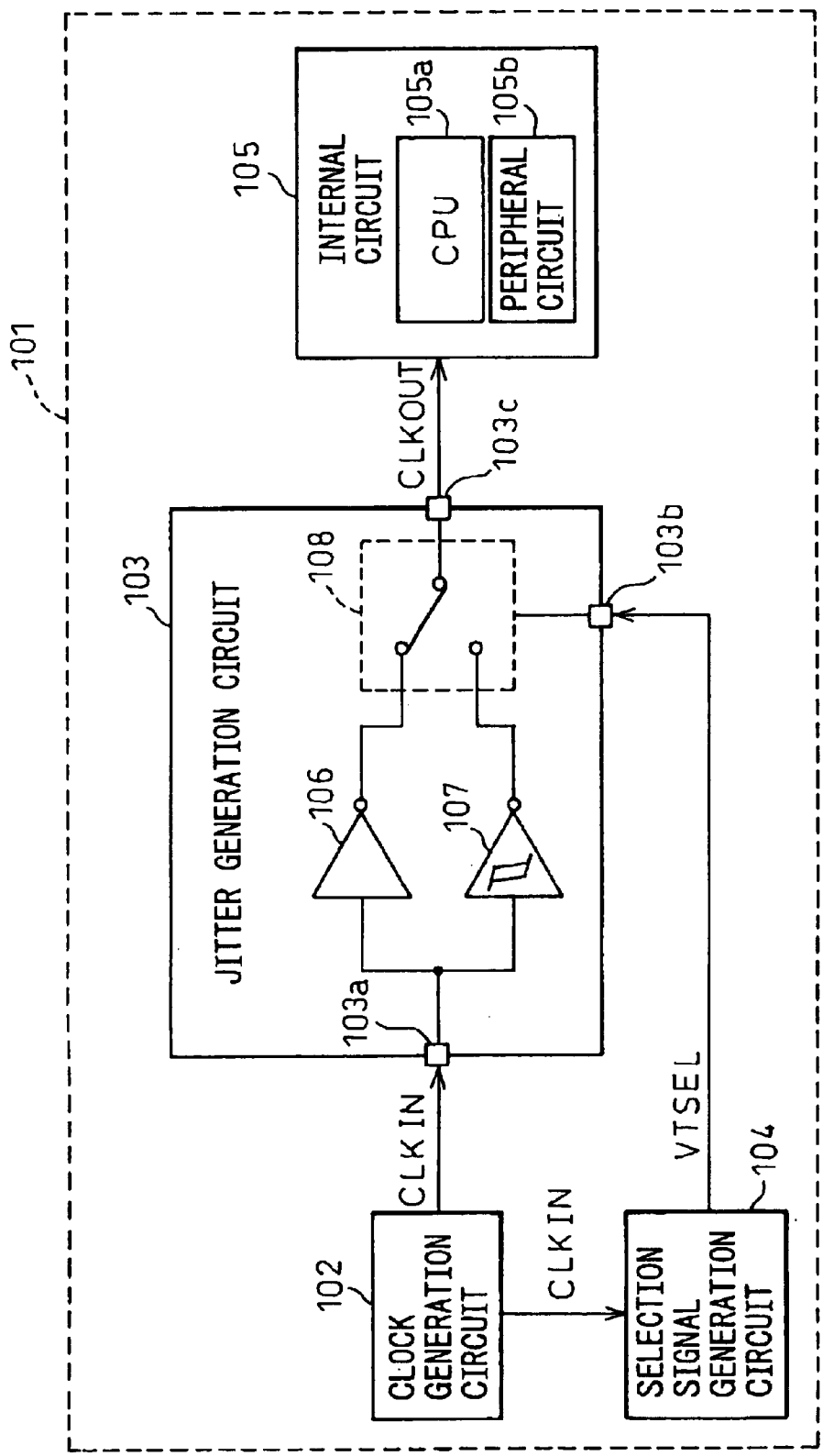
FIG. 53 is a diagram showing the configuration of a semiconductor device in an eighteenth embodiment of the present invention.
Figure 54:
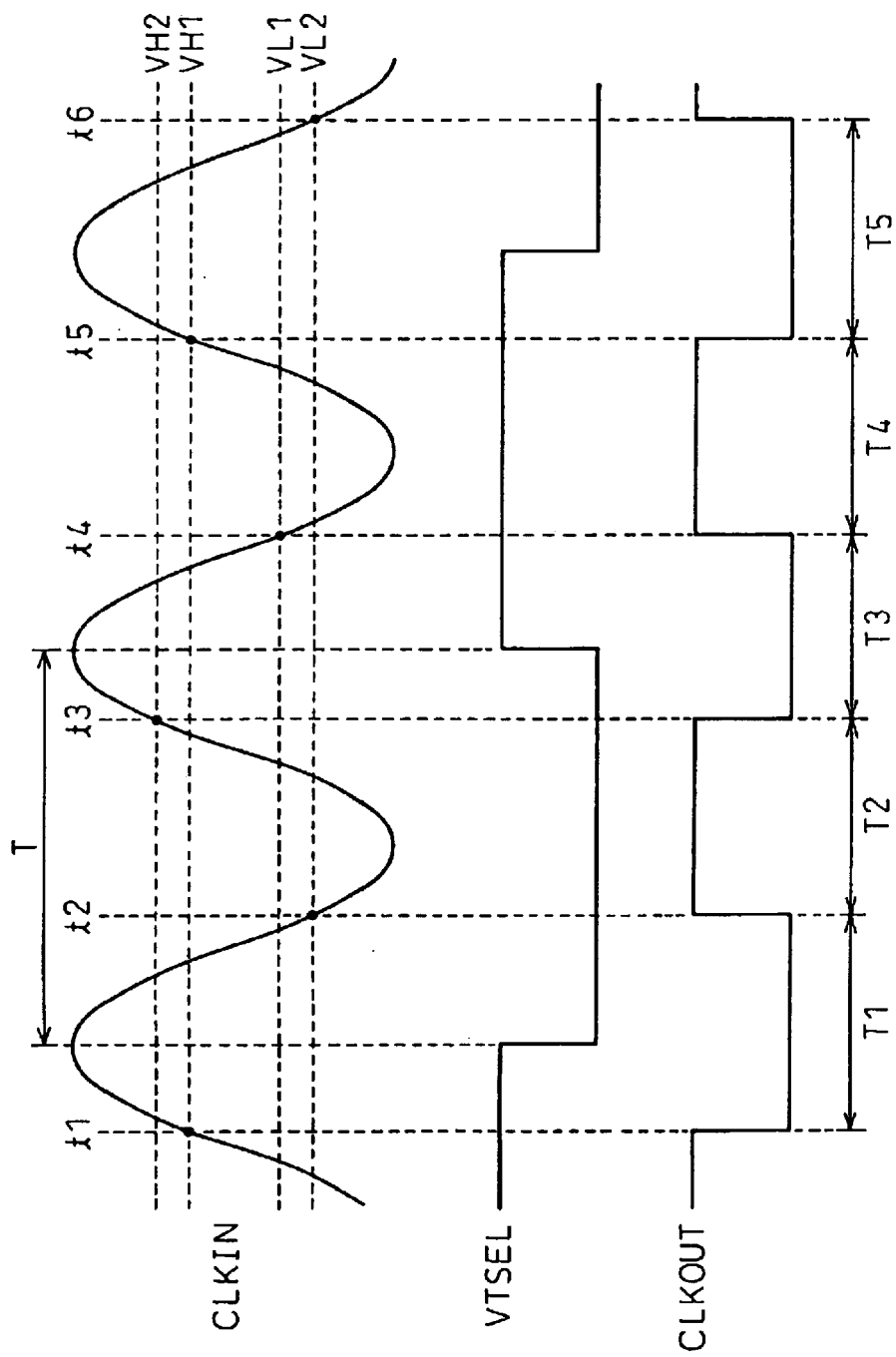
FIG. 54 is an operation waveform chart of a jitter generation circuit in the eighteenth embodiment.

FIG. 53 is a diagram showing the configuration of the semiconductor device having a jitter generation circuit in the eighteenth embodiment of the present invention. As shown in FIG. 53, a semiconductor device 101 in the eighteenth embodiment comprises a clock generation circuit 102, a jitter generation circuit 102, a selection signal generation circuit 104 and an internal circuit 105. The clock generation circuit 102 generates and outputs an input clock signal CLKIN as a reference input signal based on the oscillation signal of a crystal oscillator. Here, the input clock signal CLKIN output from the clock generation circuit 102 changes in a sinusoidal wave form in a constant period T, as shown in FIG. 54.

The jitter generation circuit 103 is provided between the clock generation circuit 102 and the internal circuit 105, and the jitter generation circuit 103 outputs an output clock signal CLKOUT, which is the input clock signal CLKIN from the clock generation circuit 102 to which a jitter (a jitter in the time axis direction) is added by the jitter generation circuit 103, to the internal circuit 105.

The internal circuit 105 comprises a widely known CPU 105a and a peripheral circuit 105b (for example, RAM, ROM, input/output circuit) and operates based on the output clock signal CLKOUT from the jitter generation circuit 103.

The selection signal generation circuit 104 comprises a flip-flop circuit, which is not shown, and generates a selection signal VTSEL based on the input clock signal CLKIN from the clock generation circuit 102 and outputs it to the jitter generation circuit 103. As shown in FIG. 54, the voltage level of the selection signal VTSEL changes to the H level or the L level with the timing in accordance with the period T of the input clock signal CLKIN (in concrete terms, the timing with which the level of the input clock signal CLKIN reaches the maximum value).

The jitter generation circuit 103 in the eighteenth embodiment comprises a normal inverter circuit 106 not having the hysteresis characteristic, a hysteresis inverter circuit 107 having the hysteresis characteristic, and a switch circuit 108. The jitter generation circuit 103 is provided with a first input terminal 103a which inputs the input clock signal CLKIN from the clock generation circuit 102, a second input terminal 103a which inputs the selection signal VTSEL from the selection signal generation circuit 104, and an output terminal 103c which outputs the output clock signal CLKOUT.

In the jitter generation circuit 103, the inverter circuit 106 and the hysteresis inverter circuit 107 are connected to the first input terminal 103a and the clock signal CLKIN is input to each inverter circuit 106 and 107. In addition, the inverter circuit 106 and the hysteresis inverter circuit 107 are connected to the output terminal 103c via the switch circuit 108.

As described above, the spread spectrum modulation process of current control type is carried out in the tenth to seventeenth embodiments and, therefore, the following effects can be obtained.

(1) The electromagnetic wave radiation can be reduced by effectively spreading the spectrum of the oscillating frequency, (2) the degree of the spectrum of the oscillating frequency can be set freely, (3) the oscillating frequency transition can be carried out precisely, and (4) the affect of the variations in process, temperature, power supply voltage, and so on, can be reduced.

Moreover, in comparison with the case where the IDAC shown in FIG. 18 is used, the effect that (5) a more precise spread spectrum modulation process can be carried out with a small scale circuit configuration can be obtained.

The threshold voltage of the hysteresis inverter circuit 107 is larger than the threshold voltage of the inverter circuit 106 when the output is switched from the H level (first level) to the L level (second level), and smaller than the threshold voltage of the inverter circuit 106 when the output is switched from the L level to the H level.

The output of the inverter circuit 106 changes from the H level to the L level when the input clock signal CLKIN exceeds the voltage value VH1 in FIG. 54, and changes from the L level to the H level when the input clock signal CLKIN falls below the voltage value VL1. On the other hand, the output of the hysteresis inverter circuit 107 changes from the H level to the L level when the input clock signal CLKIN exceeds the voltage value VH2 and changes from the L level to the H level when the input clock signal CLKIN falls below the voltage value VL2. The relationship of each voltage value is VH2>VH1>VL1>VL2.

The switch circuit 108 connects one of the inverter circuit 106 and the hysteresis inverter circuit 107 to the output terminal 103c in accordance with the voltage level of the selection signal VTSEL. In concrete terms, the switch circuit 108 connects the inverter circuit 106 and the output terminal 103c when the selection signal VTSEL is at the H level and connects the hysteresis inverter circuit 107 and the output terminal 103c when the selection signal VTSEL is at the L level.

Therefore, in the jitter generation circuit 103, as shown in FIG. 54, the output clock signal CLKOUT changes to the H level or the L level in accordance with the input clock signal CLKIN. To be exact, before time t1, the selection signal VTSEL is at the H level and the inverter circuit 106 is connected to the output terminal 103c via the switch circuit 108. Therefore, the output clock signal CLKOUT changes from the H level to the L level at time t1 when the voltage level of the input clock signal CLKIN exceeds the voltage value VH1.

Then, the selection signal VTSEL changes to the L level and the output clock signal CLKOUT changes from the L level to the H level at time t2 when the voltage level of the input clock signal CLKIN falls below the voltage value VL2, because the hysteresis inverter circuit 107 is connected to the output terminal 103c via the switch circuit 108. At a subsequent time 3 when the voltage level of the input clock signal CLKIN exceeds the voltage value VH2, the output clock signal CLKOUT changes from the H level to the L level.

Because the selection signal VTSEL changes to the H level between the time t3 and a time t4 and the inverter circuit 106 is connected to the output terminal 103c via the switch circuit 108, the output clock signal CLKOUT changes from the L level to the H level at the time t4 when the voltage level of the input clock signal CLKIN falls below the voltage value VL1. Then, at a time t5 also, as at the time t1, when the voltage level of the input clock signal CLKIN exceeds the voltage value VH1, the output clock signal CLKOUT changes from the H level to the L level. Moreover, at a time t6, when the voltage level of the input clock signal CLKIN falls below the voltage value VL2, the output clock signal CLKOUT changes from the L level to the H level.

In other words, the output signal CLKOUT in the jitter generation circuit 103 changes to the L level during a period of time T1 between the times t1 and t2, and changes to the H level during a period of time T2 between the times t2 and t3. Similarly, it changes to the L level during a period of time T3 between the times t3 and t4, changes to the H level during a period of time T4 between the times t4 and t5, and changes to the L level during a period of time T5 between the times t5 and t6. The period of time T1 is longer than the period of time T2 and the period of time T2 is longer than the period of time T3 (T1>T2>T3). The period of time T4 is equal to the period of time T2 and the period of time T5 is equal to the period of time T1.

In this manner, in the jitter generation circuit 103 in the eighteenth embodiment, the connection positions of the switch circuit 108 are switched based on the selection signal VTSEL and one of the inverter circuits 106 and 107, each having a different threshold voltage from each other, is connected to the output terminal 103c. Because of this, the threshold voltage of the jitter generation circuit 103 is changed, and the reversing timing of the output level changes with respect to the constant-interval timing in accordance with a period T of the input clock signal CLKIN. As a result, the output clock signal CLKOUT to which a jitter is added is output from the jitter generation circuit 103.

As described above, the circuit in the eighteenth embodiment has the following effects.

(1) The jitter generation circuit 103 is composed of the inverter circuit 106, the hysteresis inverter circuit 107 and the switch circuit 108. In this case, it is possible to add a jitter with a simpler circuit configuration than that of the prior art. Moreover, when the frequency of the input clock signal CLKIN is changed in accordance with the purpose of use of the semiconductor device 101, the jitter of the output clock signal CLKOUT changes according to the frequency and the ratio of the jitter to the input clock signal CLKIN can be maintained almost constant. Therefore, it is possible to effectively reduce the radiation noise of the semiconductor device 101.

(2) Because the jitter generation circuit 103 can be composed of a simple circuit, the manufacturing cost of the semiconductor device 101 can be reduced.

(3) The selection signal circuit 104 generates the selection signal VTSEL based on the input clock signal CLKIN from the clock generation circuit 102 and the connection positions of the switch circuit 108 are switched based on the selection signal VTSEL. In this configuration, therefore, it is possible to precisely generate the selection signal VTSEL in accordance with the input clock signal CLKIN. Moreover, as the selection signal generation circuit 104 has a relatively simple circuit configuration using a flip-flop circuit, it is preferable for practical use.

Next, the nineteenth embodiment of the present invention is described below. The semiconductor device in the nineteenth embodiment comprises a jitter generation circuit 111 shown in FIG. 55 instead of the jitter generation circuit 103 in the eighteenth embodiment. As the clock generation circuit 102, the selection signal generation circuit 104 and the internal circuit 105 making up the semiconductor device are the same as those in the eighteenth embodiment, a detailed description is not given here.

Figure 55:
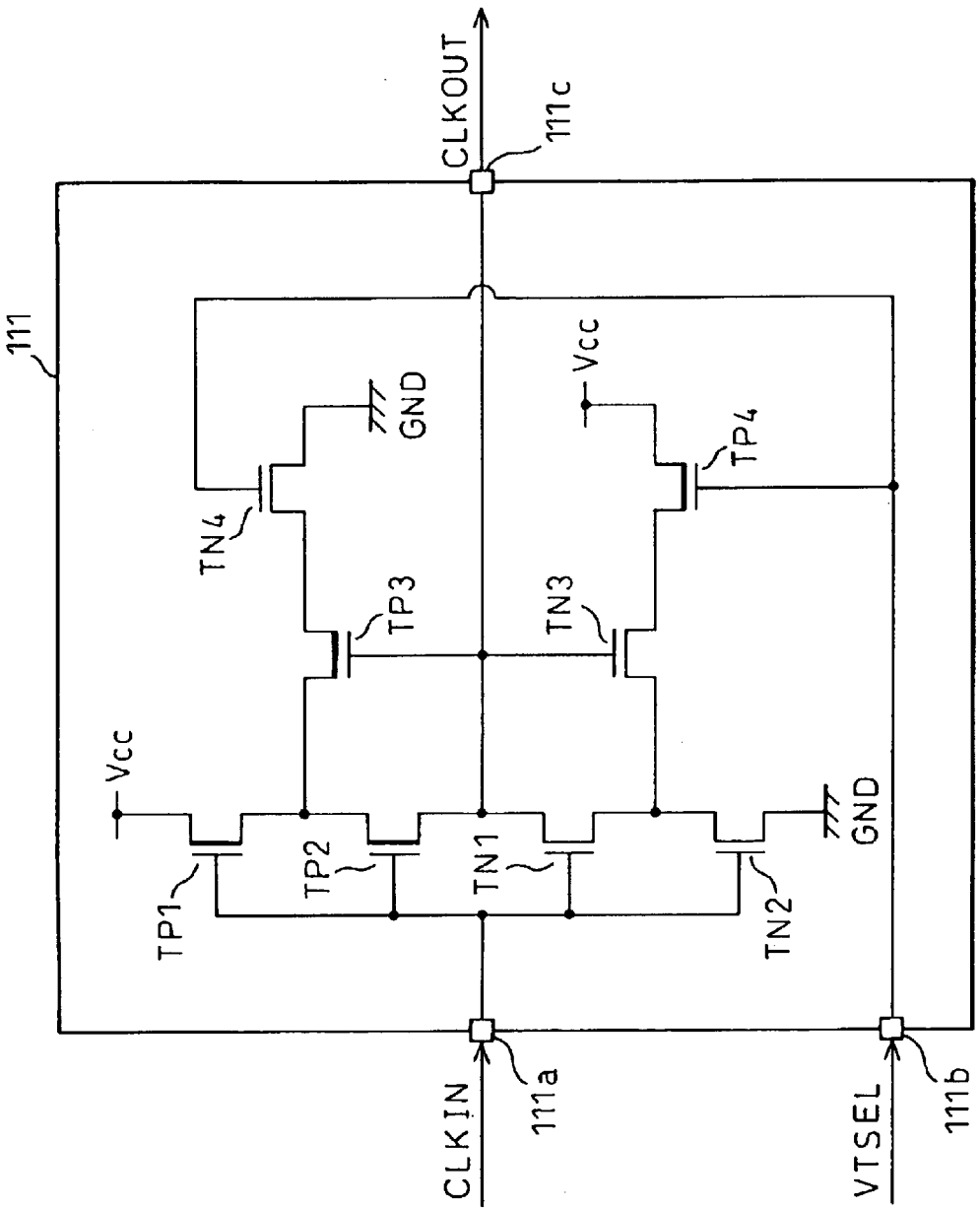
FIG. 55 is a diagram showing the configuration of a jitter generation circuit in a nineteenth embodiment of the present invention.

As shown in FIG. 55, the jitter generation circuit 111 is provided with a first input terminal 111a which inputs the input clock signal CLKIN from the clock generation circuit 102, a second input terminal 111b which inputs the selection signal VTSEL from the selection signal generation circuit, and an output terminal 111c which outputs the output clock signal CLKOUT.

The jitter generation circuit 111 is composed of P-channel MOS transistors TP1 to TP4 and N-channel MOS transistors TN1 to TN4. In the jitter generation circuit 111, the P-channel MOS transistors TP1 and TP2, and the N-channel MOS transistors TN1 and TN2 are connected in series between a power source Vcc and a ground GND. Each gate terminal of these transistors TP1, TP2, TN1 and TN2 is connected to the first input terminal 111a and the input clock signal CLKIN is input to each gate terminal. The connection point of the transistor TP1 and the transistor TP2 is connected to the ground GND via the P-channel MOS transistor TP3 and the N-channel MOS transistor TN4. On the other hand, the connection point of the transistor TN1 and the transistor TN2 is connected to the power source Vcc via the N-channel MOS transistor TN3 and the P-channel MOS transistor TP4.

The gate terminal of the transistor TP3 is connected to the gate terminal of the transistor TN3 and the connection point thereof is connected to the connection point of the transistor TP2 and the transistor TN1, and to the output terminal 111c. The gate terminals of the transistor TN4 and the transistor TP4 are connected to the second input terminal 111b and to these gate terminals, the selection signal VTSEL generated in the selection signal generation circuit 104 is input.

In the jitter generation circuit 111, the circuit excluding the transistors TP3, TP4, TN3 and TN4, that is, the circuit consisting of the transistors TP1, TP2, TN1 and TN2 functions as a normal inverter circuit. In the jitter generation circuit 111, when the transistor TN4 is eliminated, the transistor TP3 is connected to the ground GND, the transistor TP4 is eliminated, and the transistor TN3 is connected to the power supply Vcc, the circuit functions as a hysteresis inverter circuit. The transistor TP3 and the transistor TN3 serve as a transistor which provides the hysteresis characteristic to the inverter circuit consisting of the transistors TP1, TP2, TN1 and TN2. On the other hand, the transistor TN4 and the transistor TP4 serves as a switch which cuts off the transistor TP3 and the transistor TN3 from the inverter circuit.

In the jitter generation circuit 111, when the selection signal VTSEL is at the H level and the transistor TN4 is turned on, the threshold voltage at which the output clock signal CLKOUT changes from the L level to the H level becomes lower. On the other hand, when the selection signal VTSEL is at the L level and the transistor TP4 is turned on, the threshold voltage at which the output clock signal CLKOUT changes from the H level to the L level becomes higher.

To be exact, when the selection signal VTSEL at the H level is input to the jitter generation circuit 111, the transistor TN4 is turned on and the transistor TP4 is turned off. In this state, when the voltage level of the input clock signal CLKIN is high and the output terminal 111c (output clock signal CLKOUT) is at the L level, the transistor TP3 is turned on. Therefore, the threshold voltage at which the output terminal 111c changes from the L level to the H level becomes lower than the threshold voltage of the inverter circuit consisting of the transistors TP1, TP2, TN1 and TN2. On the other hand, when the voltage level of the input clock signal CLKIN is low and the output terminal 111c is at the H level, the transistor TP3 is turned off. At this time, as the transistor TP4 is in the OFF state, the power supply Vcc is not supplied to the transistor TN3, that is, the transistor TN3 is in the state of being cut off from the inverter circuit. Therefore, the threshold voltage at which the output terminal 111c changes from the H level to the L level is equal to the threshold voltage of the inverter circuit consisting of the transistors TP1, TP2, TN1 and TN2.

On the other hand, when the selection signal VTSEL at the L level is input to the jitter generation circuit 111, the transistor TN4 is turned off and the transistor TP4 is turned on. In this state, the threshold voltage at which the output terminal 111c changes from the H level to the L level is higher than the threshold voltage of the inverter circuit consisting of the transistors TP1, TP2, TN1 and TN2. The threshold voltage at which the output terminal 111c changes from the L level to the H level is equal to the threshold voltage of the inverter circuit consisting of the transistors TP1, TP2, TN1 and TN2.

Figure 56:
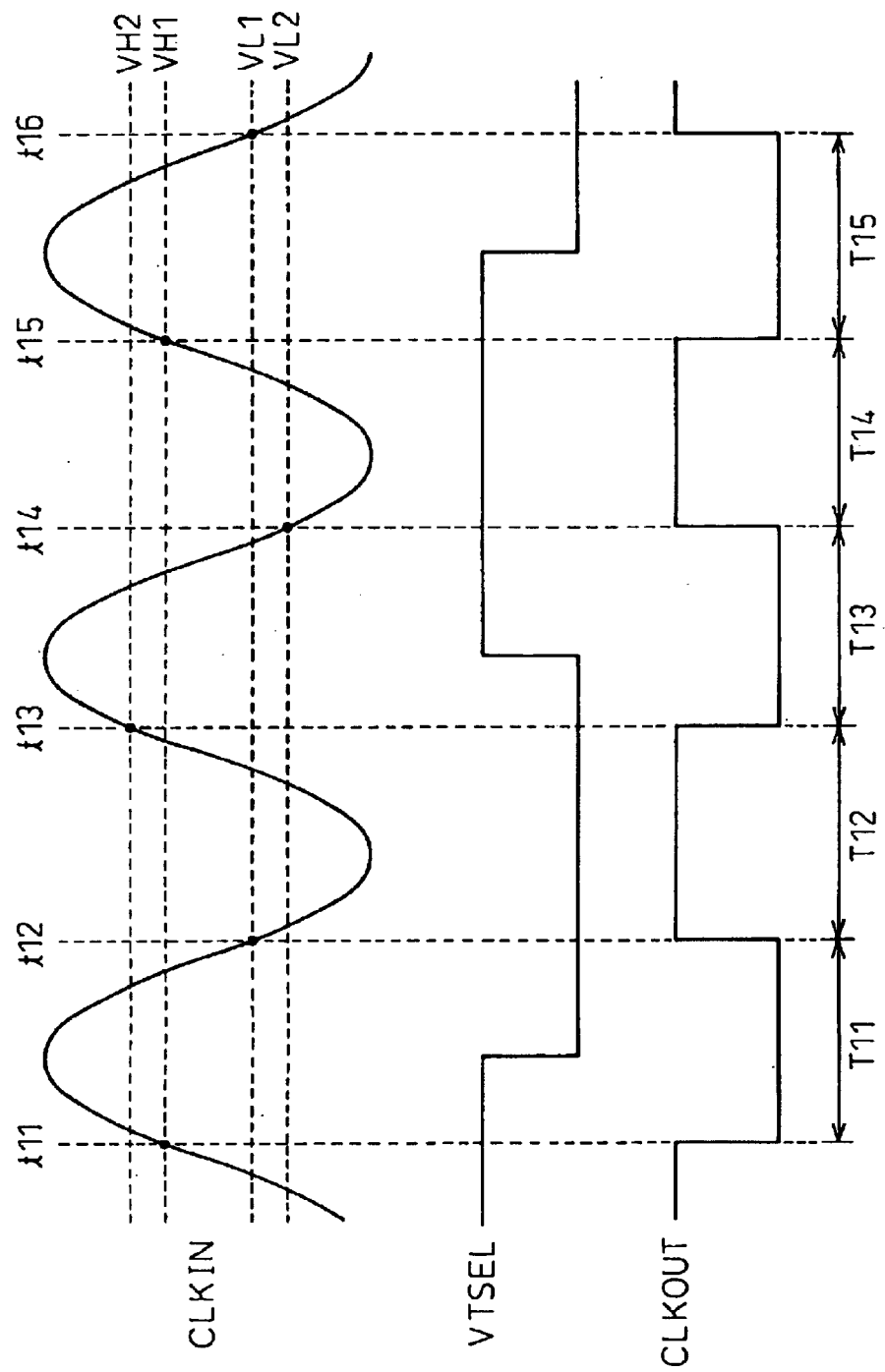
FIG. 56 is an operation waveform chart of the jitter generation circuit in the nineteenth embodiment.

Therefore, in the jitter generation circuit 111, when the selection signal VTSEL is at the H level and the input clock signal CLKIN exceeds the voltage value VH1 (times t11 and t15), the output clock signal CLKOUT changes from the H level to the L level, as shown in FIG. 56. When the selection signal VTSEL is at the H level and the input clock signal CLKIN falls below the voltage value VL2 (time t14), the output clock signal CLKOUT changes from the L level to the H level.

On the other hand, when the selection signal VTSEL is at the L level and the input clock signal CLKIN exceeds the voltage value VH2 (time t13), the output clock signal CLKOUT changes from the H level to the L level. When the selection signal VTSEL is at the L level and the input clock signal CLKIN falls below the voltage value VL1 (times t12 and t16), the output clock signal CLKOUT changes from the L level to the H level.

In other words, the output clock signal CLKOUT in the jitter generation circuit 111 is at the L level during a period of time T11 between the times t11 and t12 and at the H level during a period of time T12 between the times t12 and t13. Similarly, the output clock signal CLKOUT is at the L level during a period of time T13 between the times t13 and t14, at the H level during a period of time T14 between the times t14 and t15, and at the L level during a period of time T15 between the times t15 and t16. The period of time T11 is equal to the period of time T13 and the period of time T15, and shorter than the period of time T12 (T11=T13= T15<T12). The period of time T14 is shorter than the period of time T11 (T11>T14).

In this manner, in the jitter generation circuit 111 in the present invention also, the threshold voltage is changed in accordance with the selection signal VTSEL, therefore, the reversing timing of the output level is changed with respect to the constant-interval timing in accordance with the period T of the input clock signal CLKIN. As a result, the output clock signal CLKOUT to which a jitter is added is output.

As described above, the circuit in the nineteenth embodiment has the following effects.

(1) The jitter generation circuit 111 is composed of the MOS transistors TP1 to TP4, and TN1 to TN4. In this case, it is possible to add a jitter with a simpler circuit configuration that that of the prior art. Moreover, when the frequency of the input clock signal CLKIN is changed, the jitter of the output clock signal CLKOUT changes according to the frequency, therefore, it is possible to effectively reduce the radiation noise of the semiconductor device 101.

The eighteenth and nineteenth embodiments can be modified as below. Instead of the jitter generation circuits 103 and 111, a jitter generation circuit 121 shown in FIG. 57 and a jitter generation circuit 131 shown in FIG. 58 can be used.

Figure 57:
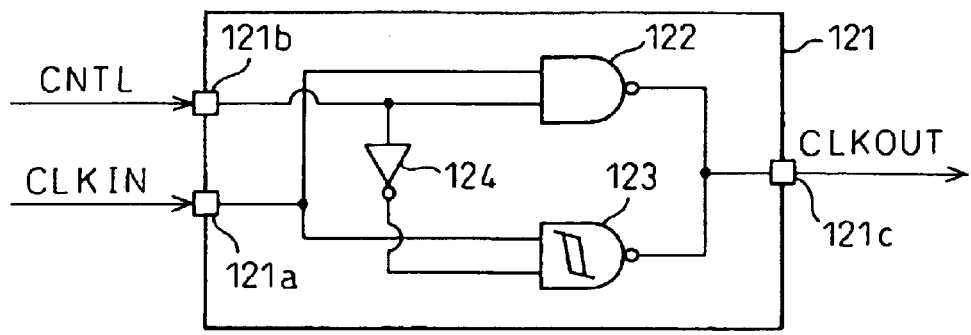
FIG. 57 is a diagram showing another configuration example of the jitter generation circuit.

To be exact, the jitter generation circuit 121 shown in FIG. 57 comprises a normal NAND circuit 122 not having the hysteresis characteristic, a NAND circuit 123 having the hysteresis characteristic, and an inverter circuit 124. The jitter generation circuit 121 is provided with a first input terminal 121a which inputs the input clock signal CLKIN, a second input terminal 121b which inputs a control signal CNTL, and an output terminal 121c which outputs the output clock signal CLKOUT. The first input terminal 121 is connected to one of the input terminals of the NAD circuit 122 and the NAND circuit 123, and the second input terminal 121b is connected to the other input terminal of the NAND circuit 122 and at the same time connected to the other input terminal of the NAND circuit 123 via the inverter circuit 124. The NAND circuit 122 and the NAND circuit 123 are connected to the output terminal 121c.

In this jitter generation circuit 121 also, the threshold voltage is changed in accordance with the voltage level of the control signal CNTL, as each of the embodiments described above, and it is possible to output the output clock signal CLKOUT to which a jitter is added.

Figure 58:
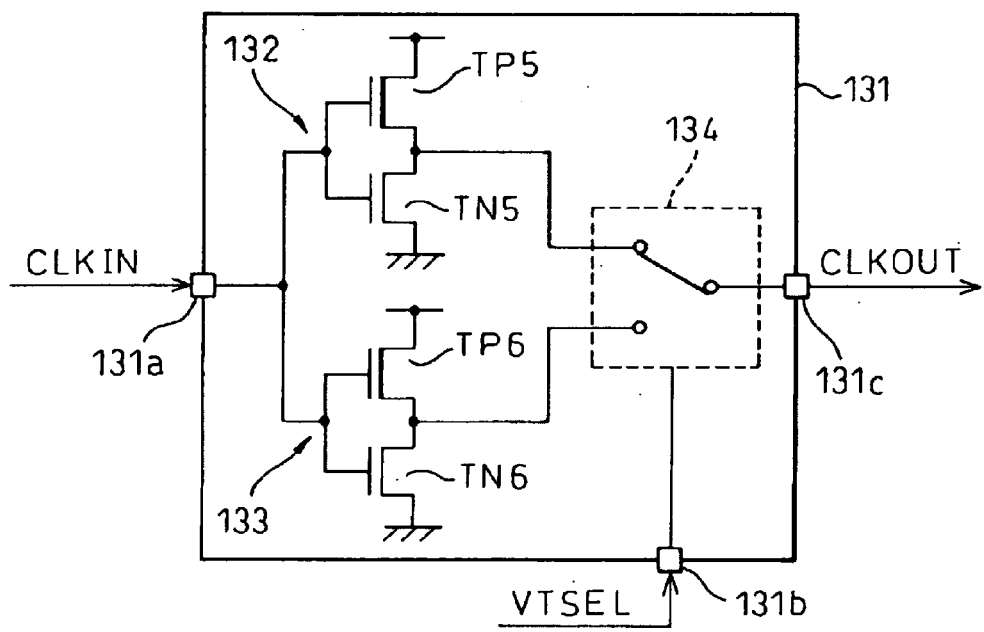
FIG. 58 is a diagram showing another configuration example of the jitter generation circuit.
Figure 59:
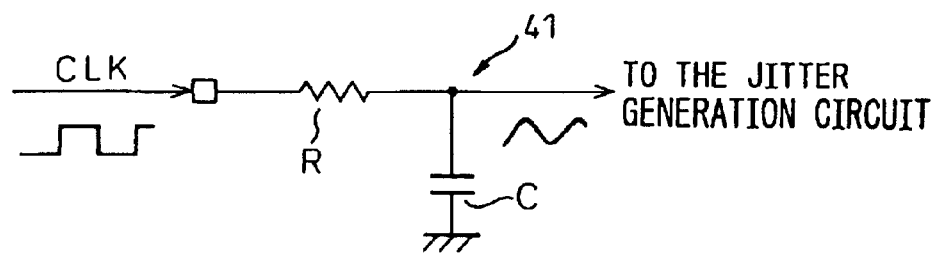
FIG. 59 is a diagram showing a CR circuit.

The jitter generation circuit 131 shown in FIG. 58 comprises a first inverter circuit 132 consisting of a P-channel MOS transistor TP5 and an N-channel MOS transistor TN5, a second inverter circuit 133 consisting of a P-channel MOS transistor TP6 and an N-channel MOS transistor TN6, and a switch circuit 134. Moreover, the jitter generation circuit 131 is provided with a first input terminal 131a which inputs the input clock signal CLKIN from the clock generation circuit 102, a second input terminal 131b which outputs the selection signal VTSEL from the selection signal generation circuit 104, and an output terminal 131c which outputs the output clock signal CLKOUT. The first and second inverter circuits 132 and 133 are connected to the first input terminal 131a and the circuits 132 and 133 each are connected to the output terminal 131c via the switch circuit 134. The switch circuit 134 connects one of the first and second inverter circuits 132 and 133 to the output terminal 131c in accordance with the voltage level of the selection signal VTSEL.

Moreover, in the jitter generation circuit 131, a threshold voltage Vth1 of the first inverter circuit 132 is set higher than a threshold voltage Vth2 of the second inverter circuit 133. In concrete terms, in the first inverter circuit 132, the driving performance of the transistor TP5 is set lower than that of the transistor TN5, and in the second inverter circuit 133, the driving performance of the transistor TP6 is set higher than that of the transistor TN6. The driving performance of each transistor TP5, TP6, TN5 and TN6 is adjusted by changing the gate length.

In this jitter generation circuit 131 also, the threshold voltage is changed in accordance with the voltage level of the selection signal VTSEL, as each of the embodiments described above, and it is possible to output the output signal CLKOUT to which a jitter is added.

The jitter generation circuit 131 is composed of the two inverter circuits 132 and 133 connected in parallel, each having a different threshold voltage, but it is also possible to configure a jitter generation circuit in which three or more inverter circuits each having a different threshold voltage is connected in parallel. In this configuration also, a switch circuit is provided between the output terminal and each inverter circuit and one of the inverter circuits is selectively connected to the output terminal by the switch circuit.

When a clock signal generated in the clock generation circuit 102 has a rectangular wave shape, a CR circuit 141 consisting of the capacitor C and the resistor R is provided between the clock generation circuit 102 and each of the jitter generation circuits 103, 111, 121 and 131. In this manner, the clock signal CLK having a rectangular wave shape gradually changes its shape into a sinusoidal wave shape as it passes through the CR circuit 141. As a result, it is possible to add a proper jitter in accordance with the clock signal CLK in the jitter generation circuits 103, 111, 121 and 131.

The eighteenth and nineteenth embodiments and their modifications are applicable to a clock signal which operates the internal circuit 105 (CPU 105a and its peripheral circuit 105b), but they can be applied to other signals such as a synchronous signal used in data communications.

Figure 60:
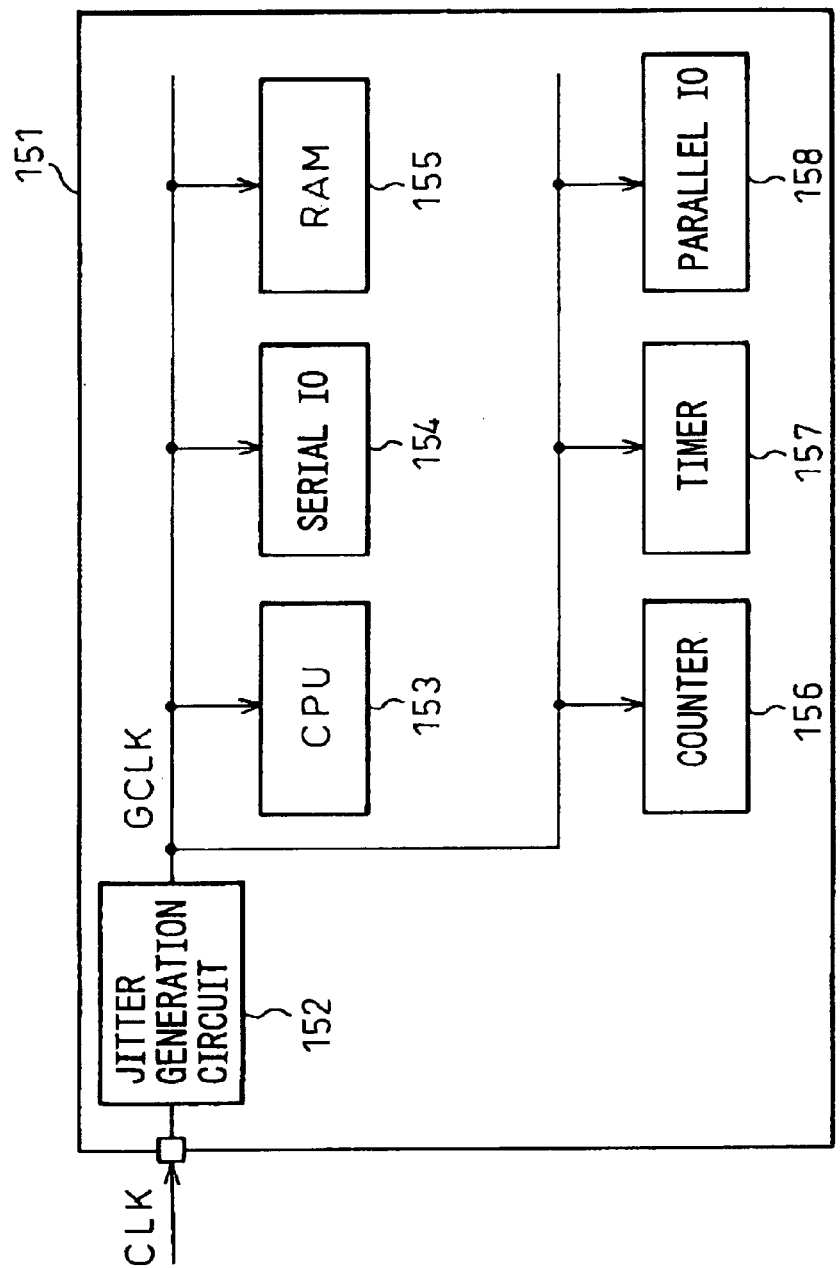
FIG. 60 is a diagram showing the configuration of a conventional semiconductor device using the jitter generation circuit.

A conventional semiconductor device having a jitter generation circuit has, for example, a configuration as shown in FIG. 60. As shown in FIG. 60, in a semiconductor device 151, a clock signal CLK is input to a jitter generation circuit 152 and a jitter is added to the clock signal CLK. Then a clock signal GCLK to which a jitter is added is supplied from the jitter generation circuit 152 to a CPU 153 and its peripheral circuits (for example, a serial IO 154, a RAM 155, a counter 156, a timer 157 and a parallel IO 158). In such a configuration, the peak value of the radiation noise can be reduced.

In the semiconductor device shown in FIG. 60, however, the clock signal GCLK to which a jitter is added is supplied to the entire system including the CPU 153 and the peripheral circuits, therefore, the system is operated based on the clock signal GCLK containing the same jitter. However, the CPU 153 and the serial 10154 are circuits subject to a strict operation timing and, therefore, it is impossible for the clock signal GCLK containing a large jitter to operate them. As a result, there has been a problem that a large jitter cannot be added because of a malfunction of the circuit that can be expected, that is, an optimum jitter which will reduce the radiation noise cannot be added to the clock signal CLK. In the embodiments described below, such a problem can be solved.

Figure 61:
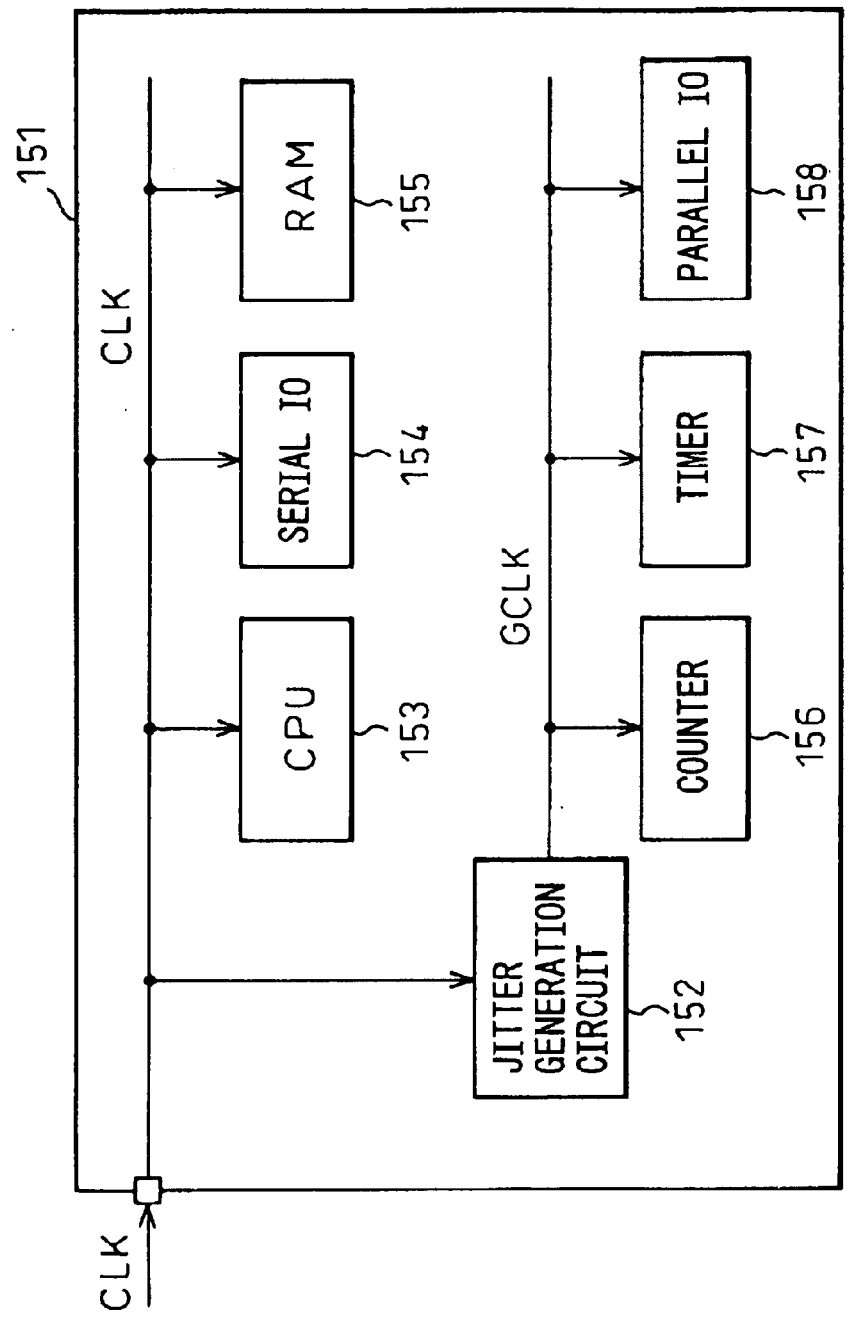
FIG. 61 is a diagram showing the configuration of a semiconductor device in a twentieth embodiment of the present invention.

FIG. 61 is a diagram showing the configuration of the semiconductor device 151 in the twentieth embodiment. The semiconductor device 151 comprises the jitter generation circuit 152, the CPU 153, the serial interface (serial IO) 154, the RAM 155, the counter 156, the timer 157 and the parallel interface (parallel IO) 158.

Among the circuits comprised in the semiconductor device 151, the CPU 153, the serial IO 154 and the RAM 155 are circuits (first internal circuit) subject to a strict operation timing, and the counter 156, the timer 157 and the parallel IO 158 are circuits (second internal circuit) subject to a relatively less strict operation timing.

In the semiconductor device 151, the clock signal CLK from the outside is input to the jitter generation circuit 152, the CPU 153, the serial IO 154 and the RAM 155. The jitter generation circuit 152 adds a jitter to the clock signal CLK and supplies the clock signal GCLK with the jitter added to the counter 156, the timer 157 and the parallel IO 158.

Instead of the jitter generation circuit 152, the jitter generation circuit in the eighteenth and nineteenth embodiments, the SSCG circuit in the first to seventeenth embodiment and a general jitter generation circuit can be used.

In the semiconductor 151, the clock signal which is the input signal to the jitter generation circuit, that is, the precise clock signal CLK to which no jitter is added, is supplied to the first internal circuit (CPU 153, serial IO 154, RAM 155) subject to a strict operation timing, therefore, it is possible to operate each of the circuits 153, 154 and 155 at high speed.

The clock signal GCLK to which a jitter is added in the jitter generation circuit 152 is supplied to the second internal circuit (counter 156, timer 157, parallel IO 158) subject to a relatively less strict operation timing. When the entire system is operated by the clock signal GCLK with a jitter added as in the conventional semiconductor device shown in FIG. 60, the amount of jitter which can be added to the clock signal CLK is limited to a relatively small range. In contrast to this, in the semiconductor device in the twentieth embodiment, the clock signal GCLK to which a jitter is added is supplied only to the circuits subject to a relatively less strict operation timing, therefore, it is possible to add a larger amount of jitter to the clock signal GCLK and effectively reduce the radiation noise.

As described above, in the semiconductor device 151 in the twentieth embodiment, it is possible not only to increase the circuit operation speed but also to reduce the radiation noise.

Figure 62:
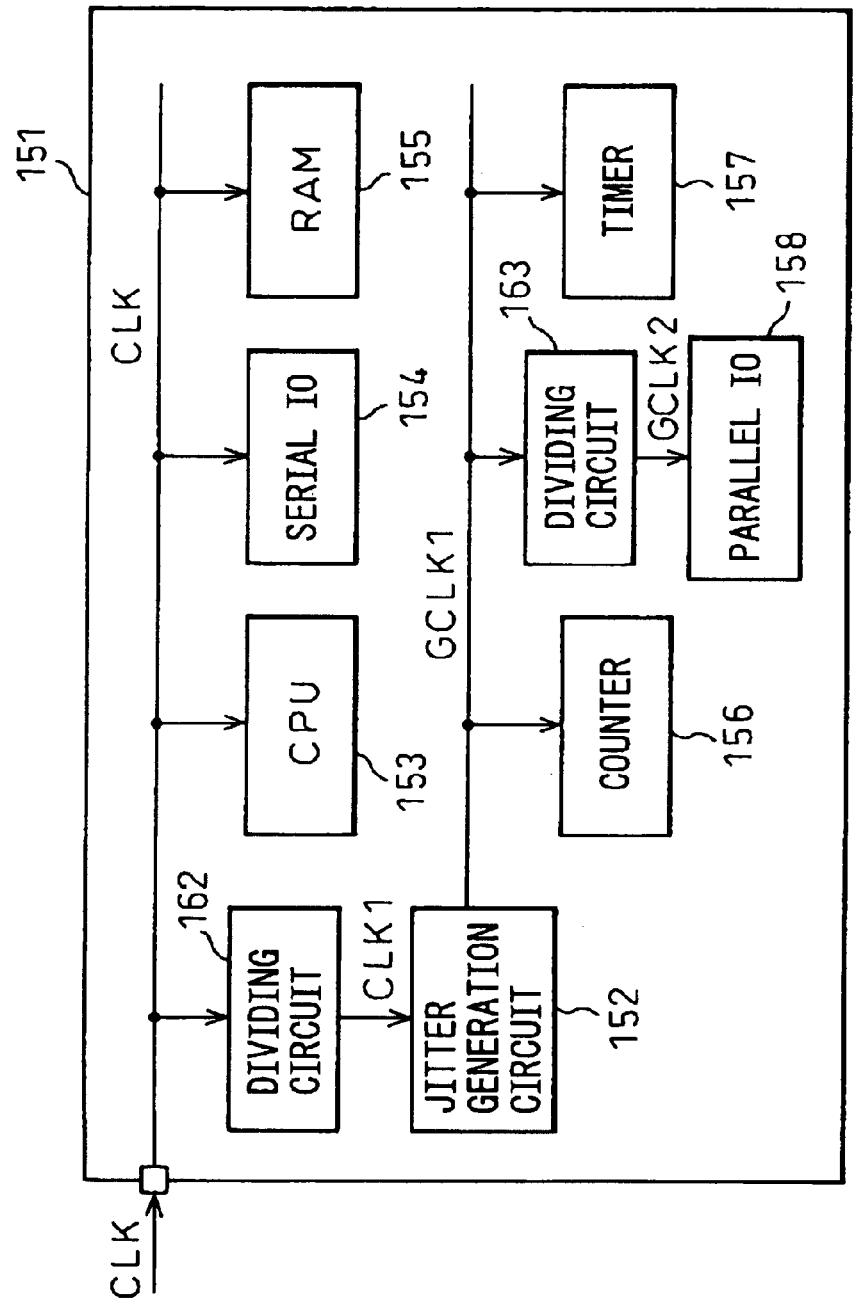
FIG. 62 is a diagram showing the configuration of a semiconductor device in a twenty-first embodiment of the present invention.

FIG. 62 is a diagram showing the configuration of the semiconductor device 151 in the twenty-first embodiment. In the twenty-first embodiment, the same symbols are used for those which are the same as the configuration in the twentieth embodiment. Only the differences from the twentieth embodiment is described below.

In other words, the semiconductor device 151 comprises dividing circuits 162 and 163, in addition to each circuit (jitter generation circuit 152, CPU 153, serial IO 154, RAM 155, counter 156, timer 157, parallel IO 158) in the twentieth embodiment 20.

In the semiconductor device 151, the clock signal CLK from the outside is input to the dividing circuit 162. The dividing circuit 162 divides the clock signal CLK in a predetermined dividing ratio and outputs a clock signal CLK1, the frequency of which is lower than that of the clock signal CLK. The clock signal CLK 1 output from the dividing circuit 162 is input to the jitter generation circuit 152. The jitter generation circuit 152 adds a jitter to the clock signal CLK 1 from the dividing circuit 162 and supplies a clock signal GCLK 1 to the counter 156, the timer 157 and the dividing circuit 163.

The dividing circuit 163 divides the clock signal GCLK 1 a predetermined dividing ratio and outputs a clock signal GCLK 2, the frequency of which is lower than that of the clock signal GCLK 1. The clock signal GCLK 2 is input to the parallel IO 158.

The CPU 153, the serial IO 154 and the RAM 155 in the semiconductor device 151 operate at a high speed based on the clock signal CLK input from the outside. The counter 156 and the timer 157 operate at a low speed based on the clock signal GCLK 1 to which a jitter is added. Moreover, the parallel IO 158 operates at a lower speed than that of the counter 156 and the timer 157 based on the clock signal GCLK 2.

In other words, in the twenty-first embodiment, the second internal circuit (counter 156, timer 157, parallel IO 158)

is a circuit, the operation speed of which is lower than that of the first internal circuit (CPU 153, serial IO 154, RAM 55), and a jitter is added to the clock signals GCLK 1 and GCLK 2 for operating the second internal circuit. In this case, the frequency of the clock signals GCLK 1 and GCLK 2 is lower than that of the clock signal CLK, therefore, it is possible to add a larger amount of jitter. As a result, it is possible to effectively reduce the radiation noise.

Figure 63:
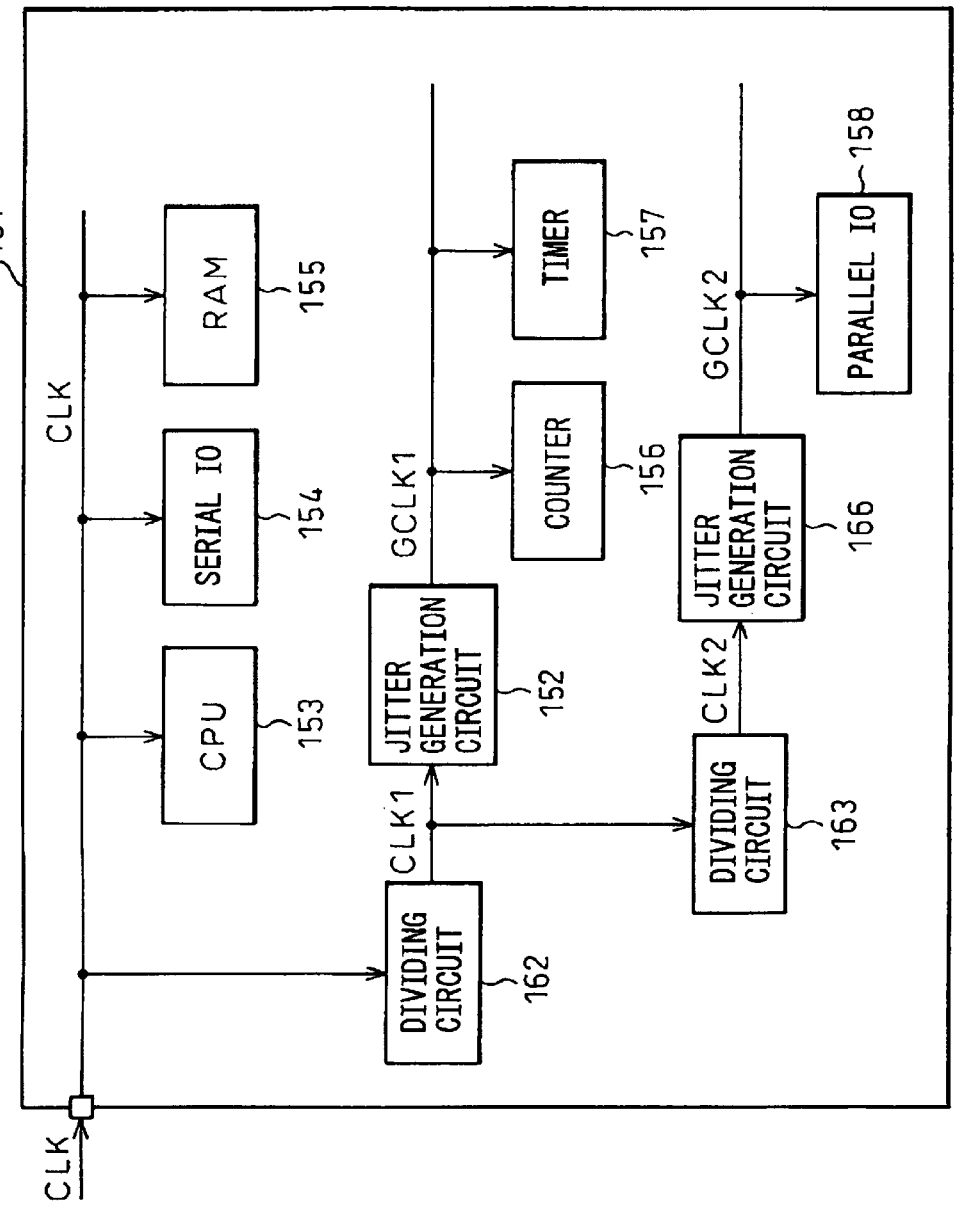
FIG. 63 is a diagram showing the configuration of a semiconductor device in a twenty-second embodiment of the present invention.

FIG. 63 is a diagram showing the configuration of the semiconductor device 151 in the twenty-second embodiment. The same symbols are used for those which are the same as the configuration in the twenty-first embodiment. Only the difference from the twenty-first embodiment is described below.

The semiconductor device 151 in the twenty-second embodiment comprises two jitter generation circuits, that is, the jitter generation circuit 152 and a jitter generation circuit 166, and is configured in such a way that the amount of jitter to be added to the clock signal is changed in accordance with the operation speed of the internal circuit.

To be exact, in the semiconductor device 151, the clock signal CLK 1 output from the dividing circuit 162 is input to the dividing circuit 163. The dividing circuit 163 divides the clock signal CLK 1 in a predetermined dividing ratio and outputs a CLK 2, the frequency of which is lower than that of the clock signal CLK 1.

The jitter generation circuit 152 adds a jitter to the clock signal CLK 1 from the dividing circuit 162 and supplies the clock signal GCLK 1 to the counter 156 and the timer 157. On the other hand, the jitter generation circuit 166 adds a jitter to the clock signal CLK 2 from the dividing circuit 163 and supplies the clock signal GCLK 2 to the parallel IO 158. The jitter generation circuit 166 adds a larger amount of jitter than that of the jitter generation circuit 152.

According to the semiconductor device 151, it is possible to add a proper jitter to the clock signals CLK1 and CLK2 in accordance with the operation speed of the internal circuit. In this case, it is also possible to increase the proportion of the internal circuit which operates based on the clock signals GCLK1 and GCLK2 with a jitter added. As a result, it is possible to more effectively reduce the radiation noise of the semiconductor device.

The twentieth to twenty-second embodiments can be modified as follows. A function for adjusting the amount of jitter in accordance with the operation state of the internal circuit can be provided to the jitter generation circuits 152 and 166 in the semiconductor device 151.

In concrete terms, a case where a function for adjusting the amount of jitter is provided to the jitter generation circuit 151 in the twenty-second embodiment is described below.

Figure 64:
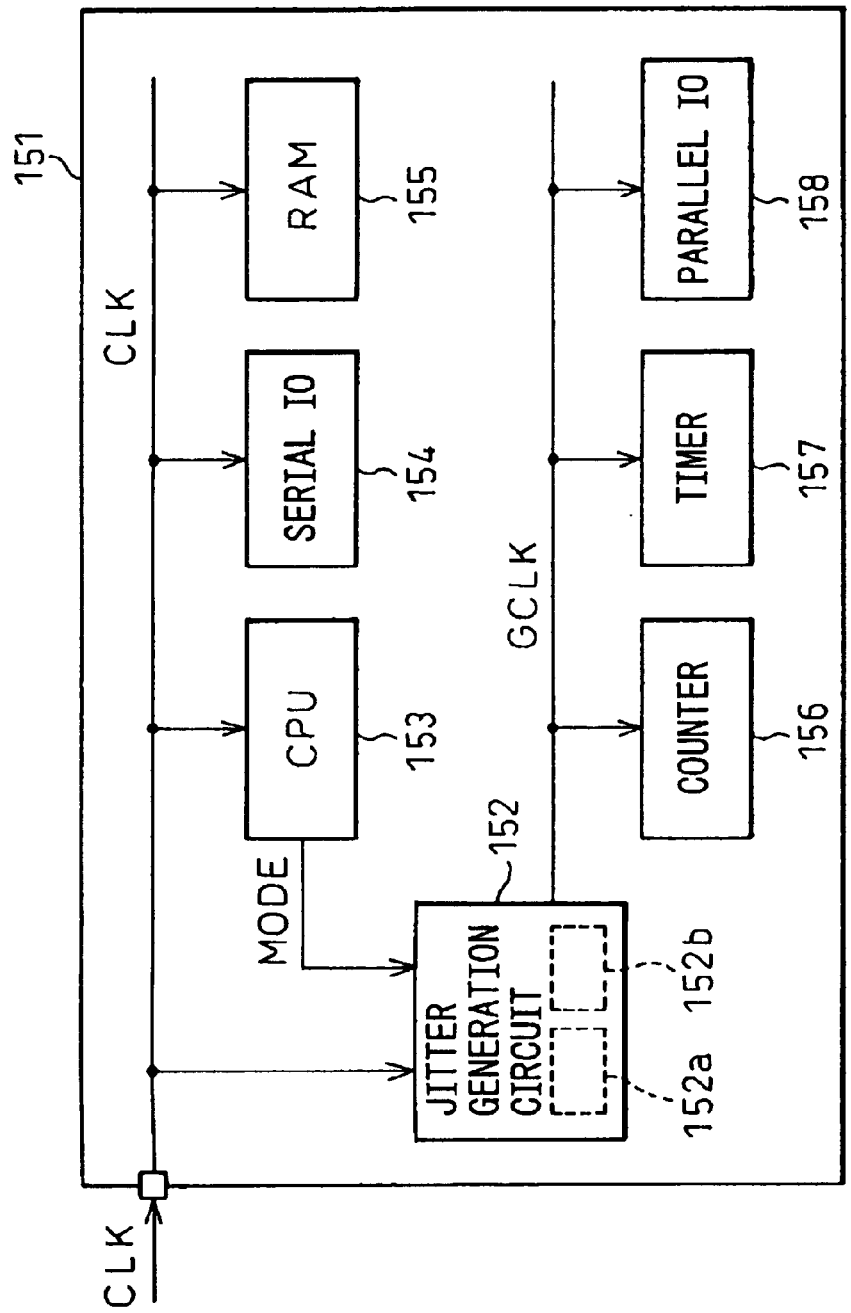
FIG. 64 is a diagram showing another configuration example of a semiconductor device.

As shown in FIG. 64, the jitter generation circuit 152 in the semiconductor device 151 includes a first generation section 152*a* and a second generation section 152*b* and one of the generation sections 152*a* and 152*b* is activated based on a mode signal MODE output from the CPU153. In the jitter generation circuit 152, when the first generation section 152*a* is activated, a small jitter is added to the clock signal CLK and when the second generation section 152*b* is activated, a large jitter is added to the clock signal CLK.

The operation mode of the semiconductor device 151 includes various operation modes such as a test mode, a sleep mode, a high-speed operation mode, and a low-speed operation mode. The CPU153 judges the operation mode from time to time and outputs a mode signal MODE in accordance with the current operation mode. For example, when the operation mode in the semiconductor device 151 changes from the high-speed operation mode to the low-speed operation mode, the mode signal MODE output from the CPU153 is reversed from the H level to the L level. Then, based on the mode signal MODE, the first generation section 152*a* in the jitter generation circuit 152 is deactivated and at the same time the second generation section 152*b* is activated. As a result, it is made possible to add a large jitter to the clock signal CLK.

As described above, by adjusting the amount of jitter in accordance with the operation state of the semiconductor 151, it is possible to effectively reduce the radiation noise of the semiconductor device 151. Moreover, by changing the amount of jitter based on a test mode signal, the test of the semiconductor device 151 can be conducted easily.

Figure 65:
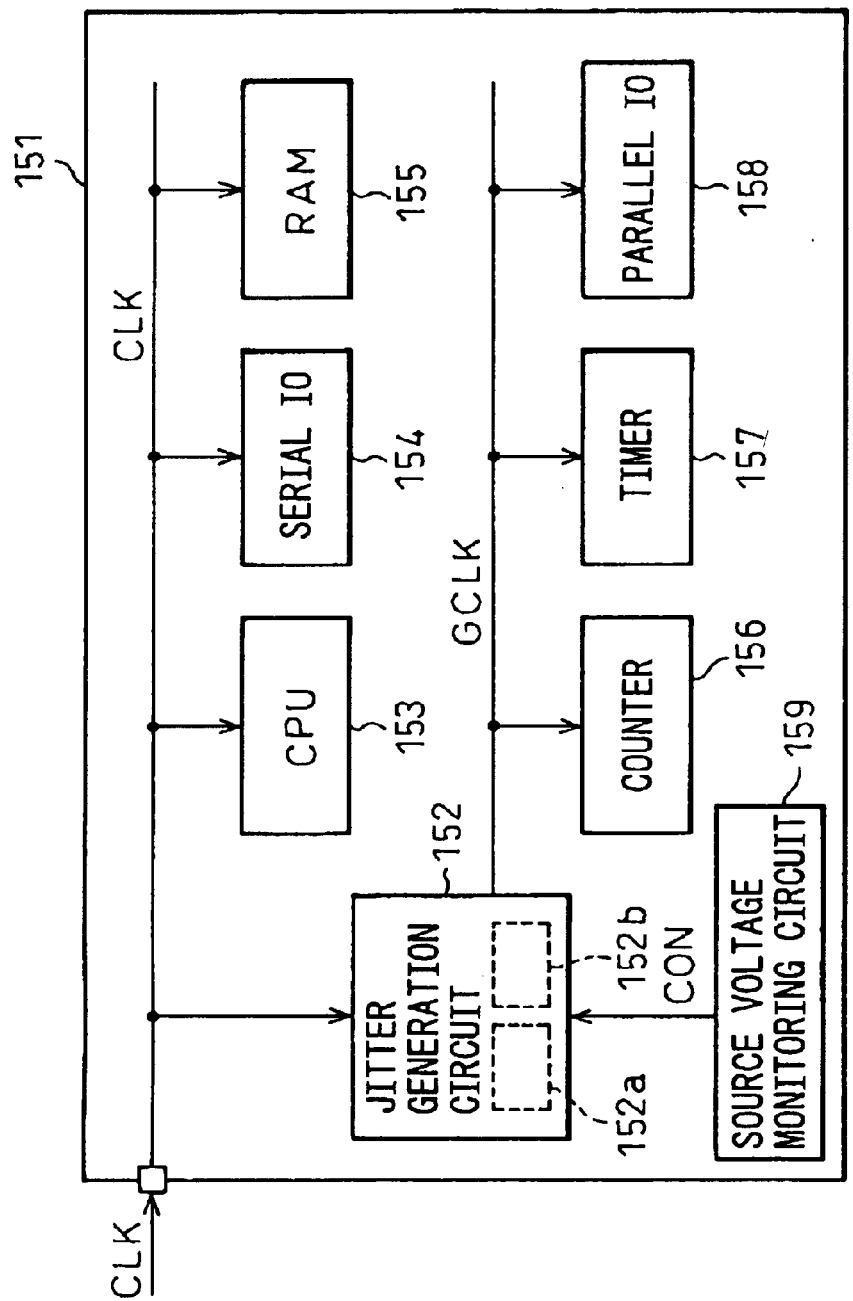
FIG. 65 is a diagram showing another configuration example of a semiconductor device.

It is also possible to configure so that the amount of jitter is adjusted in accordance with the source voltage as in the semiconductor device 151 shown in FIG. 65. In other words, the semiconductor device 151 is provided with a source voltage monitoring circuit 159 which monitors the source voltage supplied to the circuits such as the CPU153, and a control signal CON in accordance with the level of the source voltage is output from the source voltage monitoring circuit 159. Based on the control signal CON, one of the generation sections 152*a* and 152*b* is activated.

For example, when the source voltage falls below a predetermined value, the control signal CON is reversed from the L level to the H level. Then, based on the control signal CON, the first generation section 152*a* in the jitter generation circuit 152 is activated and at the same time the second generation section 152*b* is deactivated. As a result, it is made possible to add a small jitter to the clock signal CLK. In other words, when the semiconductor device 151 operates in a low-voltage state, the amount of jitter to be added to the clock signal CKL is reduced and when the semiconductor device 151 operates in a high-voltage state, the amount of jitter to be added to the clock signal CKL is increased.

When the semiconductor device 151 is set to a low-voltage state, the radiation noise is reduced and the operation speed margin of the circuit is decreased. Because of this, it is possible to prevent a circuit malfunction by reducing the amount of jitter. On the other hand, when the semiconductor device 151 is set to a high-voltage state, the radiation noise is increased and the operation speed margin of the circuit is increased. Because of this, it is possible to effectively reduce the radiation noise by increasing the amount of jitter.

Moreover, it is also possible to configure in such a way that a detection circuit for detecting the frequency of the clock signal CLK is provided in the semiconductor device 151 and the amount of jitter is adjusted based on the detection result. Still moreover, it is also possible to configure in such a way that the amount of jitter is adjusted based on information about the source voltage or the like which the CPU153 obtains.

The jitter generation circuit 152 in the semiconductor device 151 comprises the two generation sections 152*a* and 152*b* and has a configuration in which the amount of jitter to be added to the clock signal CLK is switched between two steps, but it is also possible to provide a configuration which comprises three or more generation sections and in which the amount of jitter is switched between multiple steps. A jitter generation circuit, in which the amount of jitter can be adjusted arbitrarily in accordance with a setting signal input from the outside, has been put to practical use. When such a jitter generation circuit is used, it is possible to configure in such a way that the amount of jitter is adjusted based on the setting signal in accordance with each operation mode.

The semiconductor device 151 in the twenty-second embodiment comprises the two jitter generation circuits 152 and 166 and has a configuration in which two different jitters are added to the precise clock signals CLK1 and CLK2 to which no jitter is added yet in each generation circuit, but the configuration is not limited to this. For example, it is also possible to configure in such a way that to the clock signal to which a jitter is added in the first jitter generation circuit 152, a jitter is further added in the second jitter generation circuit 166, as in the semiconductor device 151 shown in FIG. 66. In other words, the second jitter generation circuit 166 in the semiconductor device 151 functions as a jitter increasing circuit for increasing the amount of jitter to be added to a clock signal.

According to this semiconductor device, it is possible to reduce the circuit scale of the second jitter generation circuit 166 compared to the semiconductor device which generates a jitter independently of each other. Moreover, it is also possible to make, without fail, the amount of jitter to be added to the clock signal GCLK1 for operating the counter 156 and the timer 157 differ from the amount of jitter to be added to the clock signal GCLK2 for operating the parallel IO 158.

Figure 66:
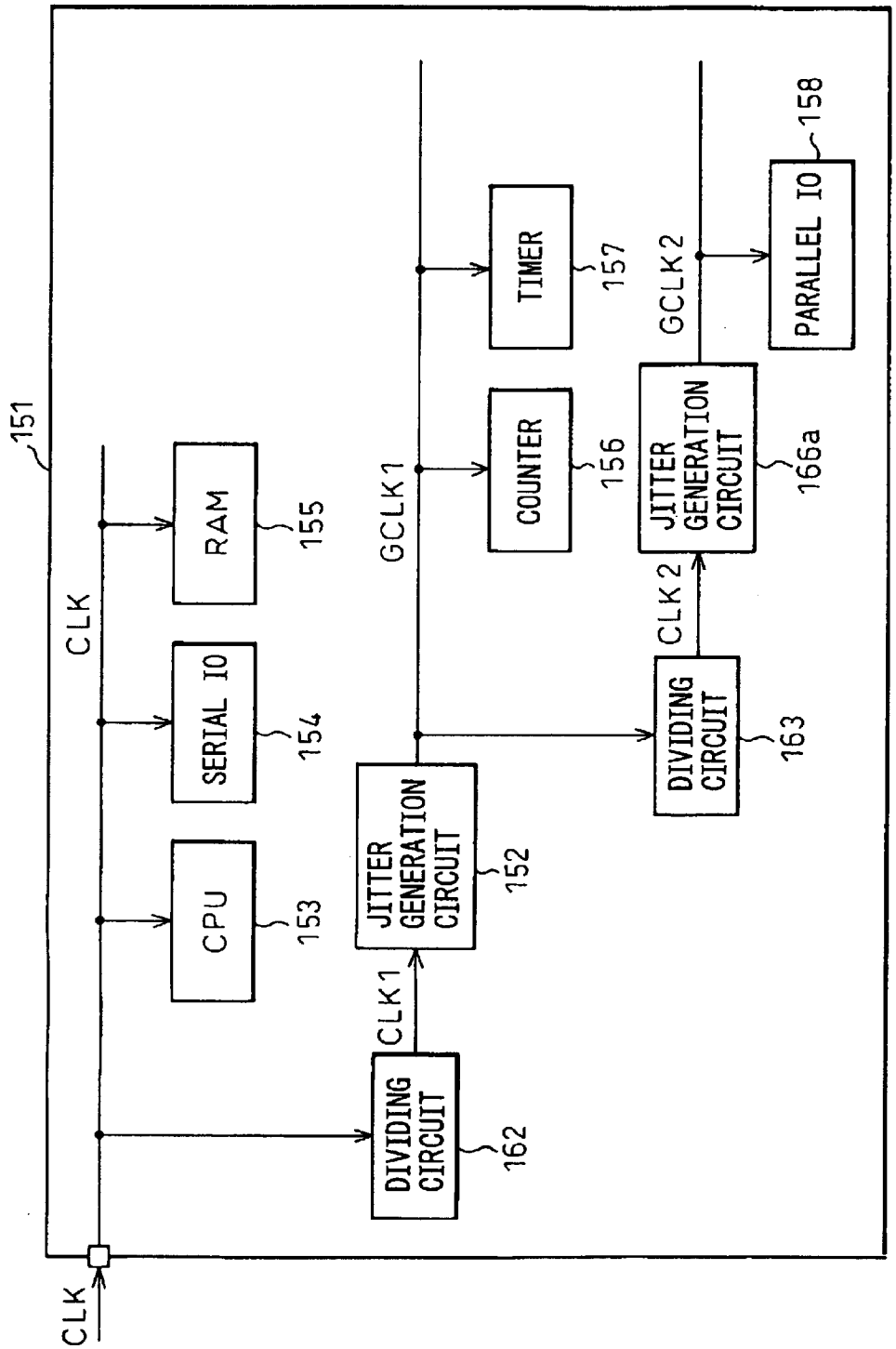
FIG. 66 is a diagram showing another configuration example of a semiconductor device.

In the semiconductor device shown in FIG. 63 and FIG. 66, the two jitter generation circuits 152 and 166 are provided, but it is also possible to provide three or more jitter generation circuits.

We claim:

1. A spread spectrum clock generation circuit comprising: a frequency phase comparator for detecting a difference in phase between a reference clock and a generated clock; a charge pump for generating a charge/discharge signal in accordance with the difference in phase detected by the frequency phase comparator; a loop-filter for generating a differential signal in accordance with the charge signal; a spread spectrum modulation circuit for generating a spread spectrum modulation signal by modulating the differential signal so that the differential signal changes with an amplitude, which is smaller than that of the differential signal, and with a spread spectrum modulation period which is sufficiently longer than that of the generated clock; and a clock generator for generating the generated clock with a frequency in accordance with the spread spectrum modulation signal, wherein the spread spectrum modulation period of the spread spectrum modulation signal changes so as to have multiple different periods, wherein the clock generator is a voltage control oscillator, wherein the spread spectrum modulation circuit comprises an analog modulator for generating a spread spectrum analog voltage signal the period of which changes so as to take multiple different periods, and a voltage addition circuit for adding the spread spectrum analog voltage signal to the differential signal, wherein the analog modulator comprises a plurality of different capacitors, a plurality of switches for selecting one of the plurality of different capacitors, a constant current source for supplying a constant current to the selected capacitor or making the constant current flow out of the selected capacitor, a hysteresis comparator for detecting the fact that the voltage of the selected capacitor reaches first and second predetermined voltages and a switch control circuit for switching the selected plurality of switches when the hysteresis comparator detects the fact that the first and second predetermined voltages are reached.

2. A spread spectrum clock generation circuit comprising: a frequency phase comparator for detecting a difference in phase between a reference clock and a generated clock; a charge pump for generating a charge/discharge signal in accordance with the difference in phase detected by the frequency phase comparator; a loop-filter for generating a differential signal in accordance with the charge signal; a spread spectrum modulation circuit for generating a spread spectrum modulation signal by modulating the differential signal so that the differential signal changes with an amplitude, which is smaller than that of the differential signal, and with a spread spectrum modulation period which is sufficiently longer than that of the generated clock; and a clock generator for generating the generated clock with a frequency in accordance with the spread spectrum modulation signal, wherein the spread spectrum modulation period of the spread spectrum modulation signal changes so as to have multiple different periods, wherein the clock generator is a voltage control oscillator, wherein the spread spectrum modulation circuit comprises a digital control circuit for generating an output code the period of which changes so as to take multiple different periods, a voltage digital-to-analog conversion circuit for generating a spread spectrum voltage signal in accordance with the output code, and a voltage addition circuit for adding the spread spectrum voltage signal to the differential signal.

3. A spread spectrum clock generation circuit comprising: a frequency phase comparator for detecting a difference in phase between a reference clock and a generated clock; a charge pump for generating a charge/discharge signal in accordance with the difference in chase detected by the frequency phase comparator; a loop-filter for generating a differential signal in accordance with the charge signal; a spread spectrum modulation circuit for generating a spread spectrum modulation signal by modulating the differential signal so that the differential signal changes with an amplitude, which is smaller than that of the differential signal, and with a spread spectrum modulation period which is sufficiently longer than that of the generated clock; and a clock generator for generating the generated clock with a frequency in accordance with the spread spectrum modulation signal, wherein the spread spectrum modulation period of the spread spectrum modulation signal changes so as to have multiple different periods, wherein a voltage-current conversion circuit for converting the differential signal, which is a voltage signal, into a differential current signal is further comprised, the clock generator is a current control oscillator, and the spread spectrum modulation circuit comprises a digital control circuit for generating an output code the period of which changes so as to have multiple different periods and a current variable circuit provided between the voltage-current conversion circuit and the current control oscillator and which generates a spread spectrum current modulation signal by modulating the differential current signal in accordance with the output code.

4. A spread spectrum clock generation circuit, as set forth in claim 3, wherein the current variable circuit comprises a circuit for generating the differential current signal in a predetermined ratio and a current digital-to-analog conversion circuit for converting the output code into a spread spectrum current signal, which is an analog signal, and adding the analog signal to the differential current signal.

5. A spread spectrum clock generation circuit, as set forth in claim 2, wherein the digital control circuit comprises a plurality of dividers with a different dividing ratio with which a clock is divided, a switch controller for selecting the output of the plurality of dividers in order, an up/down counter for counting the selected dividing clock, and a counter for switching between the up operation and the down operation of the up/down counter for each predetermined count number by counting the dividing clock.

6. A spread spectrum clock generation circuit, as set forth in claim 3, wherein the digital control circuit is a computer system controlled by programs.

7. A spread spectrum clock generation circuit comprising: a frequency phase comparator for detecting a difference in phase between a reference clock and a generated clock; a charge pump for generating a charge/discharge signal in accordance with the difference in phase detected by the frequency phase comparator; a loop-filter for generating a differential signal in accordance with the charge signal; a spread spectrum modulation circuit for generating a spread spectrum modulation signal by modulating the differential signal so that the differential signal changes with an amplitude, which is smaller than that of the differential signal, and with a spread spectrum modulation period which is sufficiently longer than that of the generated clock; and a clock generator for generating a generated clock with a frequency in accordance with the spread spectrum modulation signal, wherein the spread spectrum modulation signal has a waveform in which a local maximum and/or a local minimum, of a signal value, change.

8. A spread spectrum clock generation circuit, as set forth in claim 7, wherein the spread spectrum modulation signal has a triangular waveform of which the amplitude changes.

9. A spread spectrum clock generation circuit, as set forth in claim 7, wherein the spread spectrum modulation signal has a triangular waveform of which the mean level changes.

10. A spread spectrum clock generation circuit, as set forth in claim 8, wherein the spread spectrum modulation signal further changes the spread spectrum modulation period.

11. A spread spectrum clock generation circuit, as set forth in claim 9, wherein the spread spectrum modulation signal further changes the spread spectrum modulation period.

12. A spread spectrum clock generation circuit, as set forth in claim 8, wherein the spread spectrum modulation signal changes the amplitude for each period in order.

13. A spread spectrum clock generation circuit, as set forth in claim 7, wherein the clock generator is a voltage control oscillator.

14. A spread spectrum clock generation circuit, as set forth in claim 13, wherein the spread spectrum modulation circuit comprises an analog modulator for generating a spread spectrum analog voltage signal the local maximum and minimum of the amplitude of which changes so as to take multiple different values in order, and a voltage addition circuit for adding the spread spectrum analog voltage signal to the differential signal.

15. A spread spectrum clock generation circuit, as set forth in claim 13, wherein the analog modulator comprises a constant current source for switching between a state in which the capacitor is charged with a constant current and a state in which a constant current is discharged from the capacitor, and a switch control circuit for changing the switching cycle of the constant current source.

16. A spread spectrum clock generation circuit, as set forth in claim 13, wherein the spread spectrum modulation circuit comprises: a digital control circuit for generating an output code which changes to continuously repeat an increase and a decrease; a voltage digital-to-analog conversion circuit for generating a spread spectrum voltage signal in accordance with the output code; and a voltage addition circuit for adding the spread spectrum voltage signal to the differential signal.

17. A spread spectrum clock generation circuit, as set forth in claim 7, wherein a voltage-current conversion circuit for converting the differential signal, which is a voltage signal, into a differential current signal is further comprised, the clock generator is a current control oscillator, and the spread spectrum modulation circuit comprises: a digital control circuit for generating an output code which changes to continuously repeat an increase and a decrease; and a current variable circuit which is provided between the voltage-current conversion circuit and the current control oscillator and which generates a spread spectrum current modulation signal by modulating the differential current signal in accordance with the output code.

18. A spread spectrum clock generation circuit, as set forth in claim 17, wherein the current variable circuit comprises a current digital-to-analog conversion circuit for converting the output code into a spread spectrum current signal, which is an analog signal, and adding the converted signal to the differential current signal.

19. A spread spectrum clock generation circuit, as set forth in claim 7, wherein a voltage-current conversion circuit for converting the differential signal, which is a voltage signal, into a differential current signal is further comprised, the clock generator is a current control oscillator, the spread spectrum modulation circuit comprises: a digital control circuit for generating a spectrum modulation code the value of which changes to continuously repeat an increase and a decrease and a level change code the value of which changes so as to take multiple different values; a first current variable circuit which is provided between the voltage-current conversion circuit and the current control oscillator and which modulates a current signal in a predetermined ratio of the differential current signal in accordance with the spectrum modulation code; and a second current variable circuit for amplifying the output of the first current variable circuit in accordance with the level change code, wherein the output of the second current variable circuit is added to the differential current signal.

20. A spread spectrum clock generation circuit, as set forth in claim 7, wherein a voltage-current conversion circuit for converting the differential signal, which is a voltage signal, into a differential current signal is further comprised, the clock generator is a current control oscillator, the spread spectrum modulation circuit comprises a digital control circuit for generating a spectrum modulation code the value of which changes to continuously repeat an increase and a decrease and a level change code the value of which changes so as to take multiple different values; a first current variable circuit which is provided between the voltage-current conversion circuit and the current control oscillator and which amplifies a current signal in a predetermined ratio of the differential current signal in accordance with the level change code; and a second current variable circuit for modulating the output of the first current variable circuit in accordance with the spectrum modulation code, wherein the output of the second current variable circuit is added to the differential current signal.

21. A spread spectrum clock generation circuit, as set forth in claim 17, wherein the digital control circuit comprises a plurality of dividers with a different dividing ratio with which a clock is divided, a switch controller for selecting the output of the plurality of dividers in order, an up/down counter for counting the selected dividing clock, and a counter for switching between the up operation and down operation of the up/down counter for each determined count number by counting the dividing clock.

22. A spread spectrum clock generation circuit, as set forth claim 17, wherein the digital control circuit is a computer system controlled by programs.

* * * * *

UNITED STATES PATENT AND TRADEMARK OFFICE
CERTIFICATE OF CORRECTION

PATENT NO.    : 6,975,148 B2
DATED         : December 13, 2005
INVENTOR(S)   : Shinji Miyata et al.

It is certified that error appears in the above-identified patent and that said Letters Patent is hereby corrected as shown below:

Title page,
Item [75], Inventors, delete the following:
"Shinji Miyata, Kasugai (JP);
Masao Iijima, Kasugai (JP);
Teruhiko Saitou, Kasugai (JP);
Yukisato Miyazaki, Kasugai (JP)".

Signed and Sealed this

Twenty-eighth Day of February, 2006

JON W. DUDAS
*Director of the United States Patent and Trademark Office*